United States Patent
Kawai et al.

(10) Patent No.: US 9,735,456 B2
(45) Date of Patent: Aug. 15, 2017

(54) ELECTROMAGNETIC RESONANT COUPLER AND HIGH-FREQUENCY TRANSMISSION DEVICE

(71) Applicant: Panasonic Intellectual Property Management Co., Ltd., Osaka (JP)

(72) Inventors: Yasufumi Kawai, Osaka (JP); Shuichi Nagai, Osaka (JP); Daisuke Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 35 days.

(21) Appl. No.: 14/783,617

(22) PCT Filed: Apr. 14, 2014

(86) PCT No.: PCT/JP2014/002110
§ 371 (c)(1),
(2) Date: Oct. 9, 2015

(87) PCT Pub. No.: WO2014/171125
PCT Pub. Date: Oct. 23, 2014

(65) Prior Publication Data
US 2016/0072167 A1    Mar. 10, 2016

(30) Foreign Application Priority Data

Apr. 15, 2013   (JP) .................................. 2013-084857
Dec. 24, 2013   (JP) .................................. 2013-265714

(51) Int. Cl.
*H01P 5/02*   (2006.01)
*H01P 1/201*   (2006.01)
(Continued)

(52) U.S. Cl.
CPC ........ *H01P 1/201* (2013.01); *H01L 23/49822* (2013.01); *H01L 23/66* (2013.01);
(Continued)

(58) Field of Classification Search
CPC ................................. H01P 1/201; H01P 5/02
(Continued)

(56) References Cited

U.S. PATENT DOCUMENTS 7,692,444 B2 *   4/2010   Chen ................... H01F 17/0006
                                                            257/531
8,385,028 B2 *   2/2013   Fouquet ................. H01F 19/08
                                                            336/200

(Continued)

FOREIGN PATENT DOCUMENTS

JP   2007-096585   4/2007
JP   2008-067012   3/2008
(Continued)

OTHER PUBLICATIONS

International Preliminary Report on Patentability and Written Opinion of the International Searching Authority issued Oct. 29, 2015 in International (PCT) Application No. PCT/JP2014/002110.
(Continued)

*Primary Examiner* — Dean Takaoka
(74) *Attorney, Agent, or Firm* — Wenderoth, Lind & Ponack, L.L.P.

(57) ABSTRACT

A high-frequency transmission device includes first and second resonators as ring-shaped wires each having an opening part at a part thereof, first and second input/output terminals each electrically connected to both resonators, a first ground shield formed on a plane different from planes on which both resonators are arranged, a second ground shield formed on a plane different from the planes on which both resonators and the first ground shield are arranged, and
(Continued)

first and second ground wires each formed to surround peripheries of both resonators. The ground shields and the ground wires are respectively connected to each other. A dielectric wire is present between both ground wires, and the ground wires are not electrically connected to each other.

6 Claims, 49 Drawing Sheets

(51) Int. Cl.
    *H01L 23/66*           (2006.01)
    *H01L 25/065*         (2006.01)
    *H01P 7/10*            (2006.01)
    *H01P 1/203*          (2006.01)
    *H01P 7/00*            (2006.01)
    *H02J 17/00*          (2006.01)
    *H01P 5/18*            (2006.01)
    *H01L 23/498*         (2006.01)

(52) U.S. Cl.
    CPC ...... *H01L 25/0655* (2013.01); *H01P 1/20345* (2013.01); *H01P 1/20381* (2013.01); *H01P 7/10* (2013.01); *H01L 23/49816* (2013.01); *H01L 23/49827* (2013.01); *H01L 2224/16* (2013.01); *H01L 2224/48091* (2013.01); *H01L 2224/48227* (2013.01); *H01L 2224/49175* (2013.01); *H01L 2924/15311* (2013.01); *H01L 2924/19107* (2013.01); *H01P 5/187* (2013.01); *H02J 17/00* (2013.01)

(58) Field of Classification Search
    USPC ........................................................ 333/24 R
    See application file for complete search history.

(56) References Cited

U.S. PATENT DOCUMENTS

| | | | | |
|---|---|---|---|---|
| 8,436,709 | B2 * | 5/2013 | Fouquet | H01F 19/08 336/200 |
| 8,592,944 | B2 * | 11/2013 | Santangelo | H01L 23/48 257/528 |
| 2007/0069820 | A1 | 3/2007 | Hayata et al. | |
| 2009/0243782 | A1 * | 10/2009 | Fouquet | H01F 19/04 336/200 |
| 2013/0147580 | A1 | 6/2013 | Nagai | |
| 2013/0187477 | A1 | 7/2013 | Nagai et al. | |
| 2014/0002212 | A1 | 1/2014 | Nagai | |
| 2014/0049345 | A1 | 2/2014 | Nagai | |
| 2014/0218136 | A1 | 8/2014 | Nagai | |

FOREIGN PATENT DOCUMENTS

| | | |
|---|---|---|
| JP | 2010-278387 | 12/2010 |
| WO | 2012/153529 | 11/2012 |
| WO | 2012/153531 | 11/2012 |
| WO | 2013/065238 | 5/2013 |

OTHER PUBLICATIONS

International Search Report issued Jul. 1, 2014 in International (PCT) Application No. PCT/JP2014/02110.

\* cited by examiner

ELECTROMAGNETIC RESONANT COUPLER AND HIGH-FREQUENCY TRANSMISSION DEVICE

TECHNICAL FIELD

The present invention relates to an electromagnetic resonant coupler and a high-frequency transmission device which can suppress radiation of high-frequency noise.

BACKGROUND ART

A demand for transmitting signals while securing electrical insulation between circuits has been obtained in various electronic devices. When a high-voltage circuit and a low-voltage circuit are operated, for example, a malfunction or a failure of the low-voltage circuit is prevented, or a ground loop of circuits of different installation potentials is disconnected. With such a configuration, when the circuits are connected, application of an excessive voltage to one circuit is prevented. A specific example is a case of controlling a motor driving circuit that operates at a high voltage of a few hundred V. When a high voltage to be handled by a motor driving circuit is applied to an input/output unit of a microcomputer that operates at a low voltage, this application can cause a malfunction, and can lead to a failure. To prevent these problems, the low-voltage circuit and the high-voltage circuit are insulated from each other.

So far, as an insulation element that performs communication while achieving insulation, a photocoupler has been mainly used. The photocoupler has a light emitting element and a light receiving element integrated into one package, and the light emitting element and the light receiving element are electrically insulated from each other inside the package. This is a system that coverts an input electrical signal into an optical signal by the light-emitting element, transmits the converted optical signal in an electrically insulated space, detects the transmitted optical signal by the light receiving element, converts the signal into an electrical signal again, and transmits the converted electrical signal. However, the photocoupler has problems in aged deterioration, large power consumption, and the like.

In order to solve these problems, an insulation element called an electromagnetic resonant coupler as described in Patent Literature 1, for example, is known. This is a device that transmits high-frequency signals between circuits located on different planes. In this device, there are formed resonators having a structure that a part of a closed curve line is opened on each plane of different planes, and an input/output line connected to the resonators and being configured to input and output a high-frequency signal to the resonators. The device transmits a high-frequency signal by electromagnetically coupling the resonators formed on both planes. The high-frequency signals mean microwaves or millimeter waves.

In this structure, each resonator is formed in a size of λ/2 of a line length, and the resonators become two antennas formed on what is called the different planes. Therefore, when a gap between the resonators is equal to or smaller than a fixed gap, the resonators are coupled by a near field, and very high efficient transmission becomes possible.

CITATION LIST

Patent Literature

Patent Literature 1: Unexamined Japanese Patent Publication No. 2008-67012

SUMMARY OF INVENTION

Technical Problem

According to a prior art, it is not possible to easily manufacture a transmission device which includes an electromagnetic resonant coupler, a transmission circuit, and a receiver circuit.

An object of the present invention is to provide an electromagnetic resonant coupler and a high-frequency transmission device capable of easily making it possible to manufacture a transmission device which includes an electromagnetic resonant coupler, a transmission circuit, and a receiver circuit.

Solution to Problem

In order to solve the problem, according to one aspect of the present invention, there is provided a high-frequency transmission device comprising a substrate, an electromagnetic resonant coupler, a transmission circuit, and a receiver circuit, wherein the electromagnetic resonant coupler includes a first resonant wire arranged on the substrate and electrically connected to the transmission circuit, and a second resonant wire electrically connected to the receiver circuit and arranged on the substrate to oppose the first resonant wire, the transmission circuit includes a high-frequency signal generation unit that is arranged on the substrate and that generates a high-frequency signal, the transmission circuit is arranged on the substrate, generates a high-frequency transmission signal by modulating an input signal by the high-frequency signal generated by the high-frequency signal generating unit, and sends the generated high-frequency transmission signal to the first resonant wire, the first resonant wire transmits the high-frequency transmission signal sent from the transmission circuit, to the second resonant wire, the receiver circuit rectifies the high-frequency transmission signal transmitted to the second resonant wire, generates an output signal corresponding to the input signal, and at least one of the transmission circuit and the receiver circuit is arranged on a main surface of the substrate.

These general and specific aspects may be implemented using a system, a method, and any combination of systems and methods.

Advantageous Effects of Invention

According to the above aspect of the present invention, it is possible to easily manufacture the transmission device which includes the electromagnetic resonant coupler, the transmission circuit, and the receiver circuit.

BRIEF DESCRIPTION OF DRAWINGS

These and other objects and features of the present invention will become clear from the following description taken in conjunction with the preferred embodiments thereof with reference to the accompanying drawings, in which.

DESCRIPTION OF EMBODIMENTS

Figure 1:
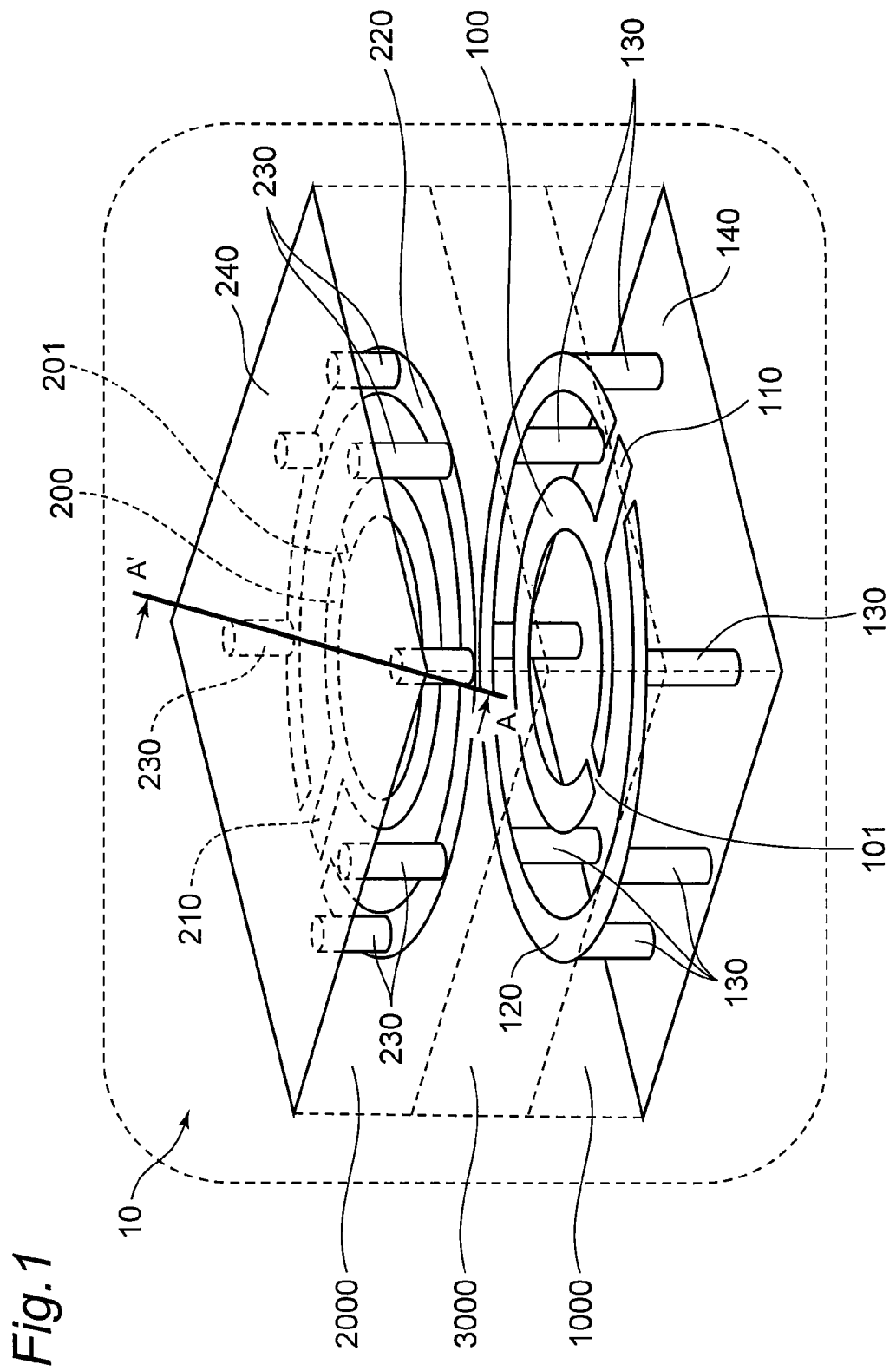
FIG. 1 is a perspective view illustrating an example of a configuration of an electromagnetic resonant coupler according to a first embodiment of the present invention.

Referring now to the accompanied drawings the embodiments of the present invention will be described in detail below.

Various aspects of the present invention are described prior to the detailed description of the embodiments of the present invention with reference to the drawings.

According to one aspect of the present invention, there is provided a high-frequency transmission device comprising a substrate, an electromagnetic resonant coupler, a transmission circuit, and a receiver circuit, wherein the electromagnetic resonant coupler includes a first resonant wire arranged on the substrate and electrically connected to the transmission circuit, and a second resonant wire electrically connected to the receiver circuit and arranged on the substrate to oppose the first resonant wire, the transmission circuit includes a high-frequency signal generation unit that is arranged on the substrate and that generates a high-frequency signal, the transmission circuit is arranged on the substrate, generates a high-frequency transmission signal by modulating an input signal by the high-frequency signal generated by the high-frequency signal generating unit, and sends the generated high-frequency transmission signal to the first resonant wire, the first resonant wire transmits the high-frequency transmission signal sent from the transmission circuit, to the second resonant wire, the receiver circuit rectifies the high-frequency transmission signal transmitted to the second resonant wire, generates an output signal corresponding to the input signal, and at least one of the transmission circuit and the receiver circuit is arranged on a main surface of the substrate.

According to the first aspect of the present invention, it is possible to easily manufacture the transmission device which includes the electromagnetic resonant coupler, the transmission circuit, and the receiver circuit.

According to a second aspect of the present invention, there is provided the high-frequency transmission device according to the first aspect, wherein the transmission circuit is arranged at a position other than a region immediately above a region where the electromagnetic resonant coupler is arranged, in a region on the main surface of the substrate.

According to a third aspect of the present invention, there is provided the high-frequency transmission device according to the first or second aspect, wherein the transmission circuit is arranged on the main surface of the substrate, and a heat dissipation structure is arranged below the transmission circuit.

According to a fourth aspect of the present invention, there is provided the high-frequency transmission device according to any one of the first to third aspects, wherein the receiver circuit is arranged in a region immediately above a region where the electromagnetic resonant coupler is arranged, in a region on the main surface of the substrate.

According to a fifth aspect of the present invention, there is provided the high-frequency transmission device according to any one of the first to fourth aspects, wherein an electric field shielding unit is arranged between the electromagnetic resonant coupler and at least one of the transmission circuit and the receiver circuit.

According to a sixth aspect of the present invention, there is provided the high-frequency transmission device according to any one of the first to fifth aspects, wherein the transmission circuit and the receiver circuit are integrated in one semiconductor chip, and is arranged on the main surface of the substrate.

According to a seventh aspect of the present invention, there is provided the high-frequency transmission device according to any one of the first to sixth aspects, wherein a metal wall is arranged around the electromagnetic resonant coupler.

According to an eighth aspect of the present invention, there is provided an electromagnetic resonant coupler comprising:

a first resonator as a ring-shaped wire having an opening at a part thereof;

a first input/output terminal electrically connected to the first resonator;

a second resonator as a ring-shaped wire having an opening part at a part thereof;

a second input/output terminal electrically connected to the second resonator;

a first ground shield formed on a plane different from a plane on which the first resonator is arranged and different from a plane on which the second resonator is arranged;

a second ground shield formed on a plane different from a plane on which the first resonator is arranged, different from a plane on which the second resonator is arranged, and different from a plane on which the first ground shield is arranged;

a first ground wire formed to surround a periphery of the first resonator; and a second ground wire formed to surround a periphery of the second resonator, wherein the first ground shield and the first ground wire are electrically connected to each other, the second ground shield and the second ground wire are electrically connected to each other, and a dielectric layer is present between the first ground wire and the second ground wire, and the first ground wire and the second ground wire are not electrically connected to each other.

Accordingly, in the case of using a high frequency, lateral-direction radiation of high-frequency noise can be suppressed while securing insulation between the first ground wire and the second ground wire.

According to a ninth aspect of the present invention, there is provided an electromagnetic resonant coupler comprising:

a first resonant wire as a ring-shaped wire having a part opened by an opening part;

a first input/output terminal electrically connected to the first resonant wire;

a second resonant wire as a ring-shaped wire having a part opened by an opening part;

a second input/output terminal electrically connected to a second resonant wire;

a first ground shield formed on a plane different from a plane on which the first resonant wire is formed and different from a plane on which the second resonant wire is formed;

a second ground shield formed on a plane different from a plane on which the first resonant wire is formed, different from a plane on which the second resonant wire is formed, and different from a plane on which the first ground shield is formed;

a first ground wall extending from the first ground shield in a direction of the second ground shield, in a direction perpendicular to the plane on which the first ground shield is arranged, so as to surround a periphery of the first resonant wire; and a second ground wall extending from the second ground shield in a direction of the first ground shield, in a direction perpendicular to the plane on which the second ground shield is arranged, so as to surround a periphery of the second resonant wire at a position different from the first ground wall, wherein the first ground shield and the first ground wall are electrically connected to each other, the second ground shield and the second ground wall are electrically connected to each other, a first dielectric layer is present between the first ground wall and the second ground shield, and the first ground wall and the second ground shield are not electrically connected to each other, a second dielectric layer is present between the second ground wall and the first ground shield, and the second ground wall and the first ground shield are not electrically connected to each other, a third dielectric layer is present between the first ground wall and the second ground wall, and the first ground wall and the second ground wall are not electrically connected to each other, and positions of the first dielectric layer and the second dielectric layer are not present on a same plane.

Accordingly, the dielectric layer can be arranged by shifting a position of the dielectric layer to a perpendicular direction, and lateral-direction leakage of high-frequency noise orthogonal to the perpendicular direction by the dielectric layer can be further suppressed while insulation of the electromagnetic resonant coupler is secured.

According to a tenth aspect of the present invention, there is provided the electromagnetic resonant coupler according to the ninth aspect, wherein the first ground wall is formed by a first ground wire, formed with a fixed gap from the first resonant wire, in a direction perpendicular to the plane on which the first resonant wire is arranged and in a lateral direction orthogonal to the perpendicular direction, and arranged to surround an outer periphery of the first resonant wire, and a plurality of rod-shaped first metal conductors electrically connected to the first ground shield and the first ground wire, and arranged with a fixed gap from each other so as to surround an outer periphery of the first resonant wire, and the second ground wall is formed by a second ground wire, formed with a fixed gap from the second resonant wire, in a direction perpendicular to the plane on which the second resonant wire is arranged and in a lateral direction orthogonal to the perpendicular direction, and arranged to surround an outer periphery of the second resonant wire, at a lateral-direction position different from the first ground wire, and a plurality of rod-shaped second metal conductors electrically connected to the second ground shield and the second ground wire, and formed with a fixed gap from each other so as to surround an outer periphery of the second resonant wire.

Accordingly, the first ground wall and the second ground wall can be formed by rod-shaped metal conductors utilizing through-holes, i.e., a more facilitated manufacturing process.

According to an eleventh aspect of the present invention, there is provided the electromagnetic resonant coupler according to any one of the eighth to tenth aspects, formed on a printed substrate having a plurality of dielectric substrates.

Accordingly, because the magnetic resonant coupler can be manufactured by using inexpensive materials, cost reduction can be realized.

According to a twelfth aspect of the present invention, there is provided a high-frequency transmission device comprising:

the electromagnetic resonant coupler according to any one of the eighth to eleventh aspects; and a functional circuit chip arranged on the electromagnetic resonant coupler and including an input/output terminal, wherein the first and second input/output terminals of the electromagnetic resonant couplers and the input/output terminal of the functional circuit chip are electrically connected to each other.

Accordingly, by using the electromagnetic resonant coupler which reduces the influence of high-frequency noise, the high-frequency transmission device which prevents a system malfunction of the functional circuit chip and which is integrated in a compact shape can be realized.

According to a thirteenth aspect of the present invention, there is provided the high-frequency transmission device according to the twelfth aspect, comprising:

the electromagnetic resonant coupler according to any one of the eighth to eleventh aspects;

a functional circuit chip electrically connected to an outer side of a ground of the electromagnetic resonant coupler; and a connection terminal to an external element.

According to such a configuration, radio wave noise generated from the functional circuit chip can be prevented from entering the electromagnetic resonant coupler, and malfunctions of the high-frequency transmission device can be reduced.

According to a fourteenth aspect of the present invention, there is provided the high-frequency transmission device according to the twelfth aspect, wherein the functional circuit chip is arranged on an upper part of a ground shield of the electromagnetic resonant coupler.

According to such a configuration, by installing a functional circuit element on an upper part of the ground shield of the electromagnetic resonant coupler, the electromagnetic resonant coupler can be integrated as a power transmission device.

According to a fifteenth aspect of the present invention, there is provided the high-frequency transmission device according to the thirteenth aspect, wherein a connection terminal to the external element is taken out by a lead terminal.

According to such a configuration, because a relatively large distance between a terminal and a terminal of other element can be taken by taking out with a lead terminal, a creeping distance can be secured and a dielectric voltage can be improved.

According to a sixteenth aspect of the present invention, there is provided the high-frequency transmission device according to the thirteenth aspect, wherein a connection terminal to the external element is taken out by a solder ball.

According to such a configuration, because a connection terminal can be taken out in a perpendicular direction of the high-frequency transmission device, an installation area can be miniaturized.

A first embodiment of the present invention is described below with reference to the accompanying drawings in detail.

(First Embodiment)

Before describing an electromagnetic resonant coupler according to the first embodiment of the present invention, presence of problems as described below in addition to the problems described earlier in the above conventional electromagnetic resonant coupler will be first described with reference to FIG. 46 and others.

For example, in the case of utilizing an electromagnetic resonant coupler in a circuit using a plurality of insulation elements like insulation elements of an insulated gate driving circuit of an inverter system, there is a possibility of radiating a part of a high frequency used for transmitting a signal or power of the electromagnetic resonant coupler, mutually interfering with adjacent electromagnetic resonant couplers, and causing a malfunction of the system.

Figure 46:
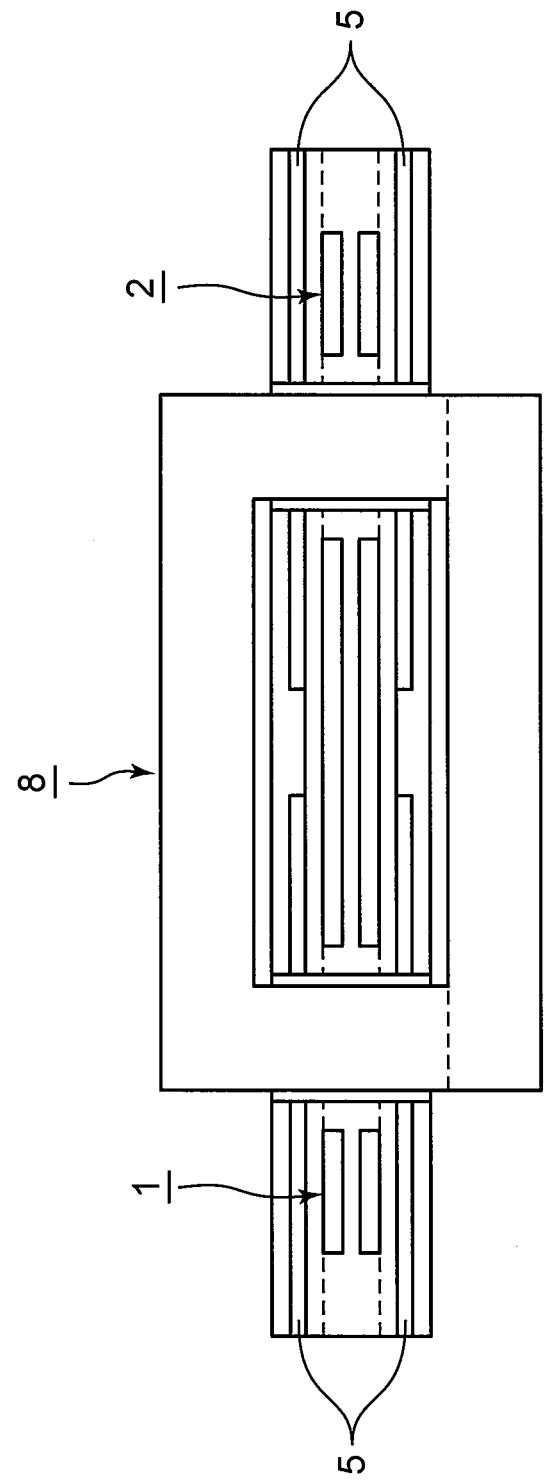
FIG. 46 is a perspective view of an electromagnetic resonant coupler which shields a high frequency by using a conventional technique in Patent Literature 2.

To solve this problem, a transformer having a function similar to that of an insulation element is present as described in Patent Literature 2 (Unexamined Japanese Patent Publication No. 2010-278387) (refer to FIG. 46). In this transformer, there is proposed a structure for preventing unnecessary electromagnetic field noise by installing a shield on each of an upper surface and a lower surface of a transformer element called a planar coil type transformer which is equipped with a primary coil 1 and a secondary coil 2, shield conductors 5, and a core 8. The primary coil 1 and the secondary coil 2 are each formed by coil conductors that are patterned by two-layer inner layer conductors out of a four-layer printed substrate. The shield conductors 5 are patterned by two-layer outer layer conductors out of the four-layer printed substrate, and the respective two-layer outer layer conductors cover the primary and secondary coils 1 and 2, respectively from both sides. The core 8 is overlapped on an outer side of the shield conductors 5, and forms a magnetic circuit extending by piercing through opening parts of the primary and secondary coils 1 and 2 as well as the respective shield conductors 5.

However, a first ground shield and a second ground shield in a longitudinal direction in FIG. 46 are insufficient to obtain the effect of suppressing high-frequency noise, the first ground shield and the second ground shield being installed on the upper surface and the lower surface as illustrated in FIG. 46. The reasons will be described below.

In the case of the transformer element described in Patent Literature 2, a signal or power is transmitted while insulating the signal or power by utilizing an electromagnetic induction phenomenon, by a low frequency of several hundred Hz to several hundred kHz. Because the low frequency has a long wavelength of a radio wave, even in the case of the ground shield located at a position with a relatively long distance between the upper and lower surfaces of the transformer element, electromagnetic waves do not enter from a lateral direction in FIG. 46 and there occurs no mutual interference even when the transformer element is brought close.

However, in the case of an electromagnetic resonant coupler, a signal or power is transmitted while insulation by utilizing a resonance phenomenon according to LC resonance. Therefore, a frequency that is to be used falls within a range from a microwave band to a millimeter wave band, and thus a very high frequency band is used as compared with the case of using the transformer element. Therefore, high-frequency noise from the lateral direction cannot be sufficiently shielded by only the ground shields that are arranged on upper and lower sides of the element.

Therefore, an object of the first embodiment is to provide an electromagnetic resonant coupler and a high-frequency transmission device which reduce lateral-direction high-frequency noise and in which there is no interference even when the electromagnetic resonant coupler is brought close in the electromagnetic resonant coupler utilizing a high frequency.

Hereinafter, the first embodiment will be described in detail.

An electromagnetic resonant coupler 10 according to the first embodiment of the present invention is the electromagnetic resonant coupler 10 that transmits high-frequency signals between circuits located on different planes. The electromagnetic resonant coupler 10 includes: a first resonator 100 as a ring-shaped wire (a resonant wire) a part of which is opened by an opening part 101; a first input/output terminal 110 electrically connected to the first resonator 100; a second resonator 100 as a ring-shaped wire (a resonant wire) apart of which is opened by an opening part 201; a second input/output terminal 210 electrically connected to the second resonator 200; a first ground shield 140 formed on a plane different from planes of the first resonator 100 and the second resonator 200; a second ground shield 240 formed on a plane different from planes of the first resonator 100, the second resonator 200, and the first ground shield 140; a first ground wire 120 formed to surround a periphery of the first resonator 100; and a second ground wire 220 formed to surround a periphery of the second resonator 200. The first ground shield 140 and the first ground wire 120 are electrically connected to each other, and the second ground shield 240 and the second ground wire 220 are electrically connected to each other. A dielectric layer (a third dielectric substrate) 3000 is present between the first ground wire 120 and the second ground wire 220, and the first ground wire 120 and the second ground wire 220 are not electrically connected to each other.

Hereinafter, the first embodiment of the present invention will be described in detail with reference to the drawings.

FIG. 1 is a perspective view illustrating an example of a structure of the electromagnetic resonant coupler 10 according to the first embodiment of the present invention.

Figure 2:
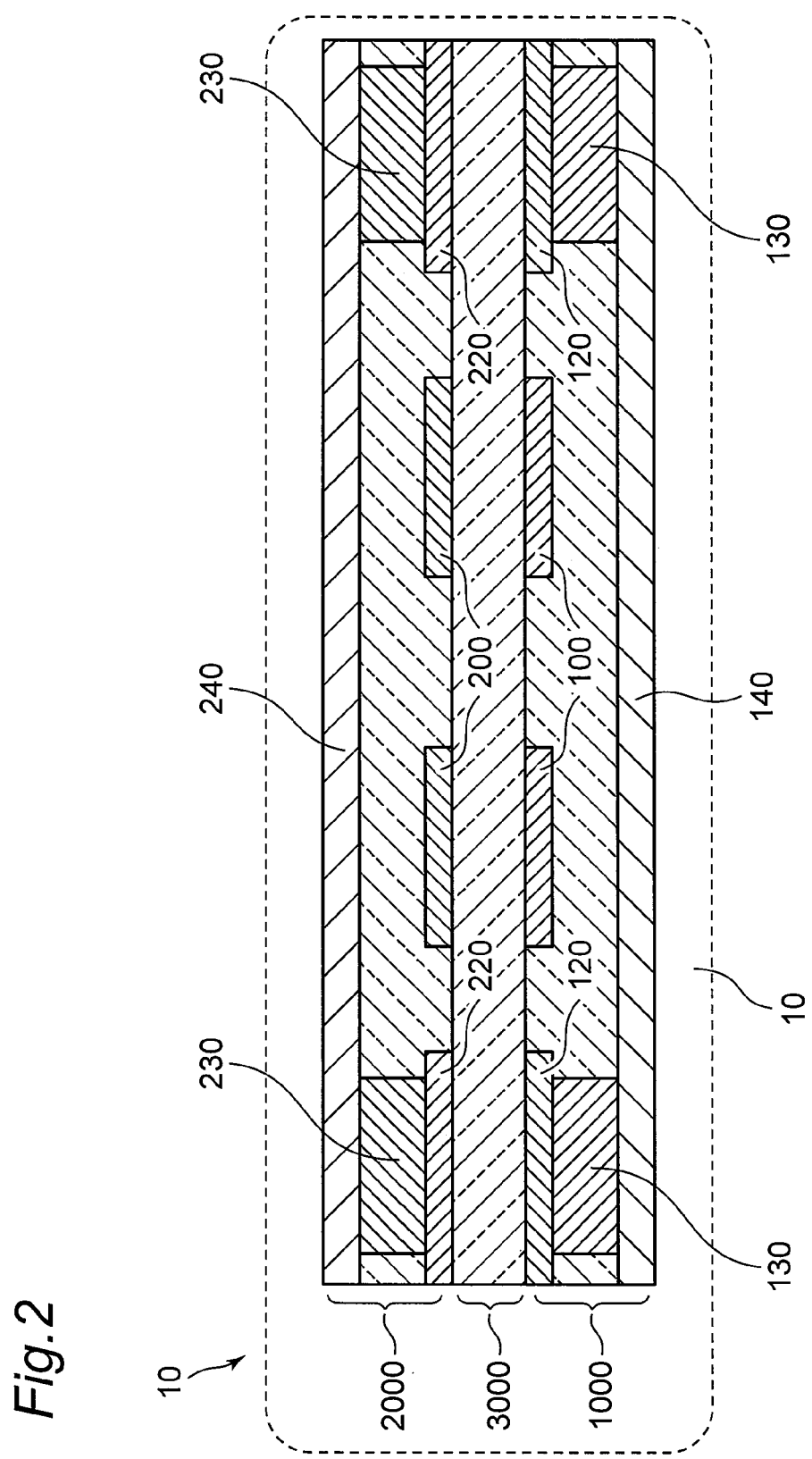
FIG. 2 is a sectional view illustrating the example of the configuration of the electromagnetic resonant coupler according to the first embodiment of the present invention.

FIG. 2 is a sectional view of the electromagnetic resonant coupler 10 in FIG. 1 obtained by cutting the electromagnetic resonant coupler 10 along a plane passing in a Y-axis direction of dielectric substrates 1000, 2000, and 3000 (a plane passing through a line A-A' in FIG. 1, and perpendicular to surfaces of the dielectric substrates 1000, 2000, and 3000).

The electromagnetic resonant coupler 10 according to the first embodiment of the present invention includes the first resonator 100, the second resonator 200, the first input/output terminal 110, the second input/output terminal 210, the first ground shield 140, the second ground shield 240, the first ground wire 120, and the second ground wire 220.

The first resonator 100 is a ring-shaped transmission line formed by a metal wire, for example, copper, and has the opening part 101 at a part of an arbitrary position.

The second resonator 200 is a ring-shaped transmission line formed by a metal wire, for example, copper, and has the opening part 201 at a part of an arbitrary position.

The first resonator 100 and the second resonator 200 are each formed on two different planes separated by a fixed distance and electrically insulated by the third dielectric substrate 3000, and are opposed in a longitudinal direction (a vertical direction) in FIG. 1 and FIG. 2. The first resonator 100 and the second resonator 200 are each obtained by bending a so-called high-frequency antenna structure in a ring shape. It is preferable that the first resonator 100 and the second resonator 200 each have a length of about ½ of a transmission frequency to be used together.

Furthermore, positions in horizontal directions of the first resonator 100 and the second resonator 200 may be arbitrary positions where an electromagnetic resonance phenomenon occurs between the first and second resonators, and preferably, the first resonator 100 and the second resonator 200 have the same center axis as far as possible. Further, preferably, the opening part 101 and the opening part 201 are at positions deviated by at least 90 degrees or more. Most preferably, the opening part 101 and the opening part 201 are at positions symmetrical by 180 degrees. By arranging in this way, the resonators can be strongly coupled together, and efficient power transmission becomes possible.

The first input/output terminal 110 is formed by a metal wire, for example, copper, that performs input and output of a high-frequency signal to the first resonator 100. The first input/output terminal 110 is arranged at an arbitrary position of a ring-shaped transmission line of the first resonator 100.

Similarly, the second input/output terminal 210 is formed by a metal wire, for example, copper, that performs input and output of a high-frequency signal to the second resonator 200. The second input/output terminal 210 is arranged at an arbitrary position of a ring-shaped transmission line of the first resonator 200.

In FIG. 1, although each shape of the first resonator 100 and the second resonator 200 is illustrated as a circular ring shape, a ring shape is sufficient, and the shape may be other ring shape such as a square ring shape and an oval ring shape.

The first ground shield 140 is formed by a metal layer sufficiently larger than a layout area of the first resonator 100, on a plane different from a plane on which the first resonator 100 is arranged, across the first dielectric substrate 1000 arranged below the third dielectric substrate 3000. As an example, the first ground shield 140 is formed into a rectangular flat shape.

The second ground shield 240 is formed by a metal layer sufficiently larger than a layout area of the second resonator 200, on a plane different from a plane on which the second resonator 200 is arranged, across the second dielectric substrate 2000 arranged above the third dielectric substrate 3000. As an example, the second ground shield 240 is formed into a rectangular flat shape.

The first ground wire 120 is a transmission line formed by a metal wire, for example, copper, arranged in a circular ring shape formed with a fixed gap from the first resonator 100 in a lateral direction orthogonal to a longitudinal direction (along an arrangement surface of the first resonator 100) so as to surround an outer periphery of the first resonator 100. The first ground wire 120 is electrically connected to the first ground shield 14 by a plurality of rod-shaped first metal conductors 130, for example, copper, piercing through the first dielectric substrate 1000 in a thickness direction (a longitudinal direction). The first metal conductors 130 are arranged with an appropriate gap to the extent of generating no deviation.

The second ground wire 220 is a transmission line formed by a metal wire, for example, copper, arranged in a circular ring shape formed with a fixed gap from the second resonator 200 in a lateral direction (along an arrangement surface of the second resonator 200) so as to surround an outer periphery of the second resonator 200. The second ground wire 220 is electrically connected by a plurality of rod-shaped second metal conductors 230, for example, copper, piercing through the second dielectric substrate 2000 in a thickness direction (a longitudinal direction). The second metal conductors 230 are also arranged with an appropriate gap to the extent of generating no deviation.

The first ground wire 120 and the second ground wire 220 are arranged opposite to each other in a longitudinal direction, and are insulated across a dielectric layer formed with a fixed gap, for example, the third dielectric substrate 3000. By providing the dielectric layer formed with a fixed gap in this way, grounds of the first resonator 100 and the second resonator 200 are separated by direct currents or low-frequency signals. Further, in the case of handling high-frequency signals like in the first embodiment, the dielectric layer with the fixed gap works as a shield against radiated high-frequency noise.

For reducing high-frequency noise, because omniazimuth of the electromagnetic resonant coupler 10 should be covered with a metal shield as far as possible, it is preferable to make small the gap of the dielectric layer. However, a dielectric strength voltage of the electromagnetic resonant coupler is determined by the product of an interlayer distance of nearest portions of two resonators and insulation electric field breakdown strength of an interlayer material. Therefore, when the gap of the dielectric layer is made small, the dielectric strength voltage becomes small. A correlation between the gap of the dielectric layer, electric field strength in a lateral direction exerted on the electromagnetic resonant coupler 10, and the dielectric strength voltage will be described in detail by illustrating a graph of the correlation in FIG. 3.

Figure 3:
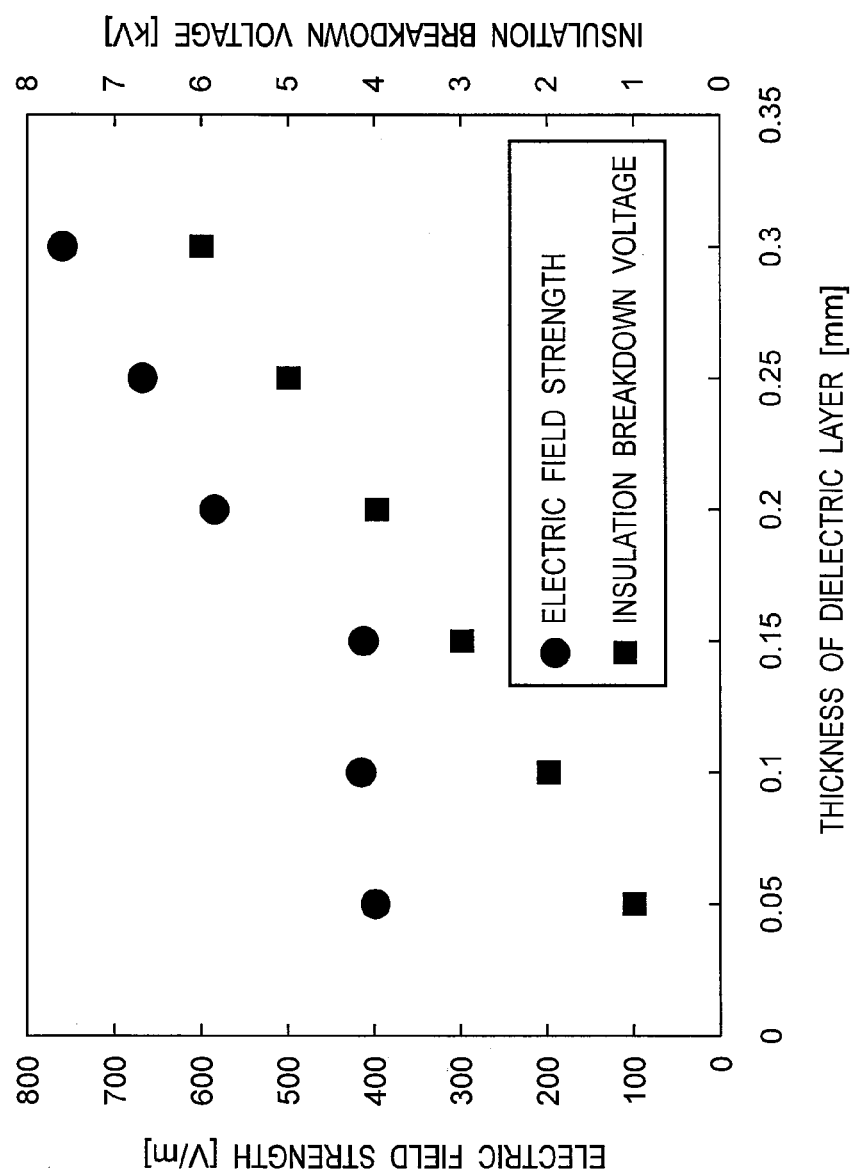
FIG. 3 is a graph illustrating thickness dependency of a dielectric layer that the electromagnetic resonant coupler according to the first embodiment of the present invention has.

FIG. 3 illustrates electric field strength values using a frequency of a transmission frequency of 5.8 GHz, calculated in the center in a longitudinal direction of the electromagnetic resonant coupler, and at a vertex point of a diagonal of the first ground shield in a lateral direction. A wavelength in the vacuum of 5.8 GHz can be calculated by an equation of wavelength [m]=velocity of electric wave [m/s]÷frequency [Hz], and the wavelength is equal to 50 mm. Because the dielectric substrate of a dielectric constant of 10 is used this time, an effective wavelength can be calculated by $$\text{effective wavelength } [m] = \frac{\text{wavelength in vacuum } [m]}{\sqrt{\text{(dielectric constant of dielectric substrate)}}}.$$

The effective wavelength this time can be calculated as 1.5 mm.

From the graph in FIG. 3, in the dielectric layer having a thickness that is equal to or less than 0.15 mm, the electric field strength takes a substantially constant value of 400 V/m. That is, when the thickness of the dielectric layer is equal to or less than 1/10 of the effective wavelength, it can be understood that the thickness is extremely small as compared with the effective wavelength and high-frequency noise can be substantially shielded.

Further, an electric field strength at the same point in the case of using an electromagnetic resonant coupler of a similar structure without the first ground wire 120 and the second ground wire 220 is 3800 V/m. Even when the gap of the dielectric layer is equal to or more than 1/10 of the effective wavelength, the effect of suppressing high-frequency noise is sufficiently effective.

Because the dielectric strength voltage is determined by the product of the interlayer distance and the insulation electric field breakdown strength of the interlayer material, when the insulation electric field breakdown strength is 20 kV/mm, for example, the dielectric strength voltage increases in a proportional relationship as the thickness of the dielectric layer becomes large, as illustrated in FIG. 3.

Therefore, when the insulation electric field breakdown strength of the interlayer material is constant, for example, the wiring length of the resonator increases by using a material having a low dielectric constant. However, the thickness of the dielectric layer for shielding the high-frequency noise can be increased, and the dielectric strength voltage can be also improved.

So far, the first resonator 100 and the second resonator 200 are described in distinction from each other. However, in actual practice, because structures and functions of these resonators are equal, there is no special limit that the first resonator 100 must be used on an input side and the second resonator 200 must be used on an output side. There is no problem in characteristics when the first resonator 100 is used on an output side and the second resonator 200 is used on an input side.

Figure 4:
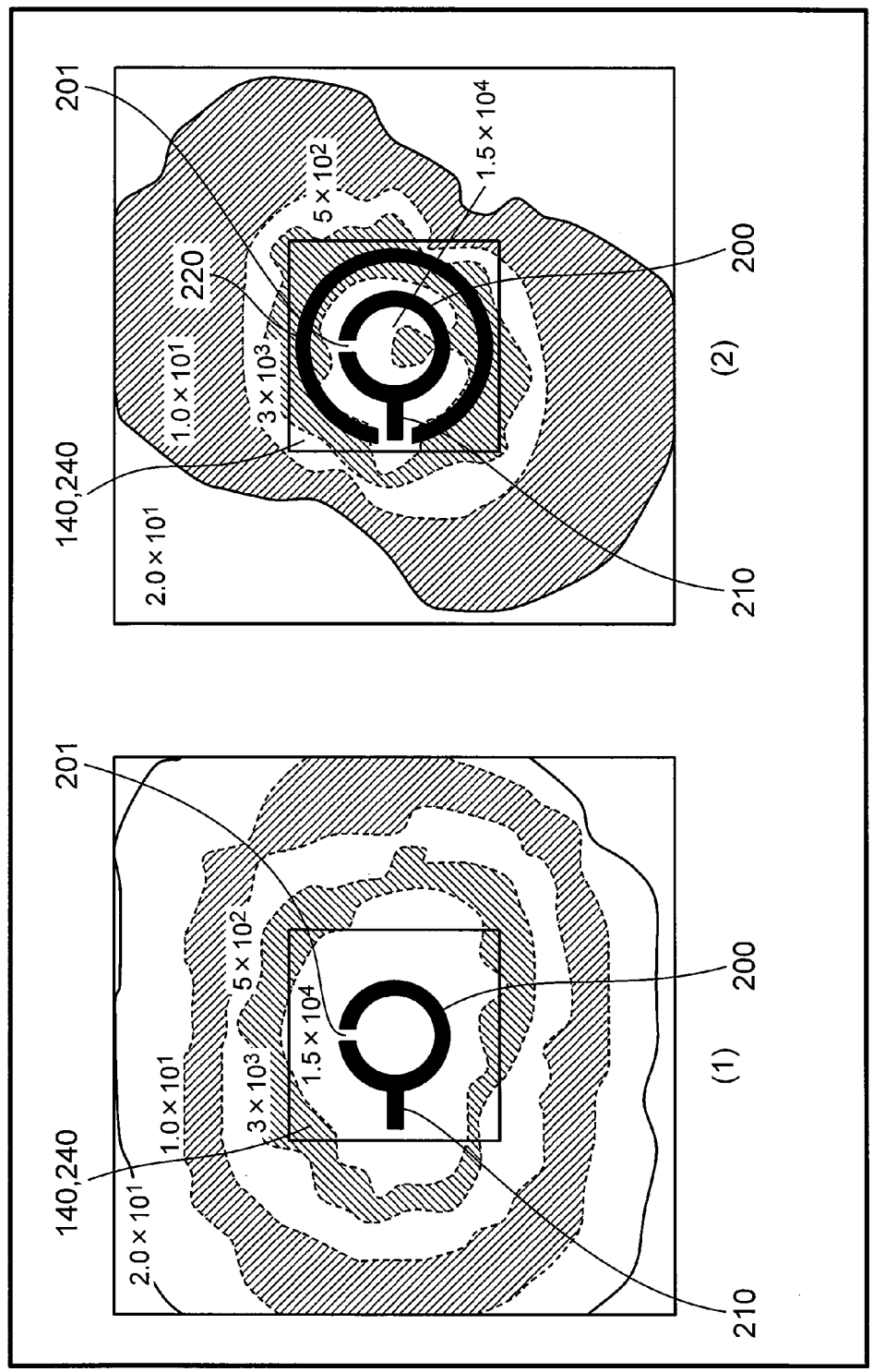
FIG. 4 is an electric field distribution diagram illustrating an example of an effect of suppressing high-frequency noise of the electromagnetic resonant coupler according to the first embodiment of the present invention.

A result of performing a simulation for confirming the spread of high-frequency noise by using the first embodiment of the present invention will be described below. (1) of FIG. 4 illustrates an electromagnetic field analysis result of an electromagnetic resonant coupler in which a metal ground shield is arranged on only an upper surface and a lower surface of a resonator unit, as the conventional art. Further, (2) of FIG. 4 illustrates an electromagnetic field analysis result of the electromagnetic resonant coupler using the first embodiment of the present invention. White portions in FIG. 4 (in particular, portions of display of $1.5 \times 10^4$) indicate portions where the electric field strength is large.

As illustrated in (1) of FIG. 4, in the electromagnetic resonant coupler in which the metal ground shield is arranged on only the upper surface and the lower surface, it is understood that high-frequency noise is radiated widely to an outer side of the substrate on which the resonator 200 is formed.

On the other hand, as illustrated in (2) of FIG. 4, in the electromagnetic resonant coupler 10 using the first embodiment of the present invention, it can be confirmed that electromagnetic field noise is suppressed by the second ground wire 220 arranged in the periphery of the second resonator 200 and the second metal conductors 230, and radiation of high-frequency noise is suppressed on an inner side of the substrate on which the electromagnetic resonant coupler 10 is formed.

From the above, by using the first embodiment of the present invention, there can be obtained the effect of reducing not only high-frequency noise in a longitudinal direction by the first ground shield 140 and the second ground shield 240 being arranged but also high-frequency noise in a lateral direction by the first ground wire 120, the second ground wire 220, the metal conductor 130, and the metal conductor 230.

Figure 5:
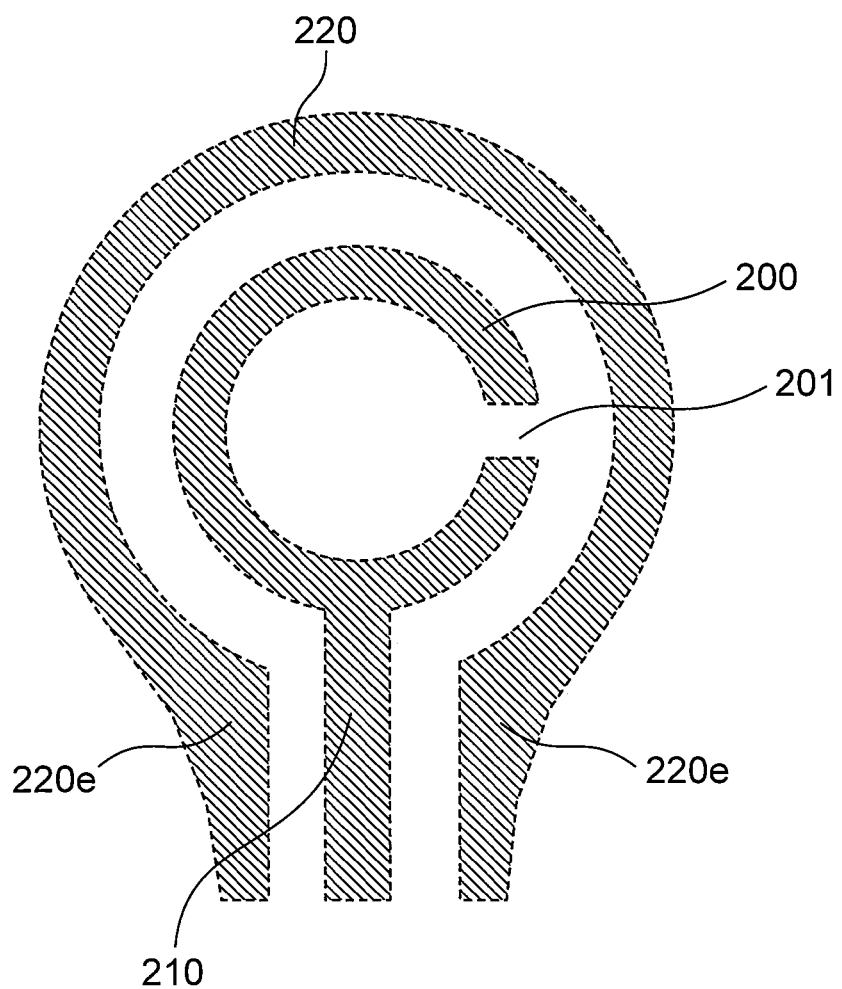
FIG. 5 is a plan view illustrating a first ground wire or a second ground wire in the electromagnetic resonant coupler according to a modification of the first embodiment of the present invention.

Further, the first ground wire 120 and the second ground wire 220 are not necessary to have always constant widths. For example, as illustrated in FIG. 5, the width of the ground wire of each peripheral portion of the first input/output terminal 110 and the second input/output terminal 210 (for example, a peripheral portion 220e of the second input/output terminals 210) can be increased. By such a structure, noise generated in discontinuous portions between a resonator and an input/output terminal can be reduced. In FIG. 5, these portions are displayed by shaded lines to facilitate understanding of the ground wire.

Not only the widths of the ground wires 120 and 220, but also the thicknesses of the layers of the ground wires 120 and 220 are not necessary to be constant. A shielding effect functions without problems even when a thickness of a part changes. When possible, it is preferable that the ground wires 120 and 220 and the ground shields 140 and 240 have thicknesses that are not influenced by a skin effect. A skin effect d is expressed by the following equation.

$$d = \sqrt{(2\rho/2\pi f\mu)}$$

Here, d: skin effect

ρ: electric resistivity of conductor f: frequency

μ: magnetic permeability of conductor

By setting the thicknesses of the layers of the ground wires 120 and 220 to thicknesses of the skin effect d or more, loss of a return current can be reduced, and efficiency of the electromagnetic resonant coupler 10 can be improved.

A gap between the ground wire 120 and the resonator 100 and a gap between the ground wire 220 and the resonator

200 are preferably about the same as the resonator wire width or more. When the gap between the ground wire 120 and the resonator 100 and the gap between the ground wire 220 and the resonator 200 are too close, coupling between the ground wire 120 and the resonator 100 and coupling between the ground wire 220 and the resonator 200 become stronger than coupling between the first resonator 100 and the second resonator 200, which results in reduction in the efficiency of the electromagnetic resonant coupler 10.

Next, a manufacturing method in the first embodiment of the present invention will be described with reference to FIG. 2.

The electromagnetic resonant coupler 10 of the first embodiment can be manufactured by a conventional technique of manufacturing a dielectric substrate, what is called a printed substrate.

The first resonator 100, the first input/output terminal 110, the first ground wire 120, and the first ground shield 140 are formed by patterning metal foils formed on both surfaces of the first dielectric substrate 1000 into arbitrary shapes by etching. In the first embodiment, as an example, there are used a copper foil having a thickness of 35 μm as a metal foil, and a polyphenylene ether resin (a PPE resin) obtained by filling at a high filling rate high dielectric constant-use fillers each having a thickness of 300 μm as the first dielectric substrate 1000. The PPE resin has a dielectric constant of 10, and insulation electric field breakdown strength of 20 kV/mm.

Similarly, the second resonator 200, the second input/output terminal 210, the second ground wire 220, and the second ground shield 240 are formed by patterning metal foils formed on both surfaces of the second dielectric substrate 2000 into arbitrary shapes by etching. Further, in a similar manner to that of the case of the first resonator 100 and the like, as an example, there are used a copper foil having a thickness of 35 μm as a metal foil, and a polyphenylene ether resin (a PPE resin) obtained by filling at a high filling high dielectric constant-use fillers each having a thickness of 300 μm as the second dielectric substrate 2000. The PPE resin has a dielectric constant of 10, and insulation electric field breakdown strength of 20 kV/ram.

In the first embodiment, a transmission frequency used is 5.8 GHz, each circumferential length of the first resonator 100 and the second resonator 200 is approximately 6 mm, and each wiring width is 150 μm. Further, each wiring width of the first ground wire 120 and the second ground wire 220 is 300 μm.

The first dielectric substrate 1000 and the second dielectric substrate 2000 each obtained by patterning the metal foils are bonded together by making the first resonator 100 and the second resonator 200 oppose to each other using the third dielectric substrate 3000 as the interlayer film, and by pressing. For the third dielectric substrate 3000, the PPE resin obtained by filling at a high filling rate high dielectric constant-use fillers each having a thickness of 300 μm is used.

On a produced bonded substrate, a through-hole is formed by using a drill, and an inner side of the through-hole is metal-plated. In this way, the metal conductor 130 and the metal conductor 230 are each formed. Further, at the time of forming the through-hole, in order to electrically connect to an external element, a pad, the first input/output terminal 110, and the second input/output terminal 210 are electrically connected to each other.

Figure 6:
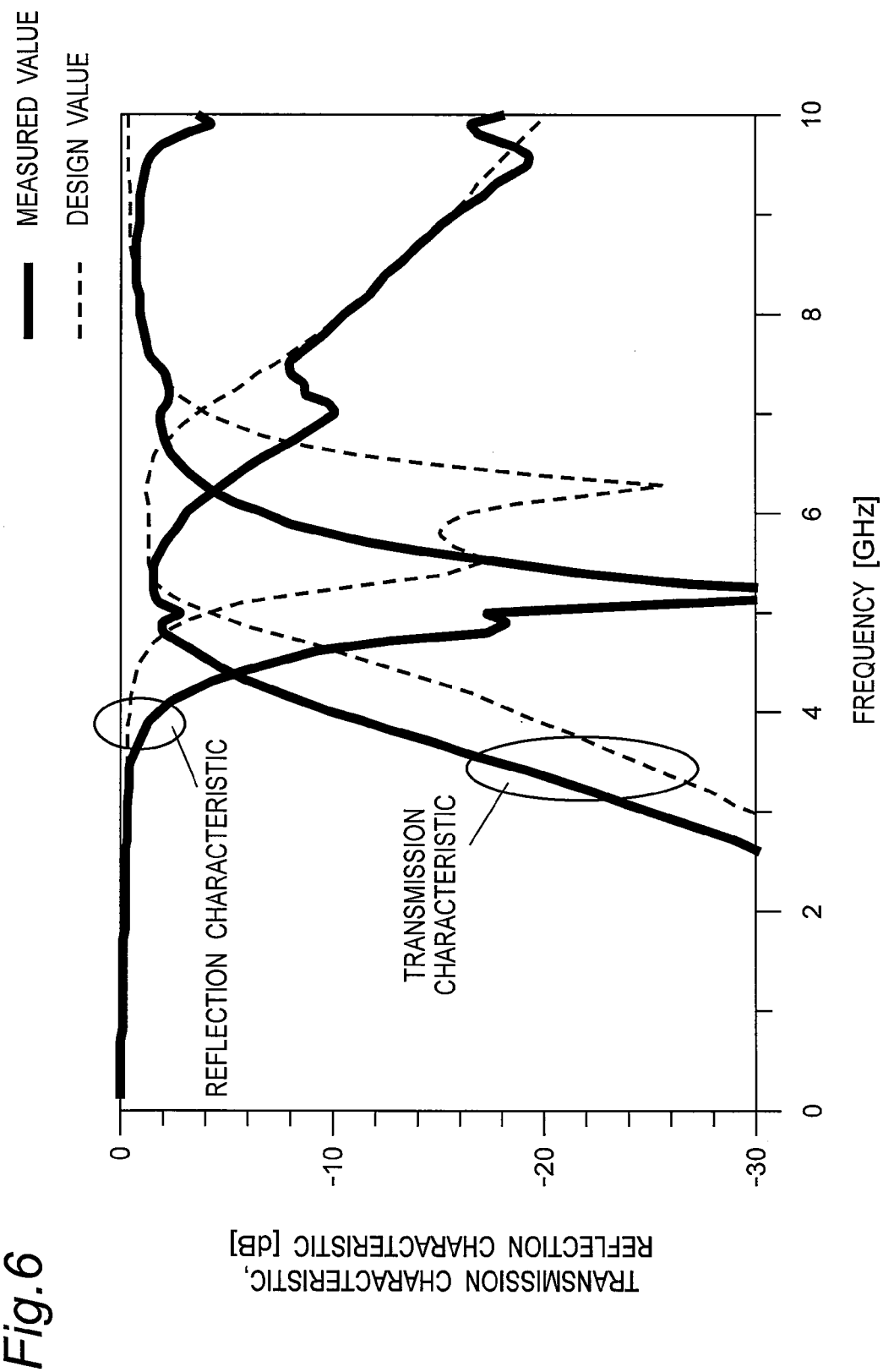
FIG. 6 is a graph illustrating a high-frequency transmission characteristic of the electromagnetic resonant coupler according to the first embodiment of the present invention.

FIG. 6 illustrates a transmission characteristic of the electromagnetic resonant coupler 10 of the first embodiment. A design value is expressed by a dotted line, and a measured value is expressed by a solid line. A transmission loss at 5.8 GHz is about 1.8 dB, and this indicates that the electromagnetic resonant coupler 10 can be realized with low loss and that highly efficient signal-and-power transmission can be performed. Further, design and measurement are consistent with relatively high accuracy, and this indicates that production can be realized by the above manufacturing method.

Figure 7:
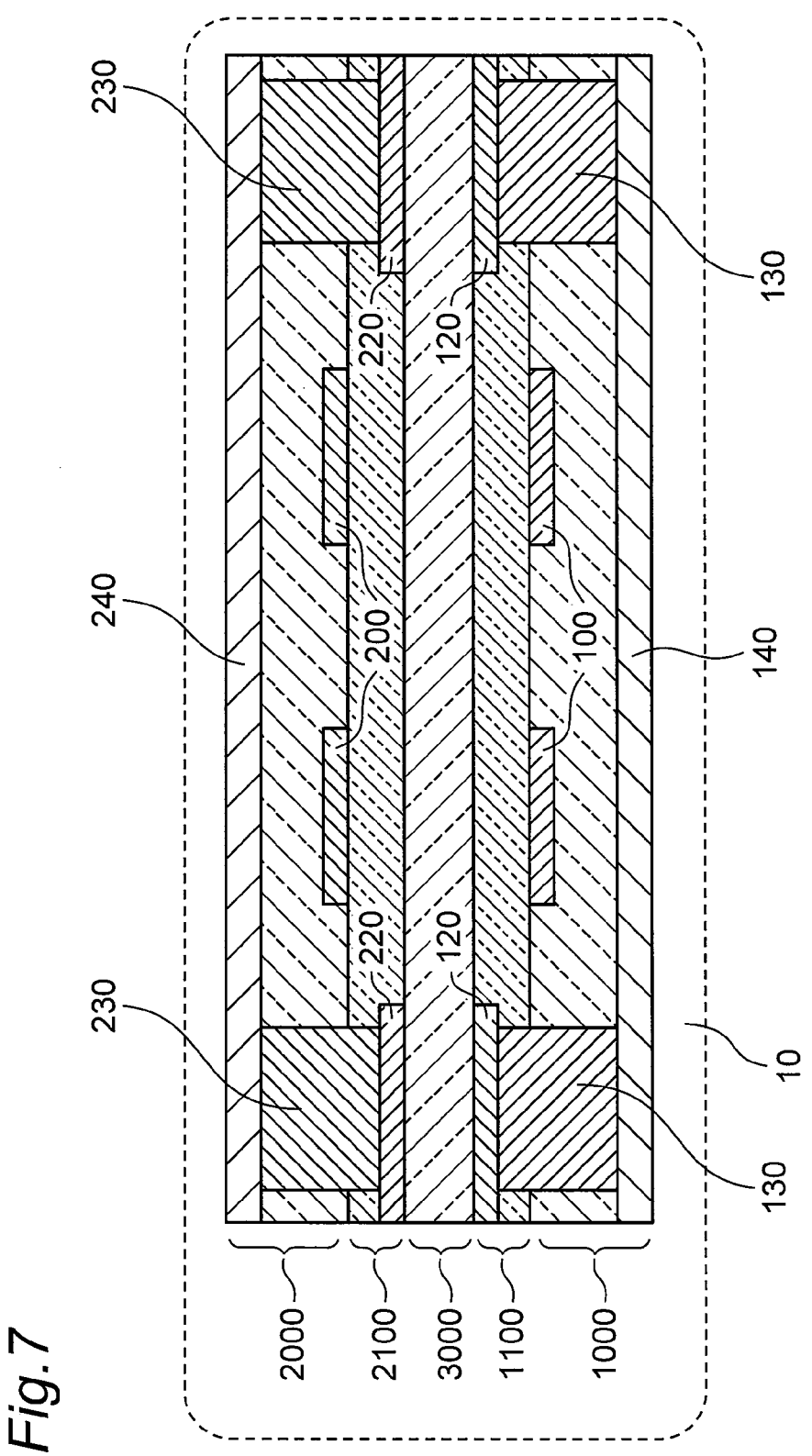
FIG. 7 is a sectional view illustrating an example of a configuration of the electromagnetic resonant coupler according to the first embodiment of the present invention.

So far, there is described a method of forming each of the first ground wire 120 and the second ground wire 220 on the same plane as the first resonator 100 and the second resonator 200 (on the same metal foil). However, the present invention is not limited to this method. For example, as illustrated in FIG. 7, it is also possible to form the first ground wire and the second ground wire on different planes. Hereinafter, this method will be described with reference to FIG. 7.

The first resonator 100, the first input/output terminal 110, and the first ground shield 140 are formed by patterning metal foils formed on both surfaces of the first dielectric substrate 1000 into arbitrary shapes by etching. The first ground wire 120 is formed by patterning a metal foil formed on a single surface of a fourth dielectric substrate 1100 different from the first to third dielectric substrates 1000 to 3000 into an arbitrary shape by etching.

Similarly, the second resonator 200, the second input/output terminal 210, and the second ground shield 240 are formed by patterning metal foils formed on both surfaces of the second dielectric substrate 2000 into arbitrary shapes by etching. The second ground wire 220 is formed by patterning a metal foil formed on a single surface of a fifth dielectric substrate 2100 into an arbitrary shape by etching.

The first and fourth dielectric substrates 1000 and 1100 obtained by patterning the metal foils are pressed in a direction in which the metal foils are not overlapped. Similarly, the second and fifth dielectric substrates 2000 and 2100 are also pressed. Finally, the first resonator 100 and the second resonator 200 are pressed and bonded together in opposed directions, by using the third dielectric substrate 3000 as an interlayer film.

By using this manufacturing method, a distance of the dielectric layer (the third dielectric substrate 3000) between the first ground wire 120 and the second ground wire 220 can be arbitrarily formed.

Each circumferential length of the first resonator 100 and the second resonator 200 is a value that naturally changes depending on a frequency to be used. Each wiring width of the first resonator 100 and the second resonator 200 is a variable value for obtaining a desired characteristic impedance based on a distance between the resonator and the ground shield, that is, thicknesses of the first and second dielectric substrates 1000 and 2000.

Naturally, the first embodiment is an example, and the used frequency is not limited to 5.8 GHz and can be widely applied in a range from a microwave band to a millimeter wave band.

According to the first embodiment, the transmission device including the electromagnetic resonant coupler 10, a transmission circuit, and a receiver circuit can be easily manufactured. That is, in general, in the case of modularizing a high-frequency transmission device, a supporting unit such as a lead frame and a installing substrate is separately necessary to install a receiver circuit chip, a transmission circuit chip, and an insulation element. On the other hand, in the embodiment of the present invention, a circuit chip can be arranged on a substrate 701 including the electromagnetic resonant coupler 10 as an insulation element. Because a supporting unit is not separately necessary, manufacturing becomes easy. Further, according to the first embodiment, in the electromagnetic resonant coupler 10 using a high frequency, high-frequency noise in a lateral direction can be reduced by the first ground wire 120, the second ground wire 220, the metal conductor 130, and the metal conductor 230. Therefore, even when the magnetic resonant coupler 10 is brought close, there is no interference. Further, according to the first embodiment, because at least one of the transmission circuit and the receiver circuit is arranged on the main surface of the substrate 701, wires 704 between the circuit arranged on the main surface and a terminal can be shortened.

(Second Embodiment)

In the first embodiment of the present invention, the structure of reducing radiation of electromagnetic noise in a lateral direction by arranging the ground wires 120 and 220 in the periphery of the electromagnetic resonant coupler 10 is described.

On the other hand, an electromagnetic resonant coupler 11 according to a second embodiment of the present invention includes: a first ground wall 330 which extends in a perpendicular direction in a direction from a first ground shield to a second ground shield so as to surround a periphery of a first resonant wire 100; and a second ground wall 430 which extends in a perpendicular direction in a direction from a second ground shield to the first ground shield so as to surround a periphery of a second resonant wire at a position different from the first ground wall 330. The first ground shield and the first ground wall 330 are electrically connected to each other, and the second ground shield and the second ground wall 430 are electrically connected to each other. A first dielectric layer 332 is present between the first ground wall 330 and the second ground wall 430, and the first ground wall 330 and the second ground wall 430 are not electrically connected to each other. A second dielectric layer 432 is present between the second ground wire and the first ground wall 430, and the second ground wire and the first ground wall 430 are not electrically connected to each other. A third dielectric layer is present between the first ground wall and the second ground wall, and the first ground wall and the second ground wall are not electrically connected to each other. Positions of the first dielectric layer 332 and the second dielectric layer 432 are not present on the same plane.

Hereinafter, the second embodiment of the present invention will be described in detail with reference to the drawings.

Figure 8:
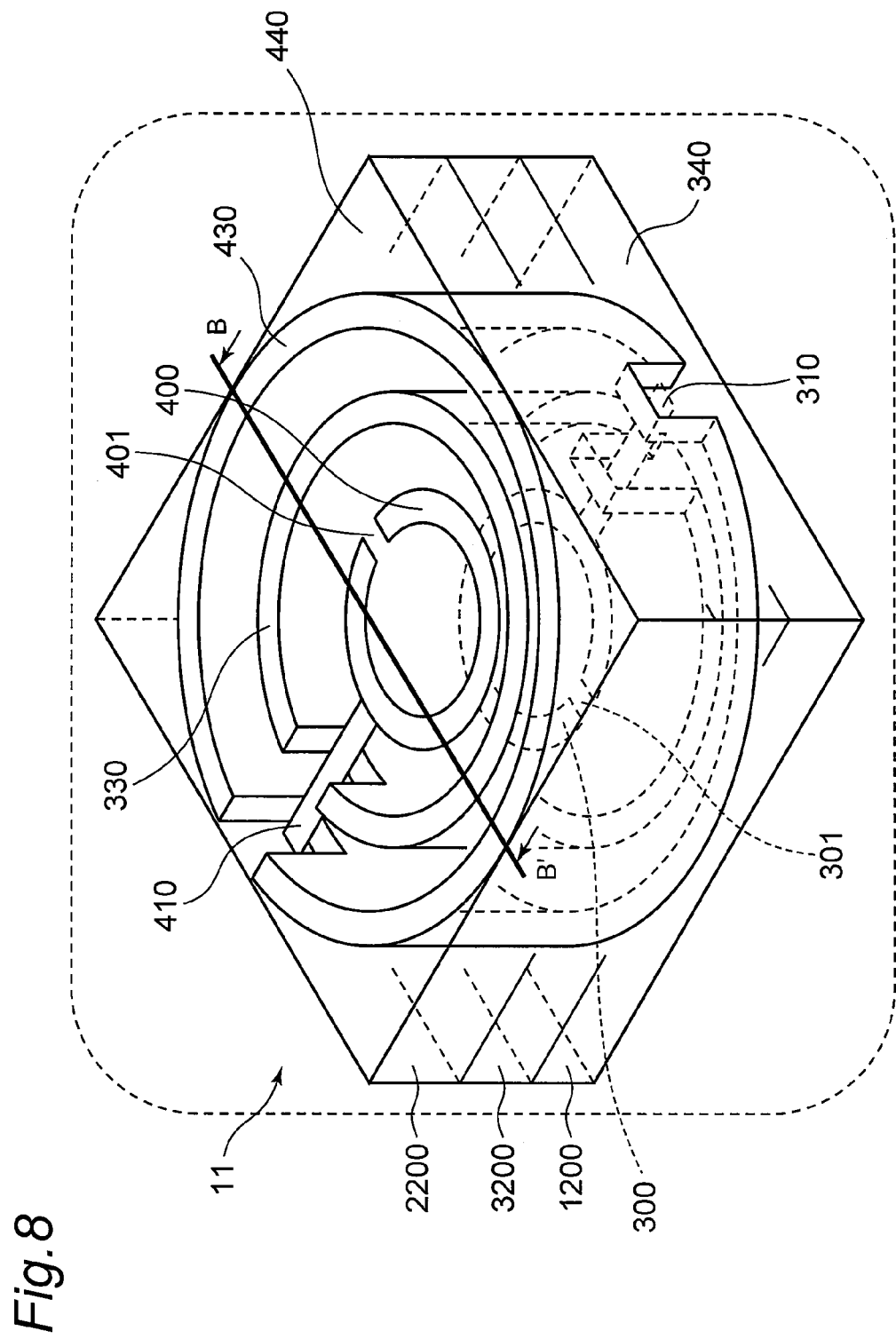
FIG. 8 is a perspective view illustrating an example of a configuration of an electromagnetic resonant coupler according to a second embodiment of the present invention.

FIG. 8 is a perspective view illustrating an example of a structure of the electromagnetic resonant coupler 11 according to the second embodiment of the present invention.

Figure 9:
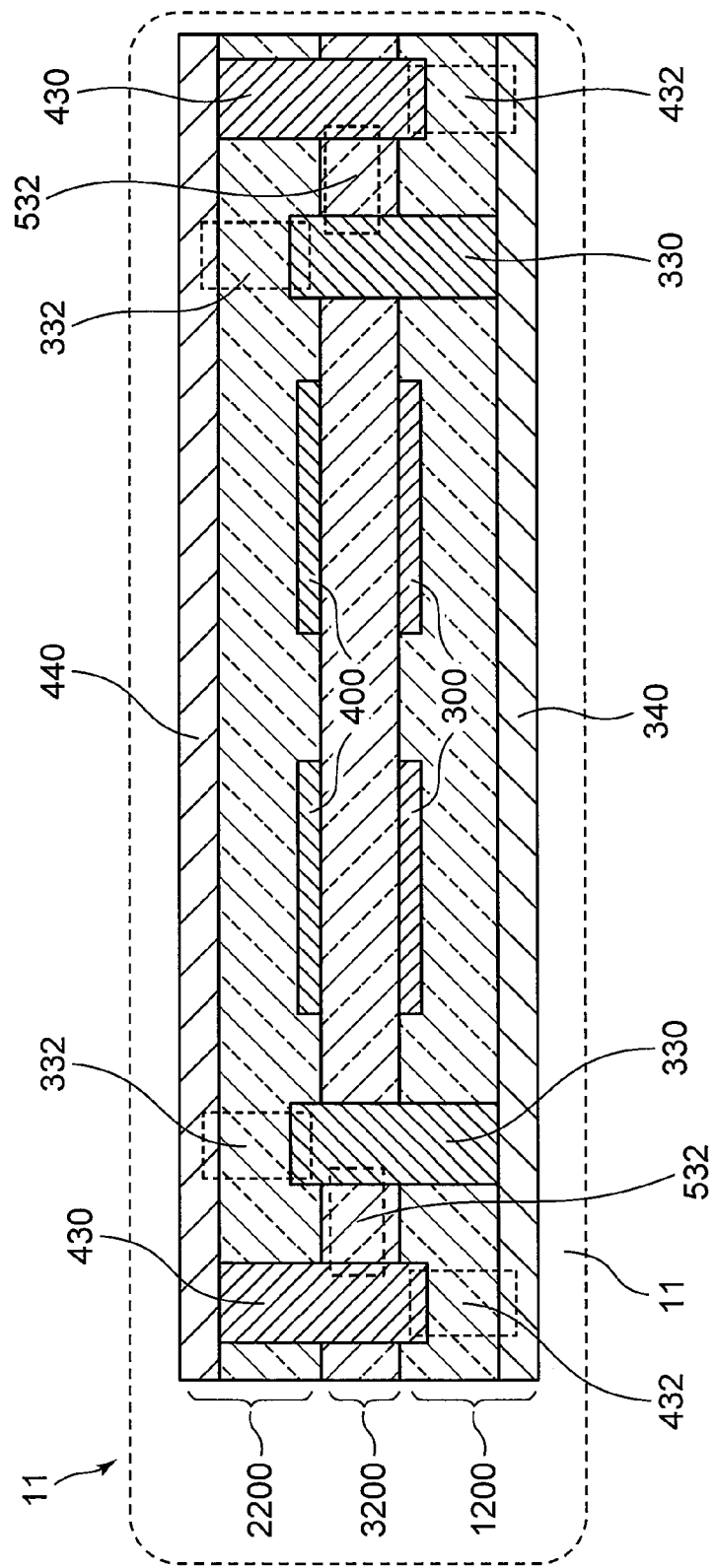
FIG. 9 is a sectional view illustrating the example of the configuration of the electromagnetic resonant coupler according to the second embodiment of the present invention.

FIG. 9 is a sectional view of the electromagnetic resonant coupler 11 in FIG. 8 obtained by cutting the electromagnetic resonant coupler 11 along a plane passing in a Y-axis direction of substrates 1200, 3200, and 2200 (a plane passing through a line B-B' in FIG. 8, and perpendicular to the substrates 1200, 3200, and 2200).

The electromagnetic resonant coupler 11 according to the second embodiment of the present invention includes a first resonator 300, a second resonator 400, a first input/output terminal 310, a second input/output terminal 410, a first ground shield 340, a second ground shield 440, a first metal wall 330, and a second metal wall 430.

The first resonator 300 is a ring-shaped transmission line formed by a metal wire, for example, copper, and has an opening part 301 at a part of an arbitrary position.

The second resonator 400 is a ring-shaped transmission line formed by a metal wire, for example, copper, and has an opening part 401 at a part of an arbitrary position.

The first resonator 300 and the second resonator 400 are respectively formed on two different electrically-insulated planes separated by a fixed distance by a third dielectric substrate 3200, and are opposed to each other in a longitudinal direction (a vertical direction) in FIG. 8 and FIG. 9.

The first input/output terminal 310 is formed by a metal wire, for example, copper, that performs input and output of high-frequency signals to the first resonator 300. The first input/output terminal 310 is arranged to protrude outward in a radial direction from an arbitrary position of a ring-shaped transmission line of the first resonator 300.

Similarly, the second input/output terminal 410 is formed by a metal wire, for example, copper, that performs input and output of high-frequency signals to the second resonator 400. The second input/output terminal 410 is arranged to protrude outward in a radial direction from an arbitrary position of a ring-shaped transmission line of the first resonator 400.

In FIG. 8, although each shape of the first resonator 300 and the second resonator 400 is illustrated as a circular ring shape, a ring shape is sufficient like in the first embodiment of the present invention, and the shape may be other ring shape such as a square ring shape and an oval ring shape.

The first ground shield 340 is formed by a metal layer sufficiently larger than a layout area of the first resonator 300, on a plane different from a plane on which the first resonator 300 is arranged, across the first dielectric substrate 1200 arranged below the third dielectric substrate 3200. As an example, the first ground shield 340 is formed into a rectangular flat shape.

The second ground shield 440 is formed by a metal layer sufficiently larger than a layout area of the second resonator 400, on a plane different from a plane on which the second resonator 400 is arranged, across the second dielectric substrate 2200 arranged above the third dielectric substrate 3200. As an example, the second ground shield 440 is formed into a rectangular flat shape.

The first metal wall 330 is formed by a metal wall, for example, copper, arranged in a wall shape curved so as to surround an outer periphery of the first resonator 300, the wall shape being erected from the first ground shield 340 at an outer peripheral portion, piercing through the first dielectric substrate 1200 and the third dielectric substrate 3200 in a thickness direction, embedded up to a part of the second dielectric substrate 2200, and formed with a fixed gap from the first resonator 300 in a lateral direction (along an arrangement surface of the first resonator 300). The first metal wall 330 and the first ground shield 340 are electrically connected to each other.

The first dielectric layer 332 is present between the first metal wall 330 and the second ground shield 440, and the first metal wall 330 and the second ground shield 440 are not electrically connected to each other.

The second metal wall 430 is formed by a metal wall, for example, copper, arranged in a wall shape curved so as to surround an outer periphery of the second resonator 400, the metal wall being erected from the second ground shield 440 at an outer peripheral portion, piercing through the second dielectric substrate 2200 and the third dielectric substrate 3200 in a longitudinal direction, embedded up to a part of the first dielectric substrate 1200, and formed with a fixed gap from the second resonator 400 in a lateral direction (along an arrangement surface of the second resonator 400) so as not to overlap with the first metal wall 330. The second metal wall 430 and the second ground shield 440 are electrically connected to each other. The second dielectric layer 432 is present between the second metal wall 430 and the second ground shield 340, and the second metal wall 430 and the second ground shield 340 are not electrically connected to each other. A third dielectric layer 532 is present in a lateral direction between the first metal wall 330 and the second metal wall 430. The first dielectric layer 332, the second dielectric layer 432, and the third dielectric layer 532 provide an effect similar to that of the dielectric layer described in the first embodiment of the present invention.

In the first embodiment of the present invention, the dielectric layer (the third dielectric substrate) 3000 is formed at a portion where the first ground wire 120 and the second ground wire 220 are opposed in a longitudinal direction. On the other hand, in the second embodiment of the present invention, because the first ground wall 330 and the second ground walls 430 have an overlap in the lateral direction, there is no overlap of the dielectric layer in the perpendicular direction. Therefore, a ground shield is present in all portions in the lateral direction.

Because a relationship of a thickness or a dielectric strength voltage of the dielectric layers 332, 432, and 532 is similar to that in the first embodiment of the present invention, description will be omitted here. Because not only the first dielectric layer 332 and the second dielectric layer 432 in the perpendicular direction but also the third dielectric layer 532 in the lateral direction can be utilized, a degree of freedom in design becomes high.

Because a manufacturing method in the second embodiment of the present invention is substantially similar to the manufacturing method in the first embodiment of the present invention, description will be omitted.

FIG. 8 illustrates that the first metal wall 330 is arranged on an inner side in a lateral direction of the second metal wall 430. However, an effect of the second embodiment will not be changed even when the second metal wall 430 is arranged on an inner side of the first metal wall 330.

Figure 10:
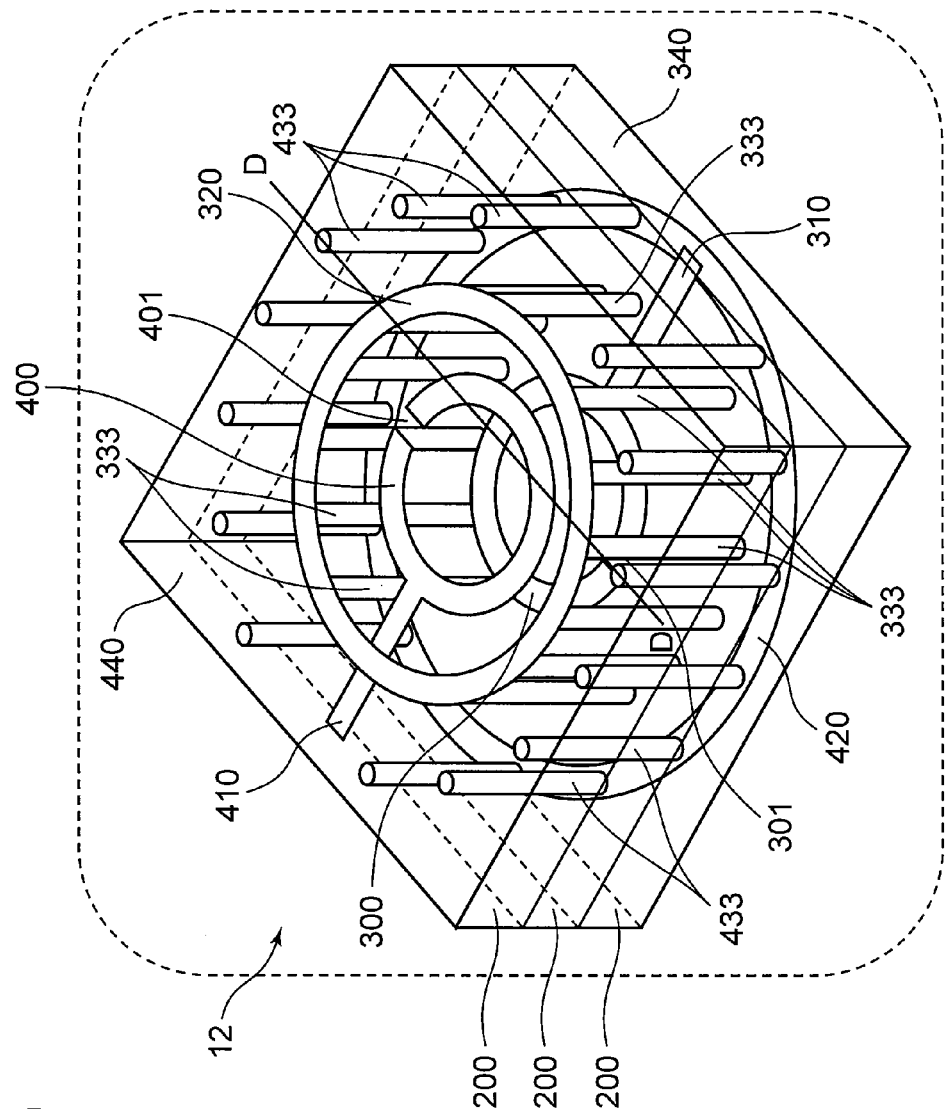
FIG. 10 is a perspective view illustrating the example of the configuration of the electromagnetic resonant coupler according to the second embodiment of the present invention.
Figure 11:
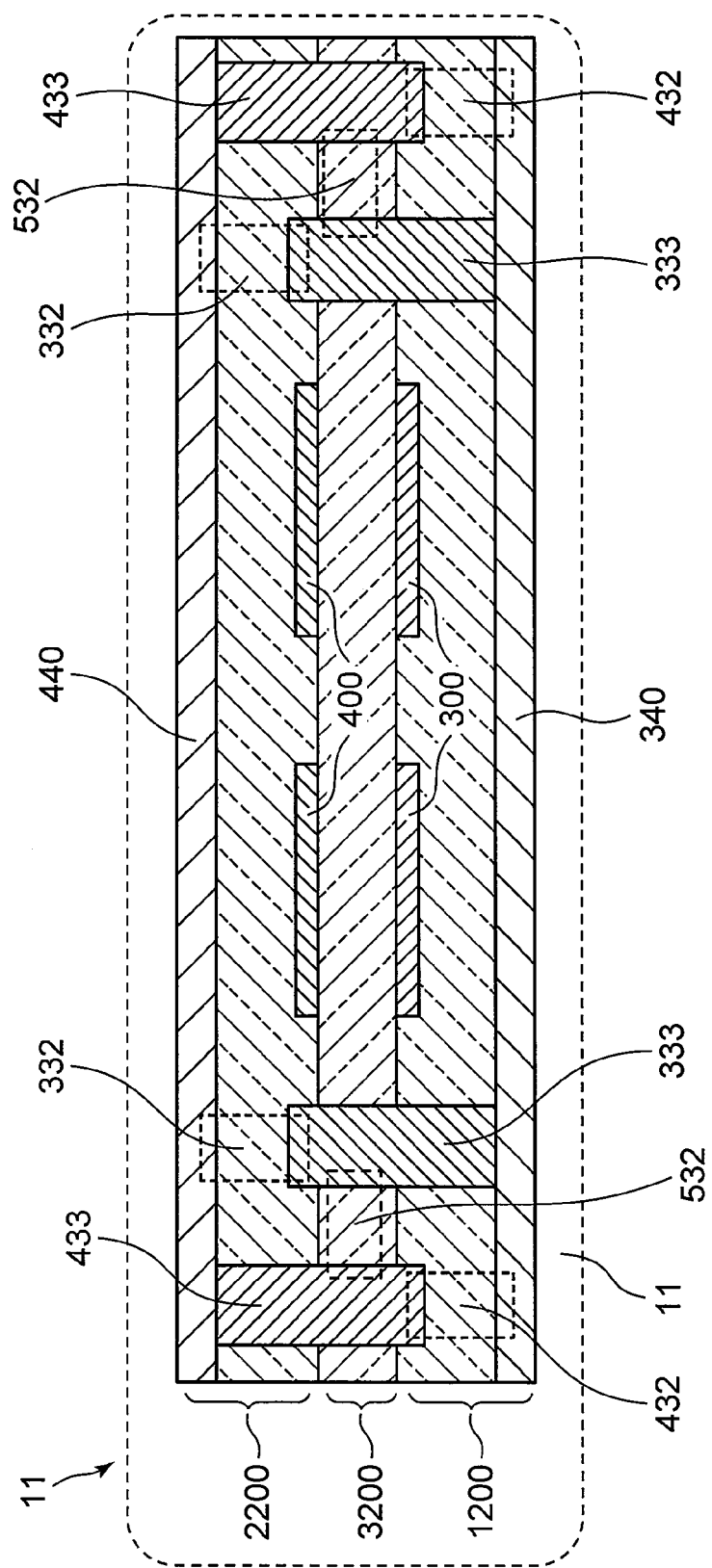
FIG. 11 is a sectional view illustrating the example of the configuration of the electromagnetic resonant coupler according to the second embodiment of the present invention.

As illustrated in FIG. 10, in place of the metal wall, the ground wires 320 and 420 and a plurality of vias 333 and 433 may be arranged. That is, after forming a plurality of through-holes, by filling metal conductors in the plurality of through-holes, the metal conductors may substitute the metal wall. FIG. 11 is a sectional view of the electromagnetic resonant coupler 10 in FIG. 10 obtained by cutting the electromagnetic resonant coupler 11 along a plane passing in a Y-axis direction of the substrates 1200, 3200, and 2200 (a plane passing through a line D-D' in FIG. 10, and perpendicular to the substrates 1200, 3200, and 2200.

An electromagnetic resonant coupler 12 includes the first resonator 300, the second resonator 400, the first input/output terminal 310, the second input/output terminal 410, the first ground shield 340, the second ground shield 440, a first ground wire 320, a second ground wire 420, a plurality of first metal conductors 333, and a plurality of second metal conductors 433.

The first resonator 300 is a ring-shaped transmission line formed by a metal wire, for example, copper, and has the opening part 301 at a part of an arbitrary position.

The second resonator 400 is a ring-shaped transmission line formed by a metal wire, for example, copper, and has the opening part 401 at a part of an arbitrary position. The second resonator 400 is formed on electrically-insulated two different planes separated by a fixed distance by the third dielectric substrate 3200, and is opposed in a longitudinal direction.

The first input/output terminal 310 is formed by a metal wire, for example, copper, that performs input and output of high-frequency signals to the first resonator 300. The first input/output terminal 310 is arranged at an arbitrary position of a ring-shaped transmission line of the first resonator 300.

Similarly, the second input/output terminal 410 is formed by a metal wire, for example, copper, that performs input and output of high-frequency signals to the second resonator 400. The second input/output terminal 410 is arranged at an arbitrary position of a ring-shaped transmission line of the first resonator 400.

In FIG. 10, although each shape of the first resonator 300 and the second resonator 400 is illustrated as a circular ring shape, a ring shape is sufficient like in the first embodiment of the present invention, and the shape may be other ring shape such as a square ring shape and an oval ring shape.

The first ground shield 340 is formed by a metal layer sufficiently larger than a layout area of the first resonator 300, on a plane different from a plane on which the first resonator 300 is arranged, across the first dielectric substrate 1200 arranged below the third dielectric substrate 3200. As an example, the first ground shield 340 is formed into a rectangular flat shape.

The second ground shield 440 is formed by a metal layer sufficiently larger than a layout area of the second resonator 400, on a plane different from a plane on which the second resonator 200 is arranged, across the second dielectric substrate 2200 arranged above the third dielectric substrate 3200. As an example, the second ground shield 440 is formed into a rectangular flat shape.

The first ground wire 320 is a transmission line formed by a metal wire, for example, copper, formed with a fixed gap from the first resonator 300 in a lateral direction (along an arrangement surface of the first resonator 300), the first ground wire 320 being arranged in a circular ring shape so as to surround an outer periphery of the first resonator 300, and formed inside the second dielectric substrate 2200.

The plurality of first metal conductors 333 are formed by a plurality of rod-shaped metal conductors, for example, copper, the rod-shaped metal conductors being erected from the first ground wire 320, piercing through the first dielectric substrate 1200 and the third dielectric substrate 3200 in a thickness direction, embedded up to a part of the second dielectric substrate 2200, electrically connected to the first ground wire 320, and arranged with a gap so as to surround an outer periphery of the first resonator 300. The first dielectric layer 332 is present between the first ground wire 320 and the second ground shield 440, and the first ground wire 320 and the second ground shield 440 are not electrically connected to each other (corresponding to the first dielectric layer 332 in the case of assuming that the first ground wire 320 is arranged in place of the first ground wall 330 in FIG. 9).

The second ground wire 420 is a transmission line formed by a metal wire, for example, copper, formed with a fixed gap from the second resonator 400 in a lateral direction (along an arrangement surface of the second resonator 400), located at a lateral-direction position different from the first ground wall 330, arranged in a circular ring shape so as to surround an outer periphery of the second resonator 400, and formed inside the first dielectric substrate 1200.

The plurality of second metal conductors 433 are formed by a plurality of rod-shaped metal conductors, for example, copper, the rod-shaped metal conductors being erected from the second ground wire 420, piercing through the second dielectric substrate 2200 and the third dielectric substrate 3200 in a thickness direction, embedded up to a part of the first dielectric substrate 1200, electrically connected to the second ground wire 420, and arranged by a plurality formed with a gap so as to surround an outer periphery of the second resonator 400. The second dielectric layer 432 is present between the second ground wire 420 and the first ground shield 340, and the second ground wire 420 and the first ground shield 340 are not electrically connected to each other (corresponding to the second dielectric layer 432 in the case of assuming that the second ground wire 420 is arranged in place of the second ground wall 430 in FIG. 9).

In this way, the first ground wall and the second ground wall can be formed by the rod-shaped first metal conductor 333 and second metal conductor 433 utilizing through-holes, i.e., amore facilitated manufacturing process.

In the case of the structure illustrated in FIG. 10, a dielectric layer is also present between the first metal conductor 333 and the second metal conductor 433 (a dielectric layer at a position corresponding to the third dielectric layer 532 between the first ground wall 330 and the second ground wall 430 in FIG. 9). In the dielectric layer, as described in the first embodiment of the present invention, there is also an effect equivalent to that of the above ground wall, when the gap is sufficiently small as compared with the effective wavelength.

As described above, by using the structure of the second embodiment of the present invention, there can be obtained various effects of the first embodiment that a transmission device including an electromagnetic resonant coupler, a transmission circuit, and a receiver circuit can be easily manufactured. Further, a lateral-direction electromagnetic field shielding effect can be improved.

(Third Embodiment)

In the first and second embodiments of the present invention, there are described the electromagnetic resonant coupler 10, 11, and 12 having structures of arranging shields in the lateral direction in order to suppress electromagnetic field noise. On the other hand, in a power transmission device including an electromagnetic resonant coupler according to a third embodiment of the present invention, functional circuit elements are installed on upper parts of the electromagnetic resonant couplers 10, 11, and 12 according to the first or second embodiment so that the functional circuit elements are integrated as a power transmission device.

Hereinafter, a case of applying the electromagnetic resonant coupler 10 according to the first embodiment of the present invention to a power transmission device 50 will be described as a representative example with reference to drawings.

Figure 12:
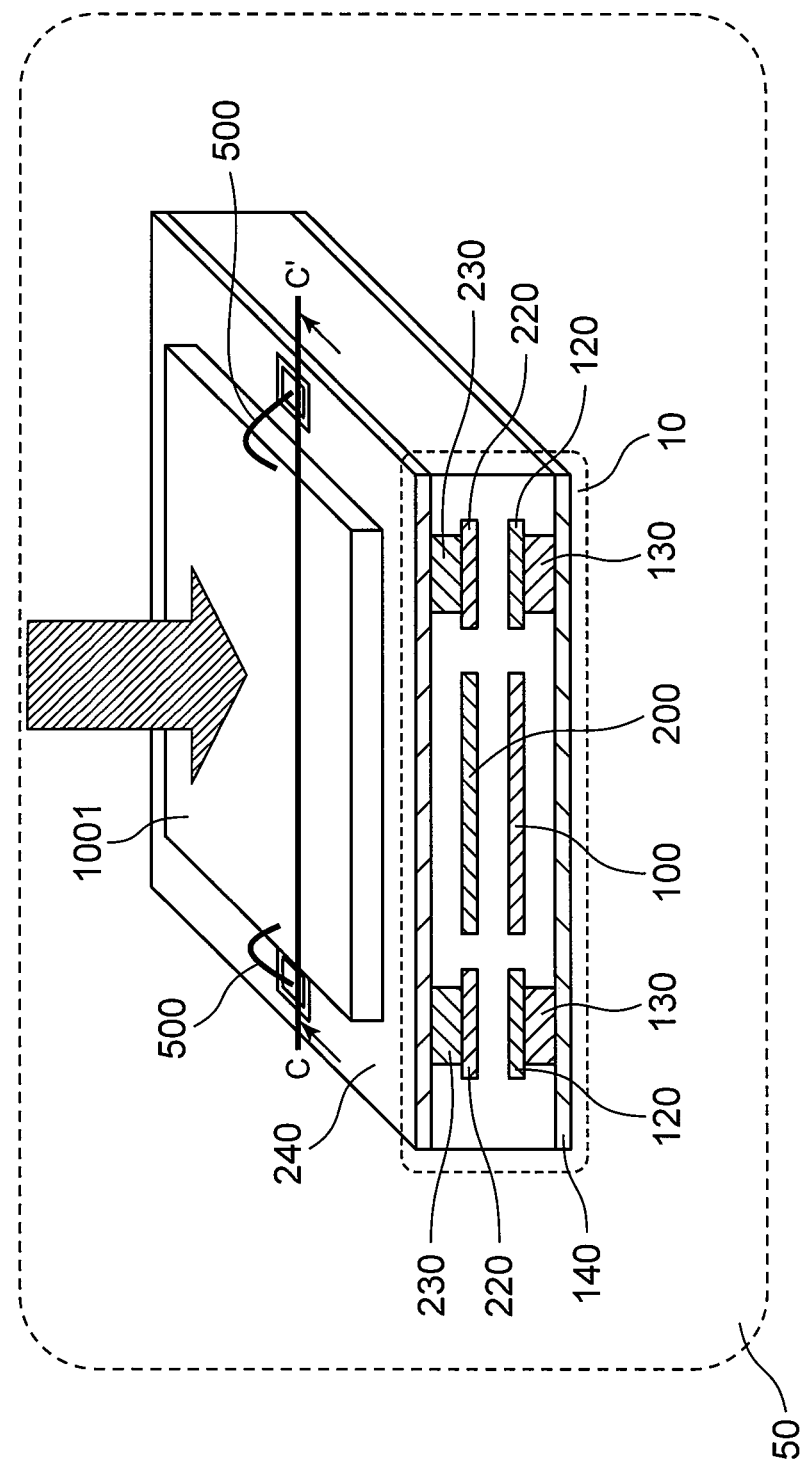
FIG. 12 is a perspective view illustrating an example of a configuration of an integrated high-frequency transmission device according to a third embodiment of the present invention.

FIG. 12 is an example of a perspective view of the power transmission device 50 as an example of a high-frequency transmission device according to the third embodiment of the present invention.

Figure 13:
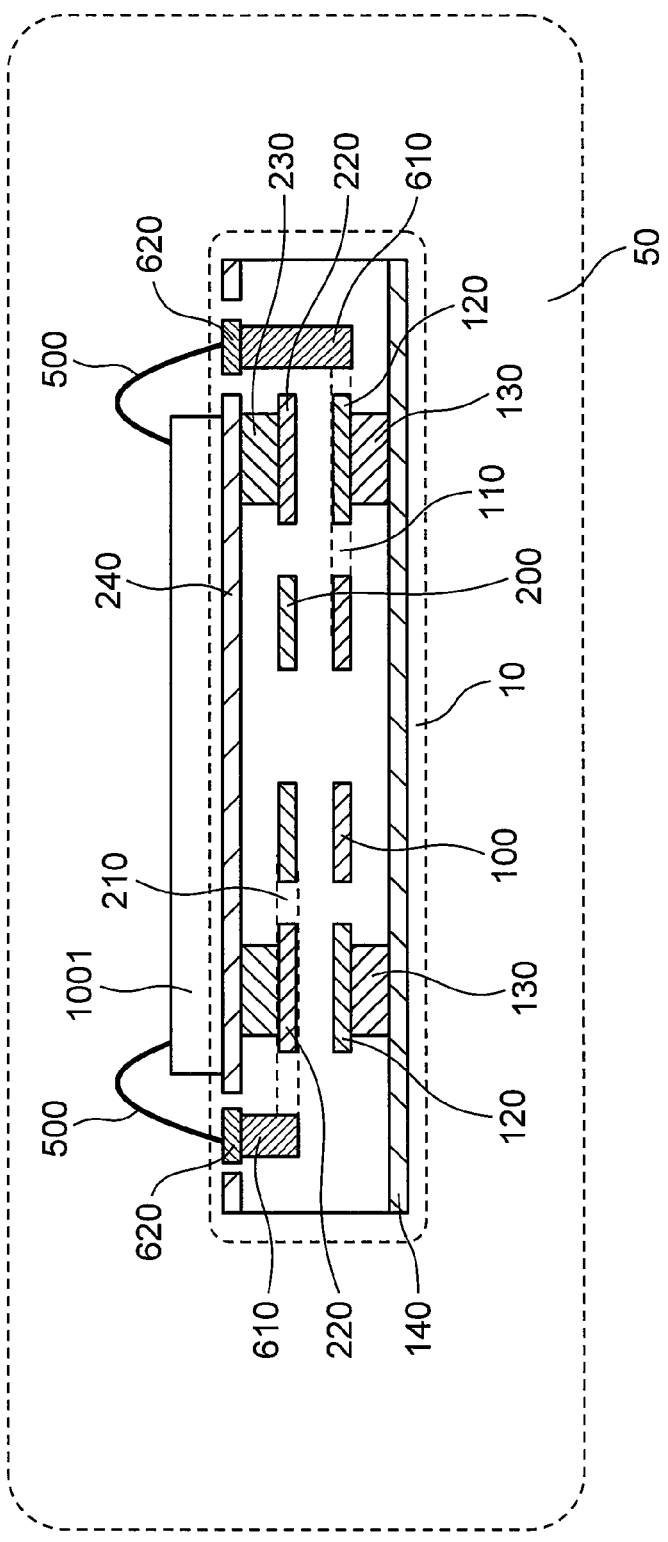
FIG. 13 is a sectional view illustrating the example of the configuration of the integrated high-frequency transmission device according to the third embodiment of the present invention.
Figure 14:
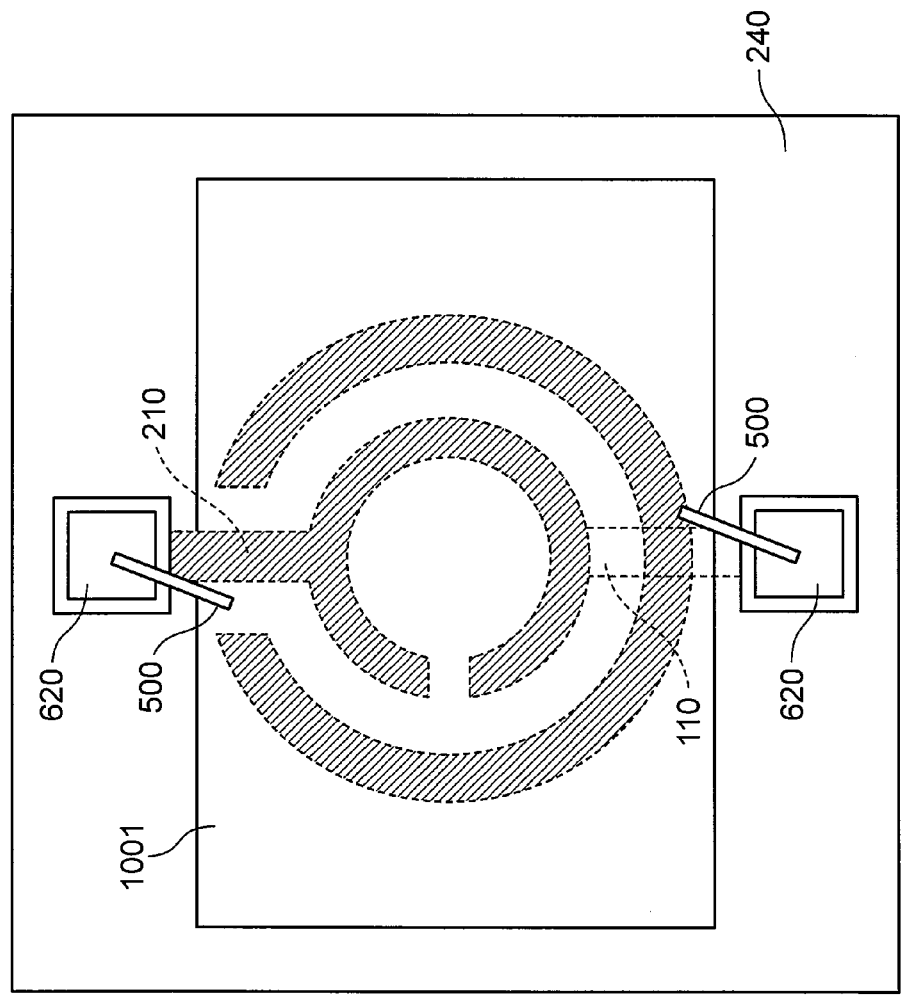
FIG. 14 is a top view illustrating the example of the configuration of the integrated high-frequency transmission device according to the third embodiment of the present invention.

FIG. 13 is a sectional view of the power transmission device 50 in FIG. 12 obtained by cutting the power transmission device 50 along a plane passing in a Y-axis direction (a plane passing through a line C-C' in FIG. 12, and perpendicular to the dielectric substrates 1000, 2000, and 3000). To facilitate understanding of a portion other than a substrate, hatching of a substrate portion is omitted. FIG. 14 is a plan view of the power transmission device 50 in FIG. 12 observed from an upper surface of an arrow. To facilitate understanding of a resonator, hatching is provided.

A functional circuit chip 1001 in the third embodiment of the present invention illustrated in FIG. 12 is what is called a semiconductor IC having a function of transmitting and receiving high-frequency signals. The power transmission device 50 has the functional circuit chip 1001 installed on a second ground shield 240 of the electromagnetic resonant coupler 10 in the first embodiment of the present invention. The first and second input/output terminals 110 and 120 are electrically connected to input/output pads 620 formed by piercing through the second ground shield 240 via through-holes 610. The second ground shield 240 and the input/output pads 620 are not electrically connected to each other. A high-frequency signal output unit of the functional circuit chip 1001 and the input/output pads 620 are electrically connected to each other by metal wires 500, for example.

In the case of integrating the functional circuit chip 1001 and the electromagnetic resonant coupler 10 as the power transmission device 50, for the purpose of low cost and miniaturization, there is a demand for producing the functional circuit chip 1001 and the electromagnetic resonant coupler 10 in the same size as far as possible. For example, in the case of installing the functional circuit chip 1001 on an upper part of the electromagnetic resonant coupler 10, when a size of the second ground shield 240 is exceedingly large as compared with the functional circuit chip 1001, radiation of electromagnetic fields from the functional circuit chip 1001 does not enter the first resonator 100 and the second resonator 200.

However, in actual practice, for reducing a manufacturing cost and the like, it is preferable to produce the electromagnetic resonant coupler 10 having the ground shield 240, in the same size as that of the functional circuit chip 1001 as far as possible. For example, consider a case where the functional circuit chip 1001 is installed on the electromagnetic resonant coupler 10 having the ground shield 240 with substantially the same size like in the third embodiment of the present invention illustrated in FIG. 12. An electric field distribution of high-frequency noise when it is assumed that high-frequency noise of 1 W is generated from the upper surface of the functional circuit chip 1001, for example, is illustrated in (1) of FIG. 15. White portions A1 and shaded portions A2 near a center in FIG. 15 are portions where an electric field is high, that is, high-frequency noise is strong.

Figure 15:
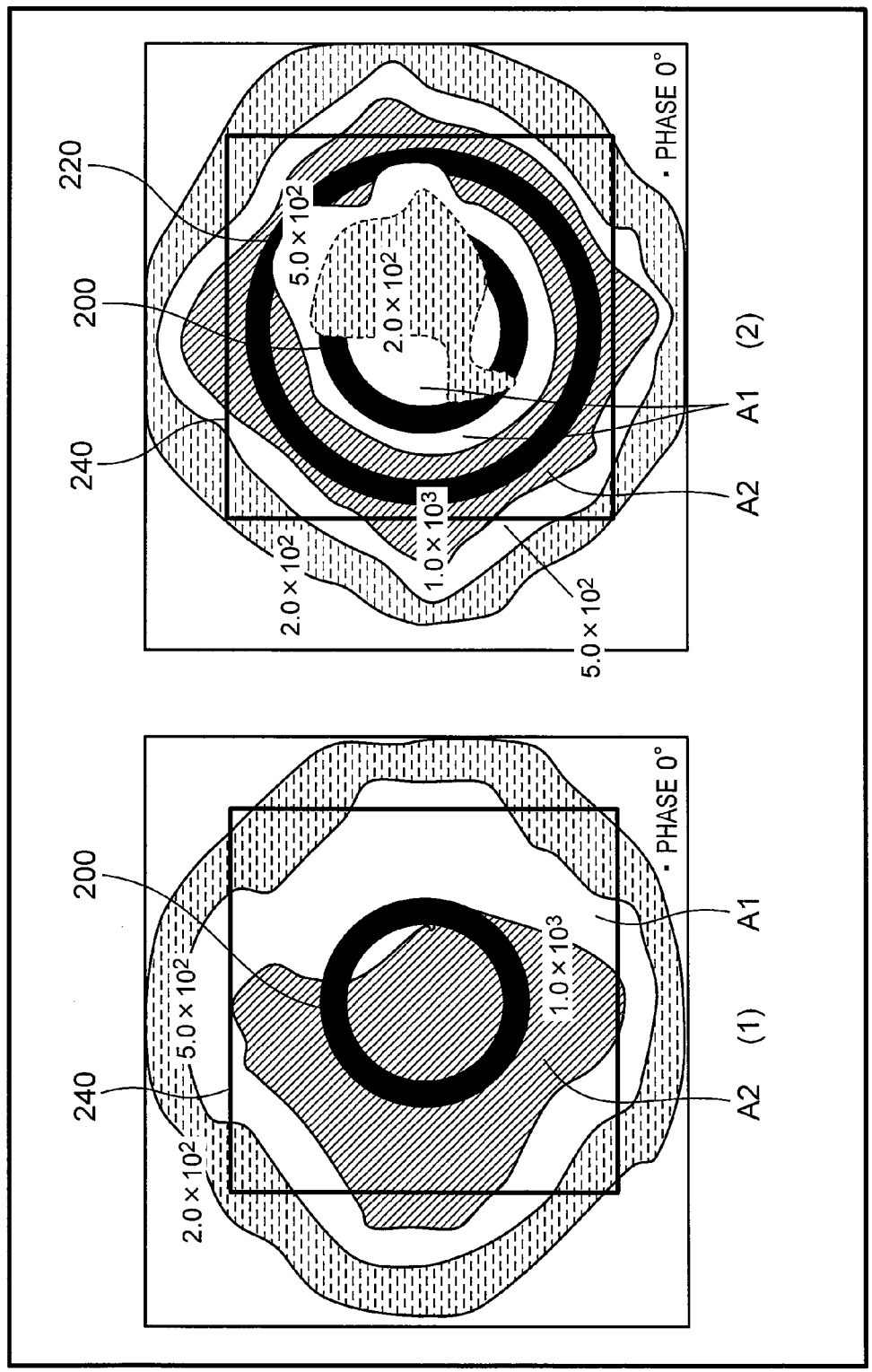
FIG. 15 is an electric field distribution diagram illustrating an example of an effect of the integrated high-frequency transmission device according to the third embodiment of the present invention.

As illustrated in (1) of FIG. 15, it is understood that a relatively strong electric field is distributed on the second resonator 200, and radiation of high-frequency noise from a lateral direction of the functional circuit chip 1001 cannot be shielded by only the second ground shield 240.

Therefore, consider a case of using the electromagnetic resonant coupler 10 that reduces lateral-direction high-frequency noise as described in the first embodiment and the second embodiment of the present invention. An electric field distribution of high-frequency noise in the same condition as the above assumption is illustrated in (2) of FIG. 15. An electric field is strong in a portion of the second ground wire 220, and an electric field distribution is relatively small near the second resonator 200. That is, high-frequency noise from the functional circuit chip 1001 can be suppressed.

Figure 16:
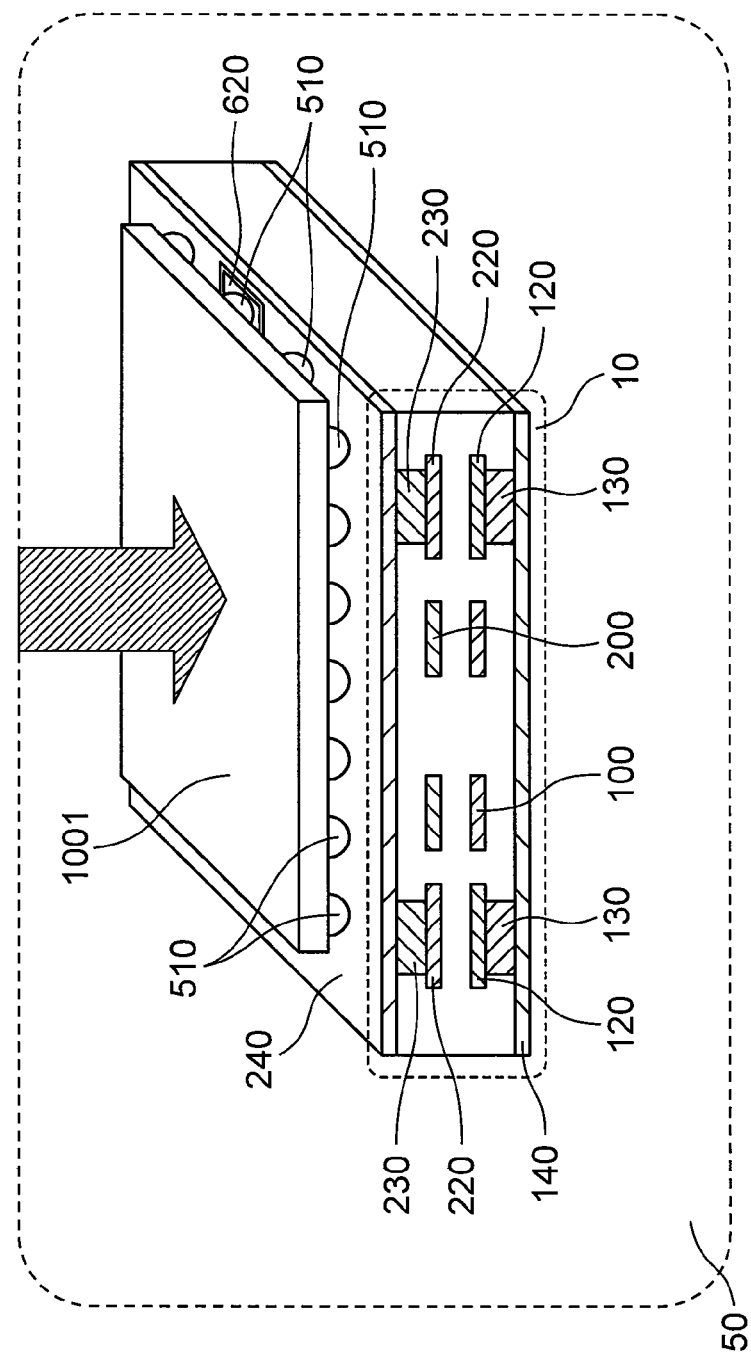
FIG. 16 is a perspective view illustrating an example of a configuration of the integrated high-frequency transmission device according to the third embodiment of the present invention.
Figure 17:
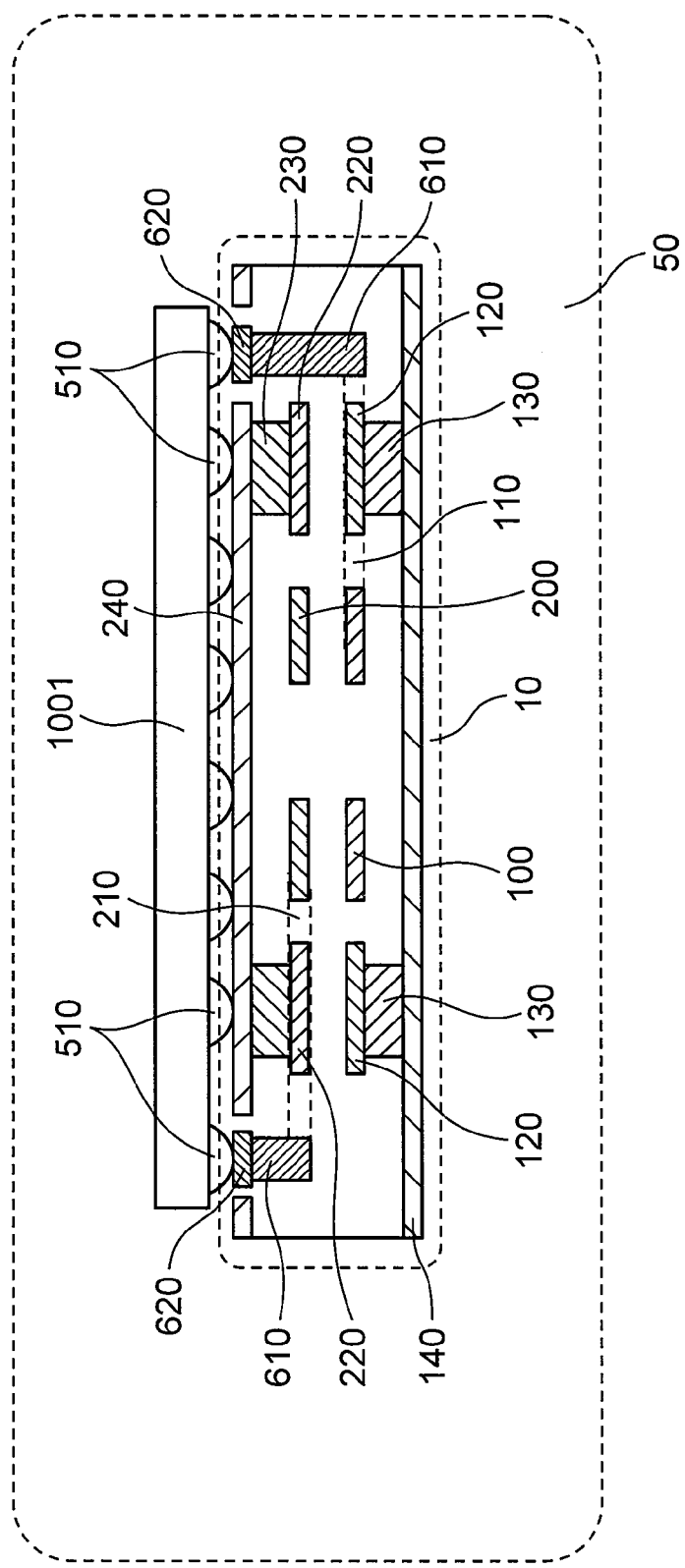
FIG. 17 is a sectional view illustrating the example of the configuration of the integrated high-frequency transmission device according to the third embodiment of the present invention.
Figure 18:
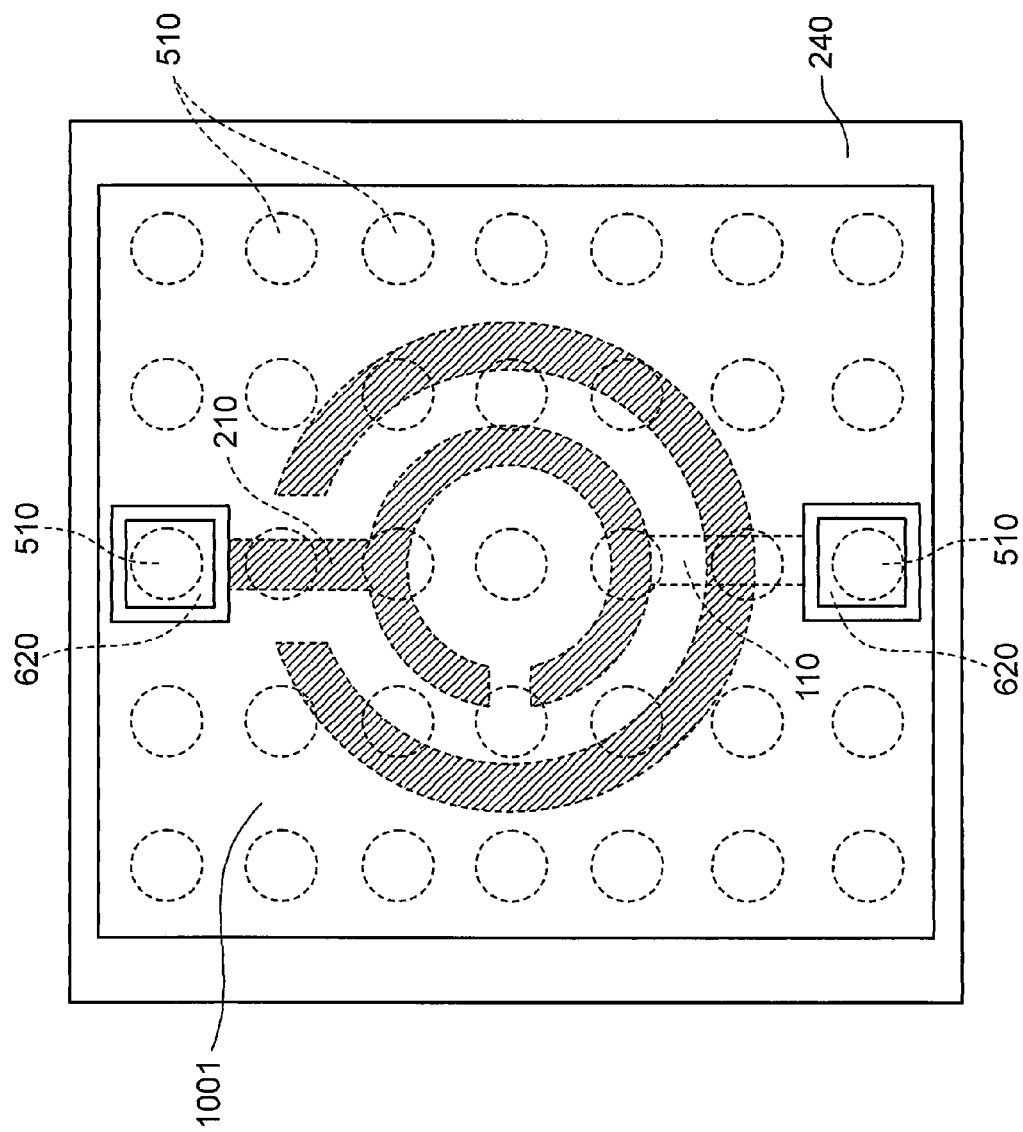
FIG. 18 is a top view illustrating the example of the configuration of the integrated high-frequency transmission device according to the third embodiment of the present invention.

The functional circuit chip 1001 may be electrically connected to the input/output pads 620 and the like of the dielectric substrate of the electromagnetic resonant coupler 10 by a method other than bonding of the metal wires 500. For example, as illustrated in the perspective view of FIG. 16, the sectional view of FIG. 17, and the plan view of FIG. 18, it is also possible to generate BGAs (Ball Grid Arrays) 510 including a large number of solder balls, perform flip-chip installing, on the functional circuit chip 1001, and electrically connect the BGA to the electromagnetic resonant coupler 10. In FIG. 16 and FIG. 17, to facilitate understanding of portions other than the substrate, hatching of the substrate portion is omitted. In FIG. 18, to facilitate understanding of a resonator, hatching is provided.

Figure 19:
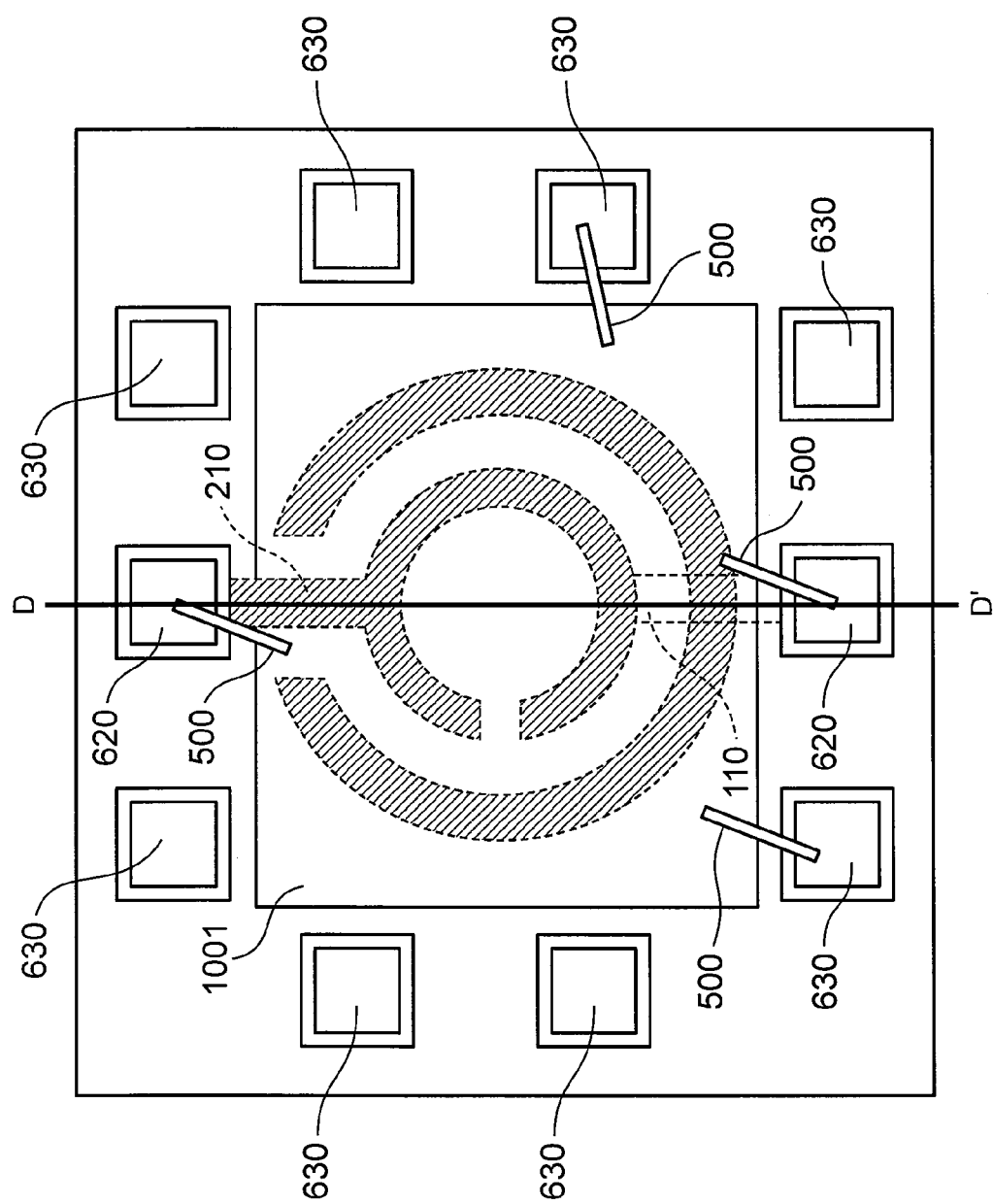
FIG. 19 is a top view illustrating an example of the configuration of the integrated high-frequency transmission device according to the third embodiment of the present invention.
Figure 20:
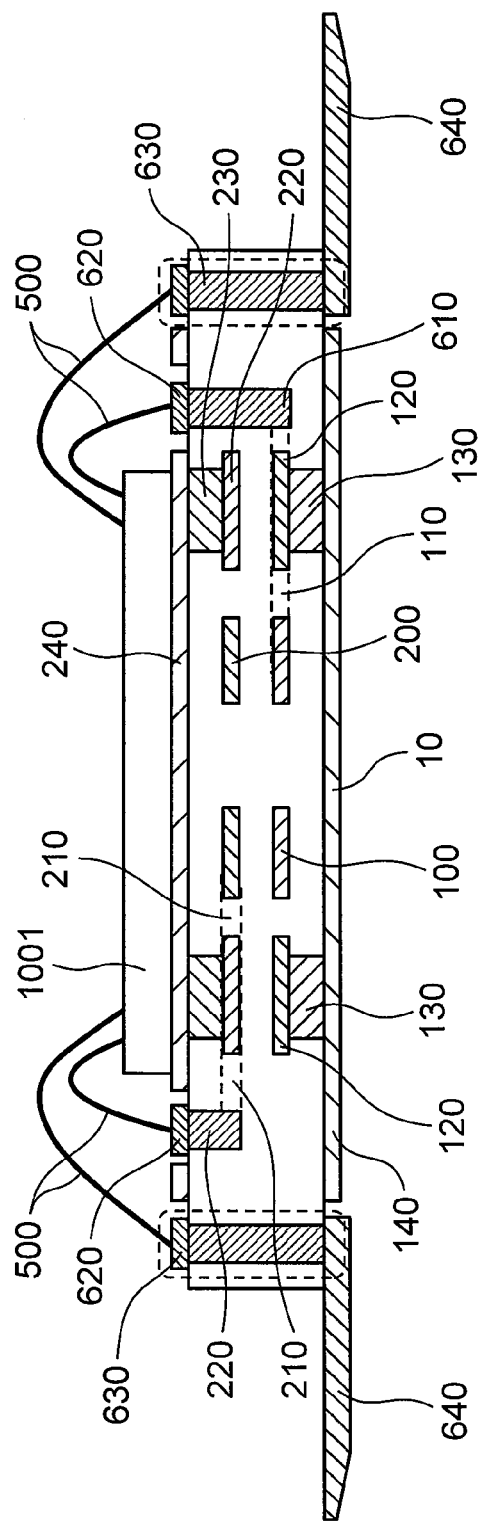
FIG. 20 is a sectional view illustrating an example of the configuration of the integrated high-frequency transmission device according to the third embodiment of the present invention.
Figure 21:
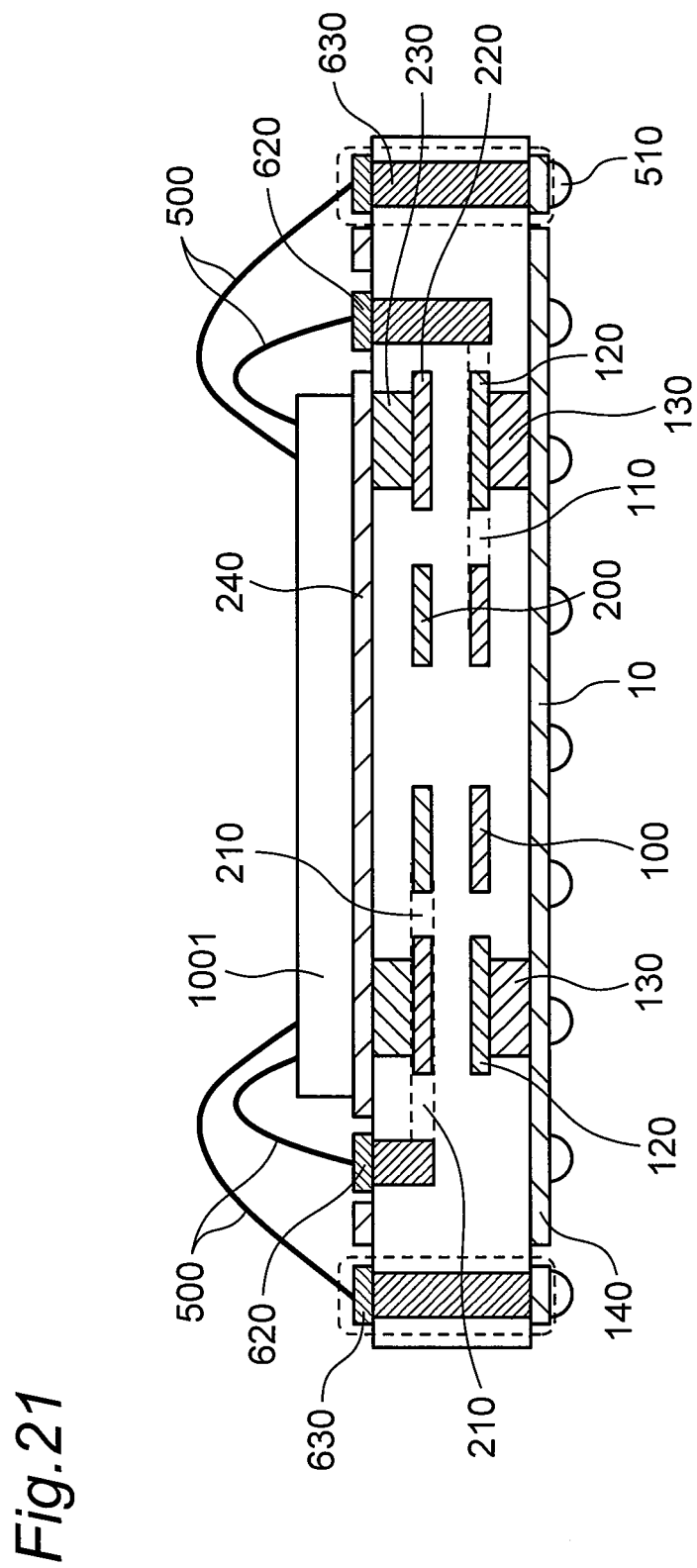
FIG. 21 is a sectional view illustrating an example of the configuration of the integrated high-frequency transmission device according to the third embodiment of the present invention.

Furthermore, terminals 630 from the functional circuit chip 1001 to an external element may be also arranged on an outer side of the first and second ground wires 120 and 220. A plan view is illustrated in FIG. 19, and a sectional view along D-D' is illustrated in FIG. 20. In FIG. 19, to facilitate understanding of a resonator, hatching is provided. The ground wires 120 and 220 are necessary to have a gap in a longitudinal direction because the ground wires 120 and 220 functionally need to have insulation in the electromagnetic resonant coupler 10. However, the terminals 630 are electrically independent of the electromagnetic resonant coupler 10, and thereby can be arranged while piercing the dielectric substrates 1000, 2000, and 3000. Therefore, by arranging a plurality of the terminals 630 formed with gaps on outer sides of the ground wires 120 and 220, even a slight magnetic field leaked from a space in a lateral direction of the ground wires 120 and 220 can be shielded, and the shielding function can be further enhanced. In addition to the enhancement of the shielding function, electrical connection between the chip and other elements can be also facilitated. To take out the terminals 630, the terminals 630 can be electrically connected to lead terminals 640, as illustrated in FIG. 20, for example. In FIG. 20, to facilitate understanding of portions other than the substrate, hatching of the substrate portion is omitted. Because a relatively large distance between the terminals 630 and other elements can be taken by taking out the lead terminals 640, a creeping distance can be secured, and a dielectric voltage can be improved. Further, as illustrated in FIG. 21, the taking out may be performed by the BGAs 510. By this configuration, a size of the device itself can be reduced. In FIG. 21, to facilitate understanding of portions other than the substrate, hatching of the substrate portion is also omitted.

A structure to be added after the above structure may be any structure. Naturally, there is no problem in sealing in a package such as a resin or metal.

Figure 22:
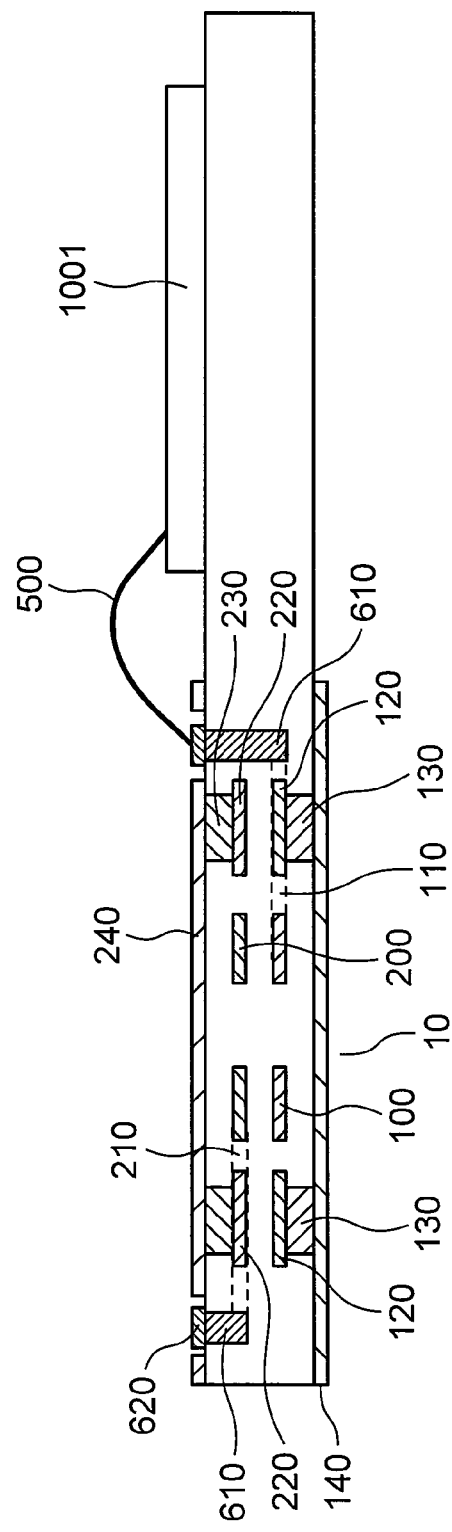
FIG. 22 is a sectional view illustrating an example of the configuration of the integrated high-frequency transmission device according to the third embodiment of the present invention.

Further, although an integrated single IC chip is illustrated as the functional circuit chip 1001 in the drawings, a separate chip may be installed by being divided into a plurality of pieces for each function of an oscillator or an amplifier as a high-frequency transmission unit, or a rectifier as a high-frequency receiving unit. In the drawings of the present application, although the functional circuit chip 1001 is arranged on the upper surface of the electromagnetic resonant coupler 10 as a single chip, because noise in the lateral direction can be prevented by the ground wires 120 and 220, the functional circuit chip 1001 can be also arranged in the lateral direction of the electromagnetic resonant coupler 10 as illustrated in FIG. 22. In FIG. 22, to facilitate understanding of portions other than the substrate, hatching of the substrate portion is also omitted.

In the third embodiment of the present invention, as an example, a PPE resin obtained by filling at a high filling rate high dielectric constant-use fillers is used as the first to third dielectric substrates 1000 to 3000. It is naturally possible to use other material based on frequency, size, transmission loss, or dielectric strength voltage or the like required for the electromagnetic resonant coupler 10. As other material, materials generally used in a printed substrate are all usable, such as a glass epoxy substrate of FR4 (Flame Retardant Type 4), a paper phenol substrate, a paper epoxy substrate, a glass composite substrate, or a ceramic substrate, a polyphenylene ether resin substrate, a Teflon (a registered trade name) substrate, for example. That is, the electromagnetic resonant couplers 10, 11, and 12 can be formed on a printed substrate having a dielectric substrate of a plurality of layers. In this way, by using a material generally used for a printed substrate, an optimum substrate material can be selected according to a specification of a system of incorporating the electromagnetic resonant couplers 10, 11, and 12, and entire optimization including a wire and the like in the system can be performed.

Further, when the electromagnetic resonant couplers 10, 11, and 12 are formed in a printed substrate having a dielectric substrate of a plurality of layers, a composite material formed by dispersing particles composed of a first material in a second material may be included.

Accordingly, by changing a kind or a combination ratio of a first material in a material of a second dielectric substrate that becomes a main component, a dielectric constant or insulation electric field breakdown strength can be freely set. Further, in the third embodiment, in a similar manner to that of the first and second embodiments, there can be obtained various effects that a transmission device including an electromagnetic resonant coupler, a transmission circuit, and a receiver circuit can be easily manufactured.

(Fourth Embodiment)

Hereinafter, a fourth embodiment of the present invention will be described with reference to drawings.

Figure 23A:
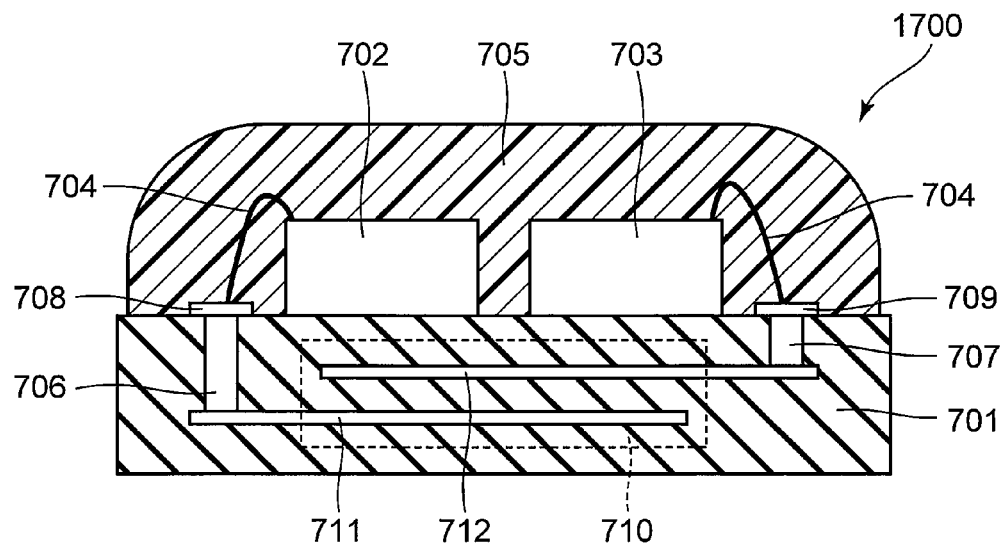
FIG. 23A is a sectional view illustrating an example of a configuration of a high-frequency transmission device according to a fourth embodiment of the present invention.
Figure 23B:
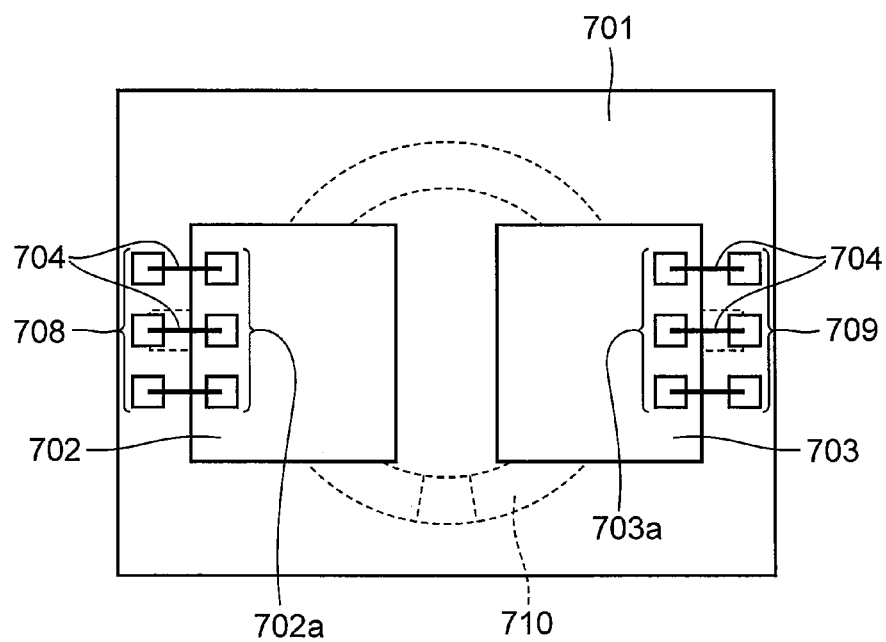
FIG. 23B is a plan view illustrating the example of the configuration of the high-frequency transmission device according to the fourth embodiment of the present invention.

FIG. 23A is an example of a sectional view of a high-frequency transmission device according to the fourth embodiment of the present invention. FIG. 23B is an example of a plan view of the high-frequency transmission device according to the fourth embodiment.

A high-frequency transmission device 1700 according to the fourth embodiment of the present invention includes a substrate 701, an electromagnetic resonant coupler 710 incorporated in the substrate 701, a transmission circuit 702, a receiver circuit 703, and a sealing material 705.

The electromagnetic resonant coupler 710 incorporated in the substrate 701 includes a first resonator 711, a second resonator 712 arranged above the first resonator 711, a first input/output terminal 708 arranged on an upper surface of the substrate 701, a second input/output terminal 709 arranged on the upper surface of the substrate 701, first vias 706 incorporated in the substrate 701, and second vias 707 incorporated in the substrate 701.

The first via 706 electrically connects the first resonator 711 to the first input/output terminal 708. The second via 707 electrically connects the second resonator 712 to the second input/output terminal 709.

The transmission circuit 702 and the receiver circuit 703 are arranged on the upper surface of the substrate 701 (a main surface), and the transmission circuit 702 and the first input/output terminal 708 are electrically connected by metal wires 704. The receiver circuit 703 and the second input/output terminal 709 are electrically connected by the metal wires 704.

FIG. 23B is a plan view of a state that the transmission circuit 702 and the receiver circuit 703 are opposed to a connection direction by the metal wires 704 to the input/output terminals 708 and 709 of the electromagnetic resonant coupler 710 (a lateral direction or a longitudinal direction of the substrate 701 in FIG. 23B), as an example of a high-frequency transmission device according to the fourth embodiment. In FIG. 23B, 702a and 703a are pads for connecting to the metal wires 704. Further, three first input/output terminals 708, three second input/output terminals 709, three connection pads 702a and 703a may be ground-signal-ground (G-S-G) pads.

With such a configuration, electrical connection becomes possible without degrading characteristics of high-frequency signals. Naturally, the first input/output terminal 708, the second input/output terminal 709, and the connection pads 702*a* and 703*a* may be normal pads. Further, in the fourth embodiment, in a similar manner to that of the first and second embodiments, there can be obtained various effects that a transmission device including an electromagnetic resonant coupler, a transmission circuit, and a receiver circuit can be easily manufactured. Further, in subsequent embodiments, in the case of having configurations similar to those of the first to fourth embodiments, working effects based on the respective configurations can be also obtained.

Figure 23C:
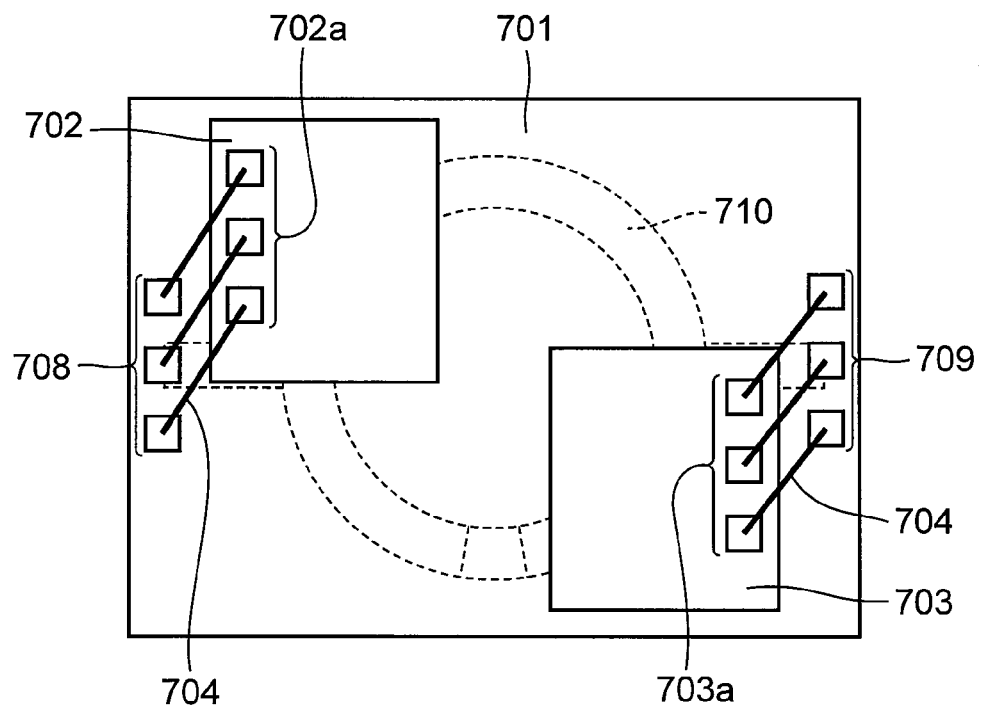
FIG. 23C is a plan view illustrating an example of the configuration of the high-frequency transmission device according to the fourth embodiment of the present invention.

An arrangement example of the transmission circuit 702 and the receiver circuit 703 is not limited to this. For example, as illustrated in FIG. 23C, the transmission circuit 702 and the receiver circuit 703 may be arranged to oppose each other in a direction oblique in a direction of connecting the transmission circuit 702 and the receiver circuit 703 by the metal wires 704 (a lateral direction or a longitudinal direction of the substrate 701 in FIG. 23B).

With such a configuration, because a distance between the transmission circuit and the receiver circuit becomes long, an effect that each circuit becomes difficult to receive an influence of heat and electromagnetic noise can be obtained.

Figure 23D:
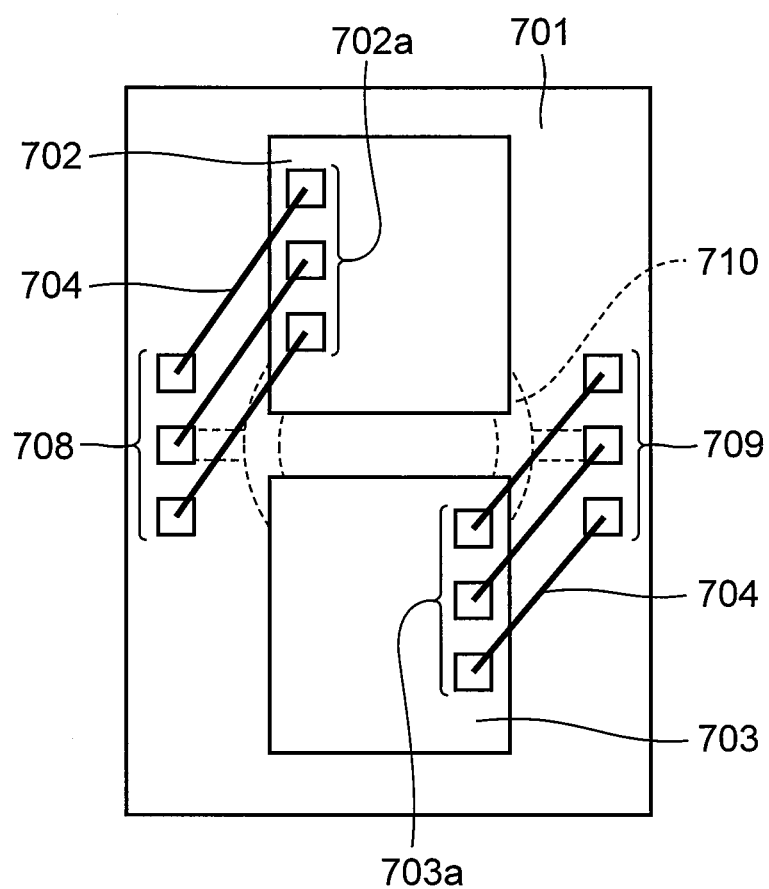
FIG. 23D is a plan view illustrating an example of the configuration of the high-frequency transmission device according to the fourth embodiment of the present invention.

Further, as illustrated in FIG. 23D, the transmission circuit 702 and the receiver circuit 703 may be arranged to oppose each other in a direction crossing the direction of connecting the transmission circuit 702 and the receiver circuit 703 by the metal wires 704 (a lateral direction or a longitudinal direction of the substrate 701 in FIG. 23B), for example, an orthogonal direction.

With such a configuration, a size in the lateral direction can be reduced, and an effect that a module can be miniaturized can be obtained.

Figure 23E:
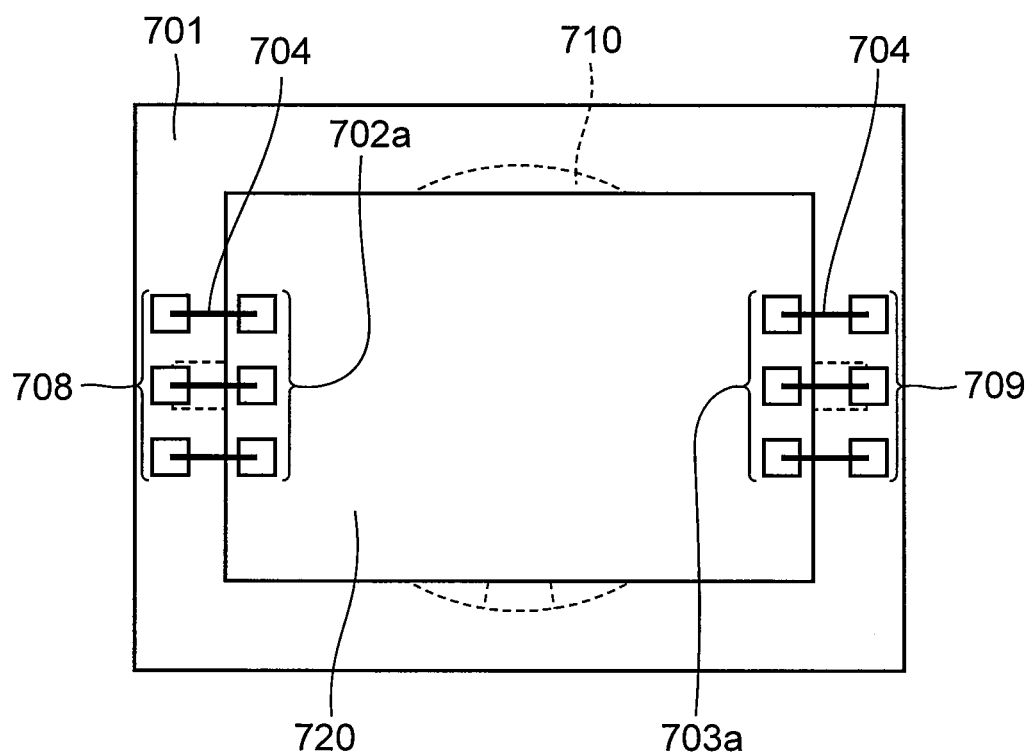
FIG. 23E is a plan view illustrating an example of the configuration of the high-frequency transmission device according to the fourth embodiment of the present invention.

Further, as illustrated in FIG. 23E, the transmission circuit 702 and the receiver circuit 703 are integrated into a transmission/receiver circuit 720 including one chip, and the transmission/receiver circuit 720 may be arranged on the upper surface of the substrate 701 (the main surface) above the electromagnetic resonant coupler 710, in a similar manner to that in the third embodiment. In the present example, in FIG. 23A, the transmission circuit 702 and the receiver circuit 703 become in a state of being replaced with one transmission/receiver circuit 720.

With such a configuration, because the number of chips arranged on the substrate 701 is reduced, an effect that mounting such as a die bond is easily facilitated can be obtained.

Figure 23F:
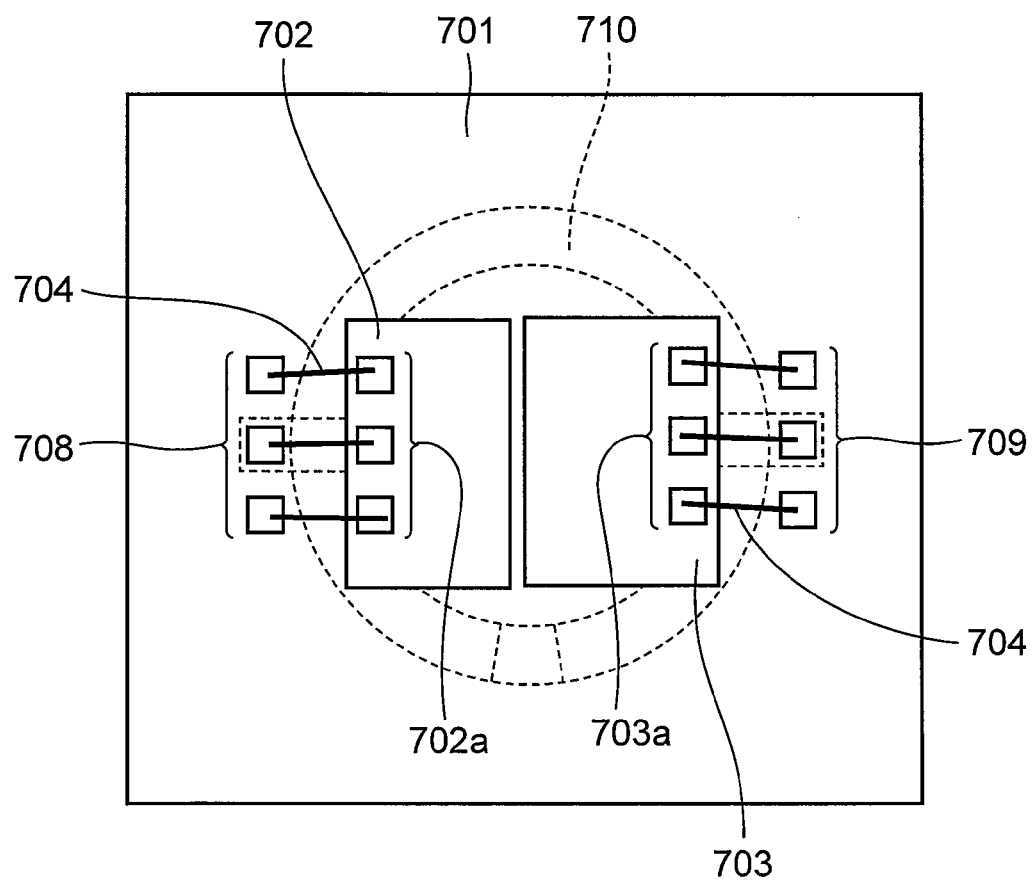
FIG. 23F is a plan view illustrating an example of the configuration of the high-frequency transmission device according to the fourth embodiment of the present invention.

Further, as illustrated in FIG. 23F, the transmission circuit 702 and the receiver circuit 703 may be arranged to be completely accommodated in a region above the electromagnetic resonant coupler 710.

With such a configuration, because a surplus space of the substrate 701 can be omitted, an effect that a module can be miniaturized can be obtained.

Figure 23G:
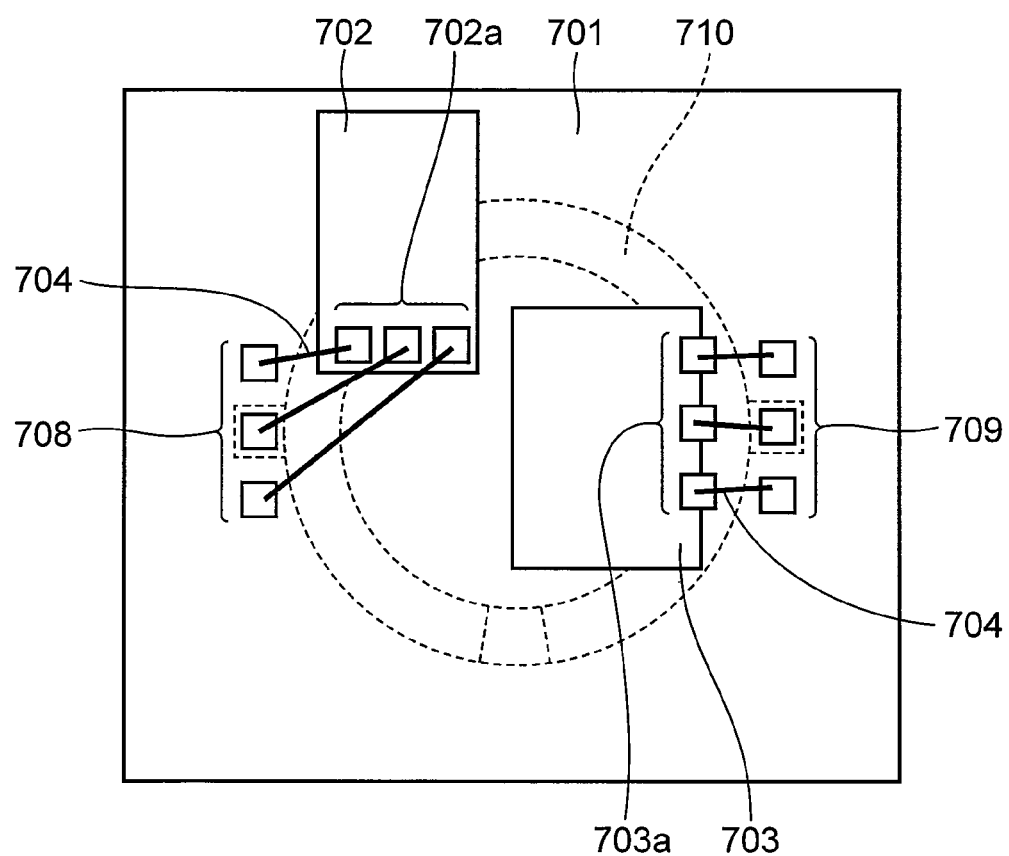
FIG. 23G is a plan view illustrating an example of the configuration of the high-frequency transmission device according to the fourth embodiment of the present invention.

Further, as illustrated in FIG. 23G, the receiver circuit 703 may be arranged to be completely accommodated in a region above the electromagnetic resonant coupler 710, and the transmission circuit 702 may be arranged to partially protrude from the region above the electromagnetic resonant coupler 710.

With such a configuration, because a distance between the transmission circuit and the receiver circuit becomes longer, an effect that each circuit becomes difficult to receive an influence of heat and electromagnetic noise can be obtained.

Further, in FIG. 23A to FIG. 23G, it is preferable that the first input/output terminal 708, the transmission circuit input/output terminal 702*a* and the second input/output terminal 709, and the receiver circuit input/output terminal 703*a* are arranged such that the respective wires 704 are shortened as far as possible.

The electromagnetic resonant coupler 710 will be described in detail with reference to FIG. 24.

The first resonator 711 as an example of the first resonant wire is a ring-shaped transmission line formed by a metal wire, for example, copper, and has an opening part 711*a* at a part of an arbitrary position.

The second resonator 712 as an example of the second resonant wire is a ring-shaped transmission line formed by a metal wire, for example, copper, and has an opening part 712*a* at a part of an arbitrary position.

The first resonator 711 and the second resonator 712 are formed inside the substrate 701. The first resonator 711 and the second resonator 712 are formed while opposing to each other on mutually different planes inside the substrate 701, are away from each other with a fixed distance, and are electrically insulated. The first resonator 711 and the second resonator 712 are each obtained by bending in a ring shape what is called a high-frequency antenna structure. Line lengths of the first resonator 711 and the second resonator 712 are lengths in which the resonators resonate at a desired frequency. That is, as an example, each line length is ½ of an effective wavelength of a desired frequency.

Figure 24:
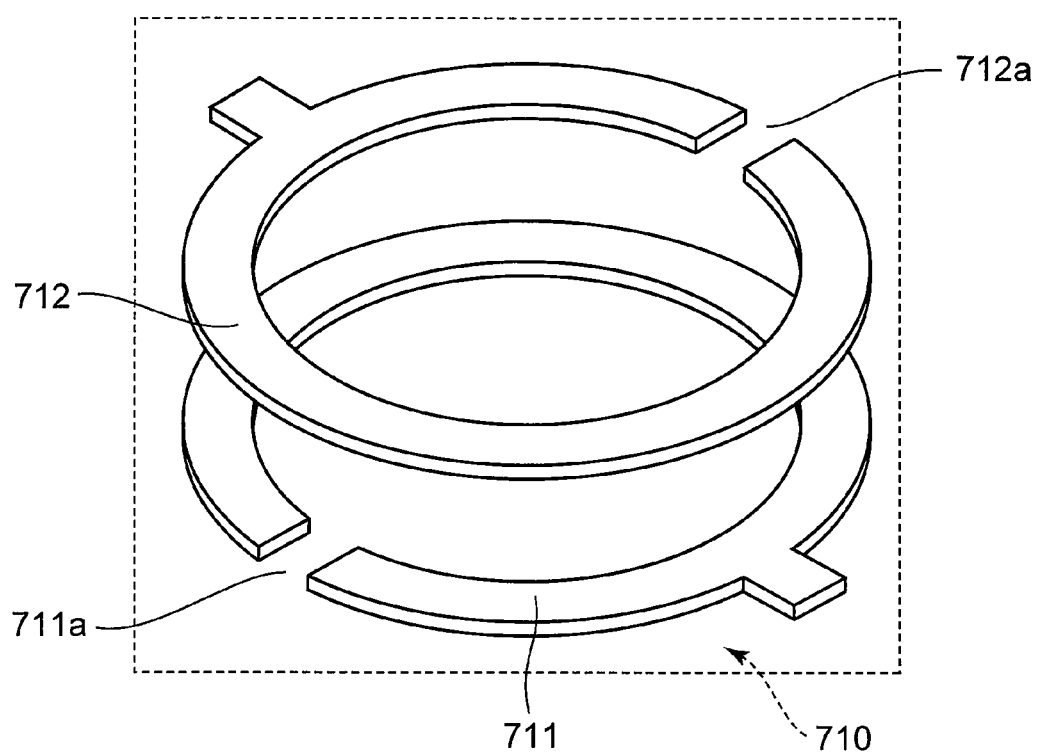
FIG. 24 is a perspective view illustrating an example of a configuration of an electromagnetic resonant coupler according to a fourth embodiment of the present invention.

In FIG. 24, although the first resonator 711 and the second resonator 712 each have a ring shape, each resonator may be in a frame-shaped or ring-shaped configuration using a transmission line in a rectangular frame shape or a helical shape and having an opening portion at a part of the resonator.

When transmission lines are formed on different planes while opposing to each other and a line length is a ½ wavelength of the effective wavelength, a resonance phenomenon occurs at a desired frequency. That is, even when a transmission line is not in a frame shape or a ring shape, although transmission efficiency of a signal decreases, a similar effect can be realized.

As an example, the first resonator 711 and the second resonator 712 use a copper foil having a thickness of 35 μm as a metal foil, and a polyphenylene ether resin (a PPE resin) obtained by filling at a high filling rate high dielectric constant-use fillers as a material of the substrate 701. The PPE resin has a dielectric constant of 10, and insulation electric field breakdown strength of 20 kV/mm. By using a material having such a high dielectric constant, the effective wavelength of the resonator can be shortened, and the electromagnetic resonant coupler 710 can be miniaturized.

In the fourth embodiment of the present invention, as an example, the PPE resin obtained by filling at the high filling rate the high dielectric constant-use fillers is used as a material of the substrate 701. It is naturally possible to use other material based on frequency, size, transmission loss, or dielectric strength voltage or the like required for the electromagnetic resonant coupler 710. As other material, materials generally used in a printed substrate are all usable, such as a glass epoxy substrate of FR4 (Flame Retardant Type 4), a paper phenol substrate, a paper epoxy substrate, a glass composite substrate, or a ceramic substrate, a polyphenylene ether resin substrate, a Teflon (a registered trade name) substrate, for example. That is, the electromagnetic resonant coupler 710 can be formed on a printed substrate having a dielectric substrate of a plurality of layers.

In this way, by using a material generally used for a printed substrate, an optimum substrate material can be selected according to a specification of a system of incorporating the electromagnetic resonant coupler 710, and entire optimization including wires and the like in the system can be performed.

Further, when the electromagnetic resonant coupler 710 is formed on a printed substrate having a dielectric substrate of a plurality of layers, a composite material formed by dispersing particles composed of a first material in a second material may be included.

Accordingly, by changing a kind or a combination ratio of the first material in a material of a second dielectric substrate that becomes a main component, a dielectric constant or insulation electric field breakdown strength can be freely set.

Figure 25:
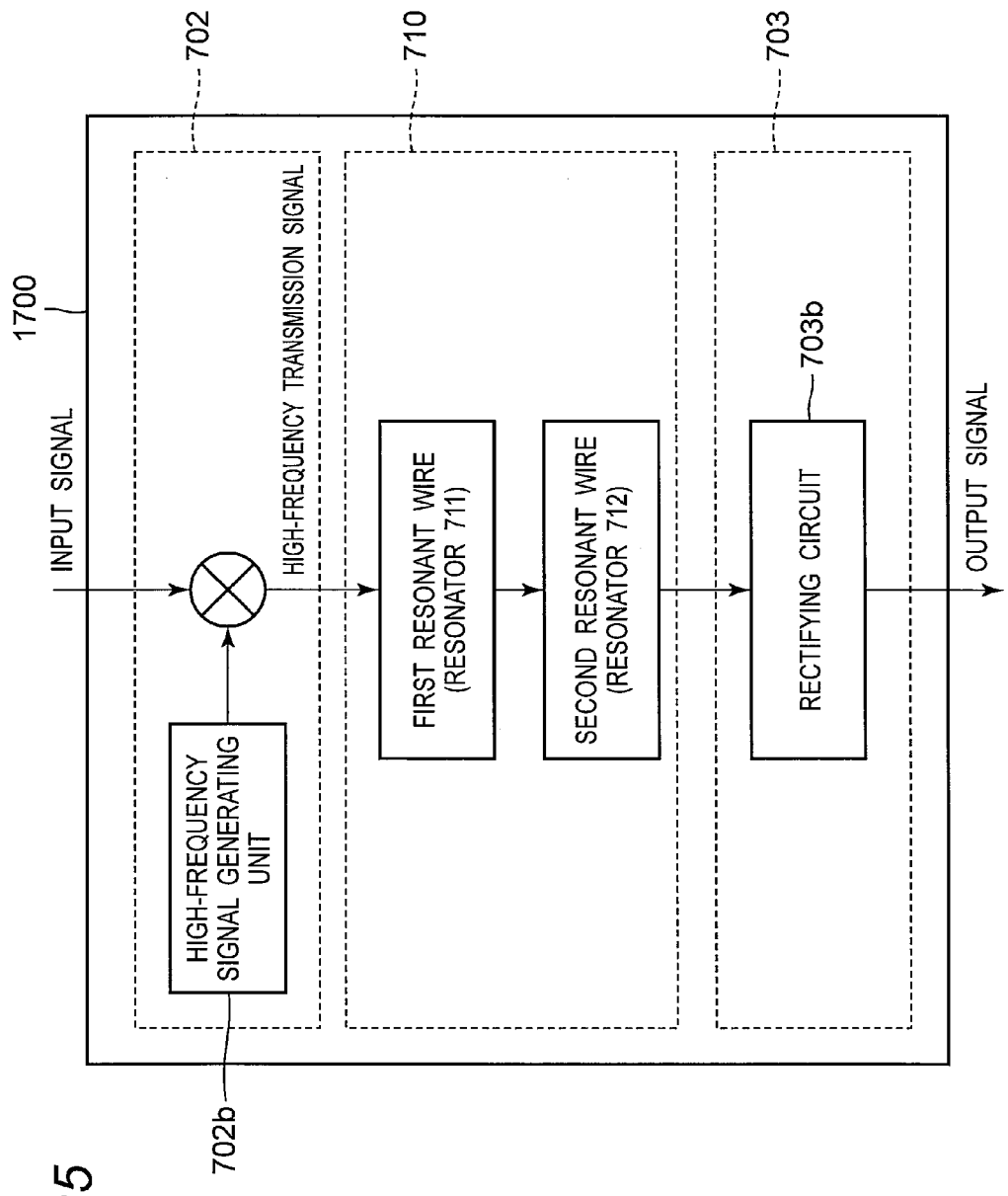
FIG. 25 is a diagram illustrating an example of a circuit block diagram of a high-frequency transmission device according to the fourth embodiment of the present invention.

FIG. 25 is a diagram illustrating an example of a circuit block diagram of the high-frequency transmission device 1700.

The high-frequency transmission device 1700 includes the electromagnetic resonant coupler 710, the substrate 701, the transmission circuit 702, and the receiver circuit 703.

The electromagnetic resonant coupler 710 includes a first resonant wire (the first resonator 711, for example), and a second resonant wire (the second resonator 712, for example) provided to oppose the first resonant wire 711.

The transmission circuit 702 includes a high-frequency signal generator 702b that generates high-frequency signals. The transmission circuit 702 generates high-frequency transmission signals by modulating input signals with high-frequency signals, and transmits the high-frequency transmission signals to the first resonant wire 711.

The first resonant wire 711 transmits high-frequency transmission signals to the second resonant wire 712.

The receiver circuit 703 rectifies high-frequency transmission signals transmitted to the second resonant wire 712, and generates output signals corresponding to the input signals. At this time, the receiver circuit 703 may include a rectifying circuit 703b including a diode or a capacitor.

The transmission circuit 702 and the receiver circuit 703 are each integrated circuits using semiconductors, for example.

The transmission circuit 702 may include an oscillator for generating high-frequency signals as microwaves, a modulator that modulates signals or a switch circuit, and a high frequency amplifier that amplifies signals, for example.

The transmission circuit 702 and the receiver circuit 703 each may be formed with any material of silicon or gallium arsenide or gallium nitride. In a practical example of the fourth embodiment, as an example, the transmission and receiver circuits 702 and 703 are formed by using gallium nitride which is excellent in a high frequency characteristic and which can output large electric power.

The receiver circuit 703 may include a rectifying circuit that restores original signals from high-frequency signals, for example. Naturally, there is no functional problem when other circuit than this circuit is included.

Figure 26:
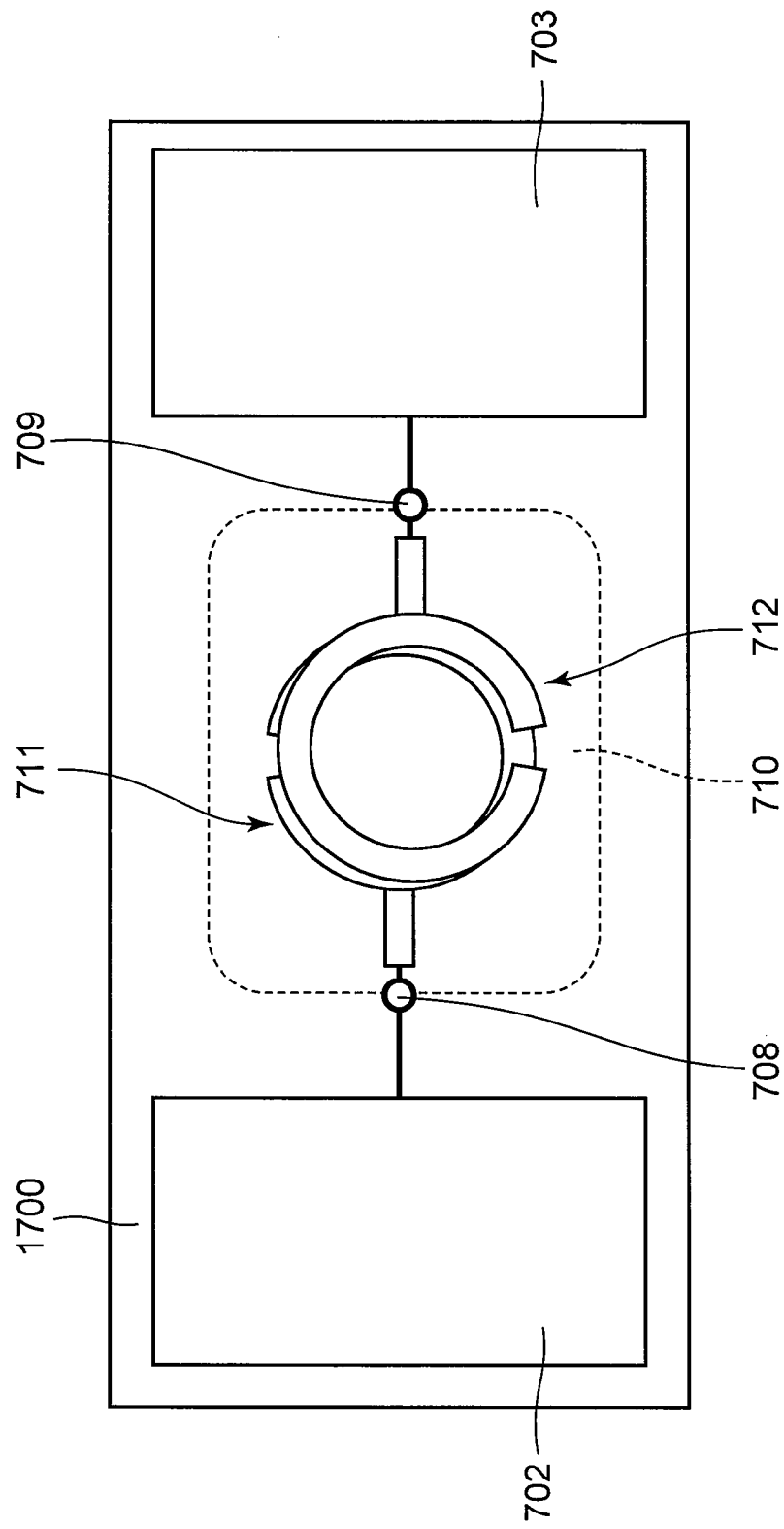
FIG. 26 is a circuit block diagram illustrating an example of the configuration of the high-frequency transmission device according to the fourth embodiment of the present invention.

FIG. 26 illustrates an example of a circuit block diagram of the high-frequency transmission device 1700 according to the fourth embodiment of the present invention. An operation of the high-frequency transmission device 1700 according to the fourth embodiment will be described with reference to FIG. 26.

An input signal from the transmission circuit is modulated by, for example, high-frequency signals as microwaves generated from the oscillator, in the transmission circuit 702. The modulated wave from the transmission circuit 702 is transmitted from the first input/output terminal 708 to the first resonator 711. Although the first resonator 711 and the second resonator 712 are not electrically connected to each other, modulated signals input to the first resonator 711 are transmitted while insulation to the second resonator 712 by an electromagnetic resonance phenomenon. The modulated signal transmitted to the second resonator 712 is transmitted from the second input/output terminal 709 to the receiver circuit 703, and the rectifying circuit restores the original signals.

Because the high-frequency signals generated by the transmission circuit 702 are restored to the original signals by the receiver circuit 703, the high-frequency signals are not directly radiated to outside the high-frequency transmission device 1700, unlike a general high-frequency transmission device.

The transmission circuit 702 and the receiver circuit 703 are sealed by the sealing material 705 made of epoxy or silicone, for example. Accordingly, characteristic deterioration due to impact from an outside and a temperature change can be reduced. In the fourth embodiment, although resin sealing is performed, the resin sealing may not be performed when this is not necessary.

Figure 27:
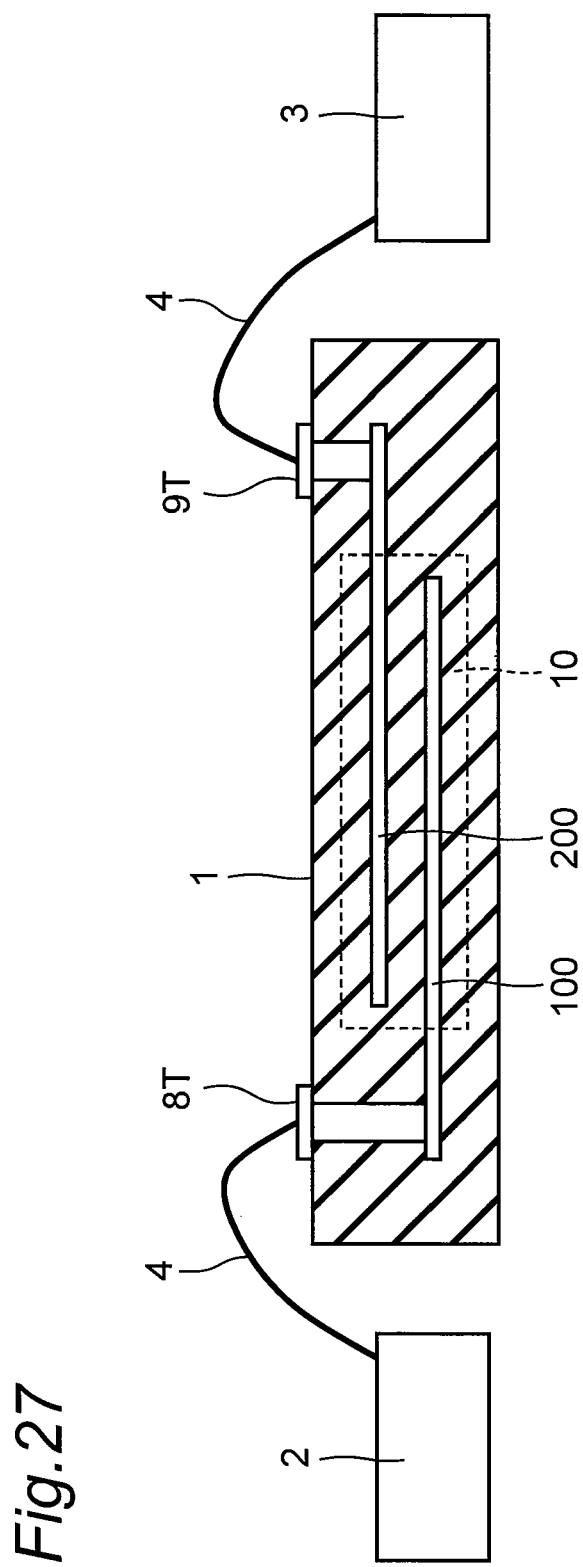
FIG. 27 is a sectional view illustrating a configuration of a comparative example.

FIG. 27 is a diagram illustrating a configuration of a comparative example.

In the comparative example illustrated in FIG. 27, the transmission circuit 2 and the receiver circuit 3 are not arranged on the substrate 1.

In this case, a length of the metal wire 4 connecting between the transmission circuit 2 and a first input/output terminal 8T becomes long. Similarly, a length of the metal wire 4 connecting between the receiver circuit 3 and a second input/output terminals 9T becomes long. Further, a concerned manufacturing process becomes complicated.

On the other hand, in the configuration of the fourth embodiment illustrated in FIG. 23A to FIG. 23G, the transmission circuit 702 and the receiver circuit 703 are arranged on the substrate 701.

Therefore, compared with the configuration of the comparative example, the length of the metal wire 704 connecting between the transmission circuit 702 and the first input/output terminal 708, and the length of the metal wire 704 connecting between the receiver circuit 703 and the second input/output terminal 709 can be made shorter. Accordingly, the influence of parasitic inductance and a resistance component that the metal wire 704 itself has can be shortened. Accordingly, for example, impedance mismatch and output reduction at the time of using at a higher frequency can be suppressed.

Figure 37:
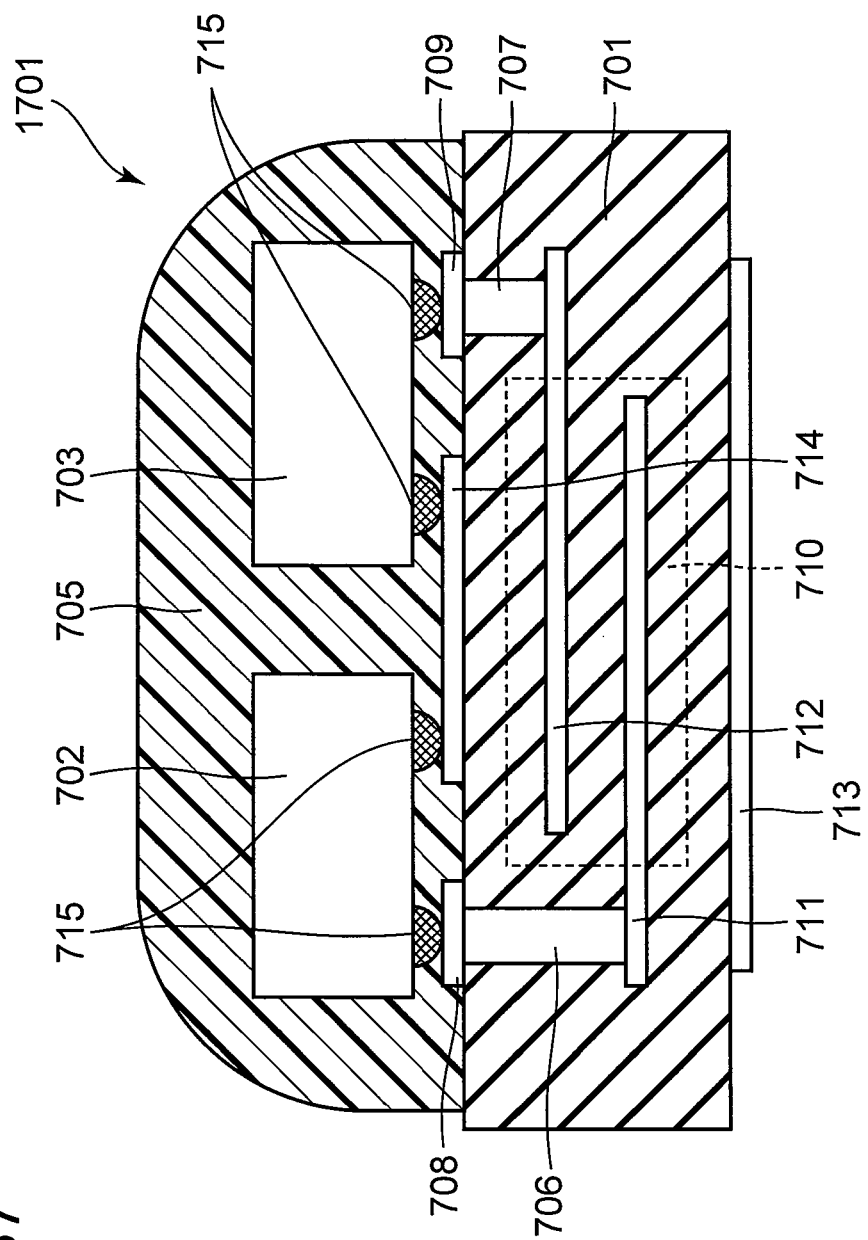
FIG. 37 is a sectional view illustrating an example of the configuration of the high-frequency transmission device according to the fifth embodiment of the present invention.

Further, by arranging the transmission circuit 702 and the receiver circuit 703 on the substrate 701, as illustrated in FIG. 37 to be described later, the transmission circuit 702 and the receiver circuit 703 can be connected to the substrate 701 by bumps 715 or solder balls. Accordingly, the influence of a resistance component and inductance due to a wire length, and mismatch and output reduction of impedance when used in a higher frequency, for example, a millimeter wave band, can be suppressed. Further, a concerned manufacturing process can also be simplified.

Figure 28:
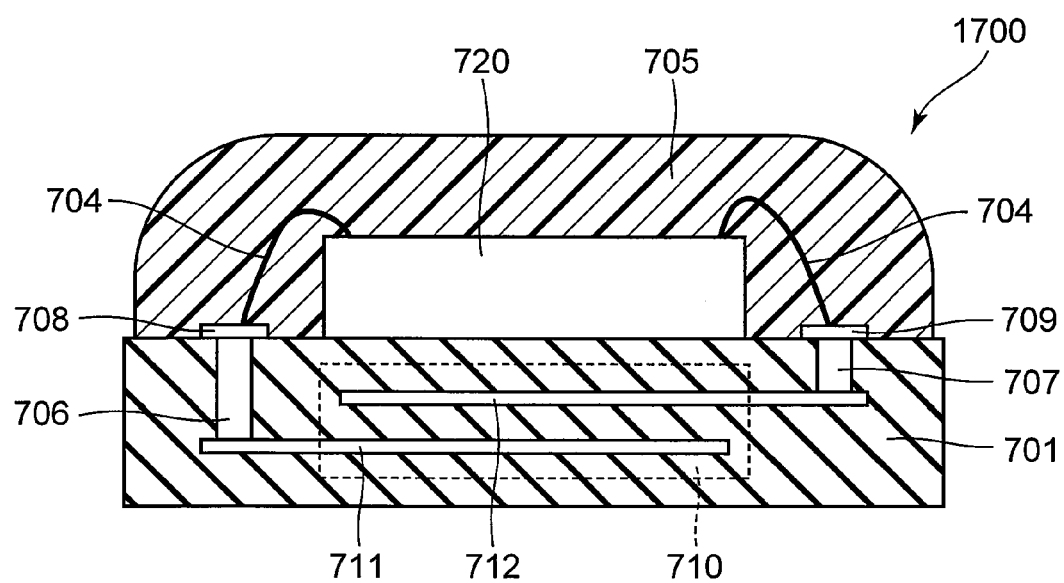
FIG. 28 is a sectional view illustrating an example of a configuration of a high-frequency transmission device according to another modification of the fourth embodiment of the present invention.

Further, the transmission circuit 702 and the receiver circuit 703 are not necessary to be integrated into separate semiconductors, and may be integrated into a single semiconductor chip as the transmission/receiver circuit 720 as illustrated in FIG. 28. By such a mode, because the number of semiconductor chips arranged on the substrate 701 can be reduced, mounting can be facilitated.

Only any one of the transmission circuit 702 and the receiver circuit 703 may be arranged on the substrate 701.

Figure 29:
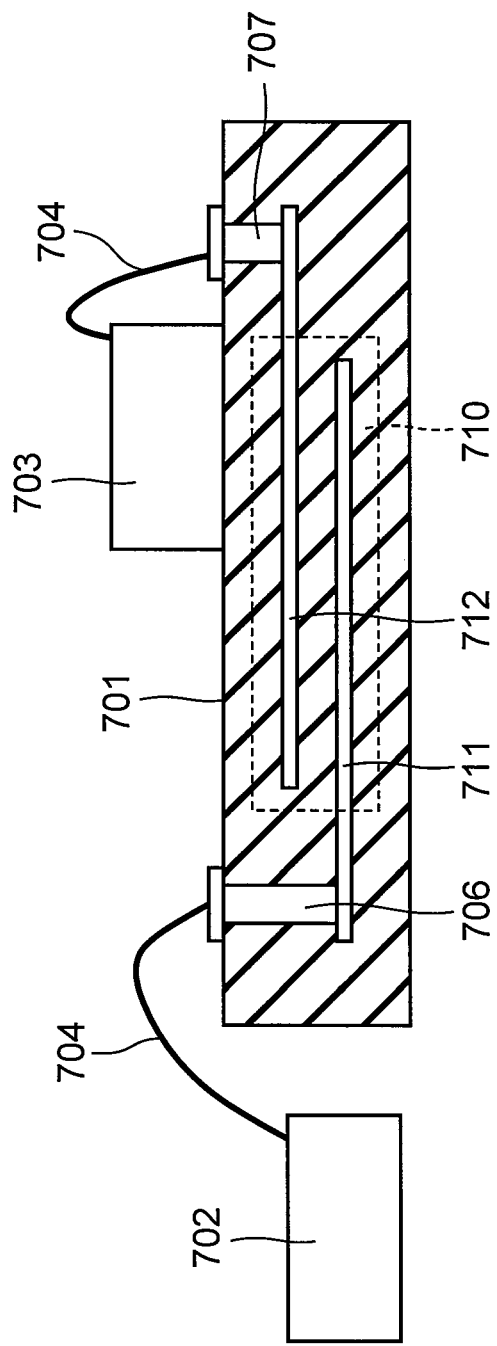
FIG. 29 is a sectional view illustrating an example of the configuration of the high-frequency transmission device according to another modification of the fourth embodiment of the present invention.
Figure 30:
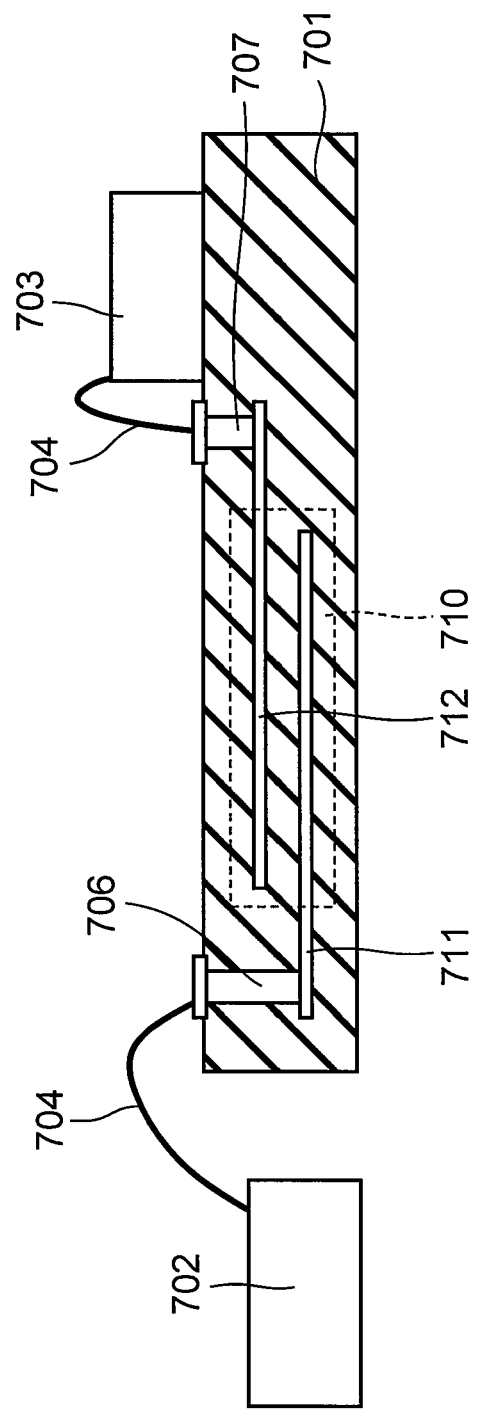
FIG. 30 is a sectional view illustrating an example of the configuration of the high-frequency transmission device according to another modification of the fourth embodiment of the present invention.

For example, as illustrated in FIG. 29, only the receiver circuit 703 may be arranged on the substrate 701. At this time, the arrangement position of the receiver circuit 703 may be a position other than a region immediately above the electromagnetic resonant coupler 710, as illustrated in FIG. 30. The position other than a region immediately above the electromagnetic resonant coupler 710 means, as one example, a position at which a length of the wire 704 for high-frequency signal wiring becomes as short as possible. This is similarly applied to the subsequent description.

Figure 31:
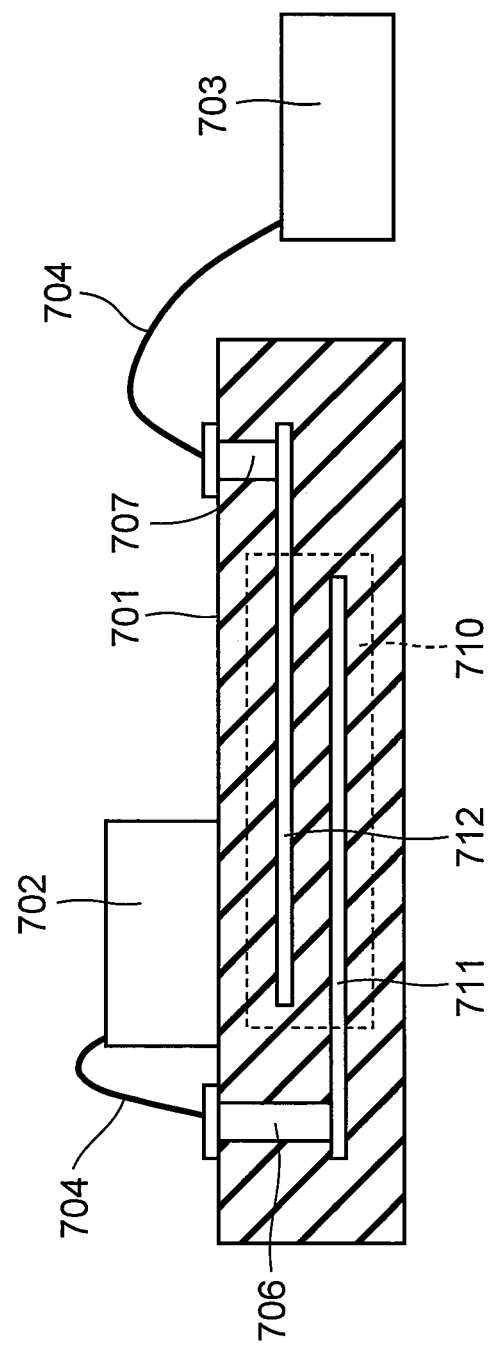
FIG. 31 is a sectional view illustrating an example of the configuration of the high-frequency transmission device according to another modification of the fourth embodiment of the present invention.
Figure 32:
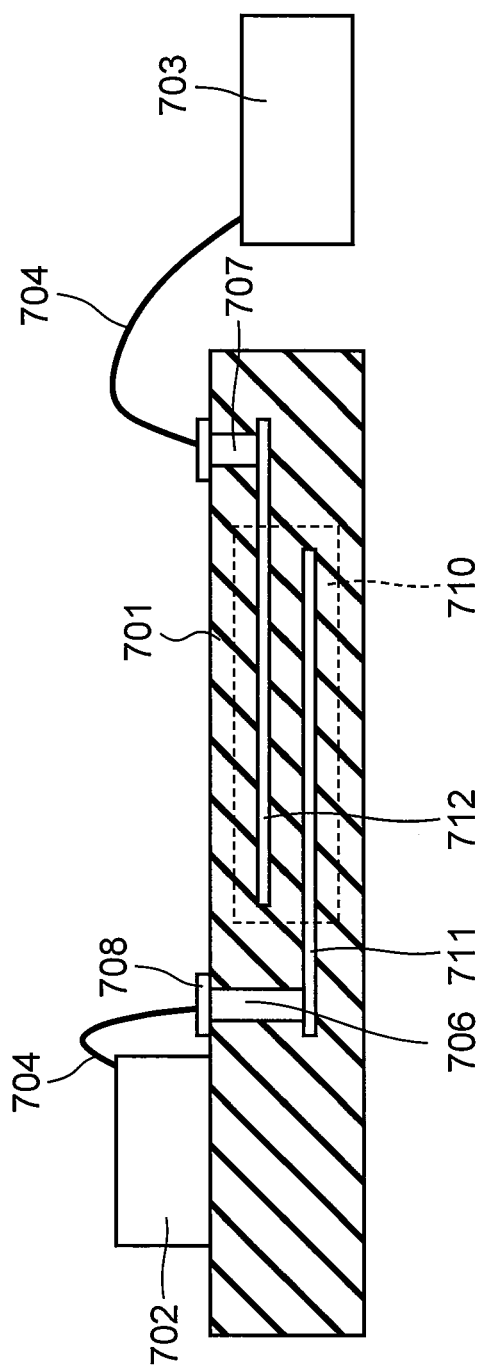
FIG. 32 is a sectional view illustrating an example of the configuration of the high-frequency transmission device according to another modification of the fourth embodiment of the present invention.

Alternatively, as illustrated in FIG. 31, only the transmission circuit 702 may be arranged on the substrate 701. At this time, the arrangement position of the transmission circuit 702 may be a position other than a region immediately above the electromagnetic resonant coupler 710, as illustrated in FIG. 32.

Figure 33A:
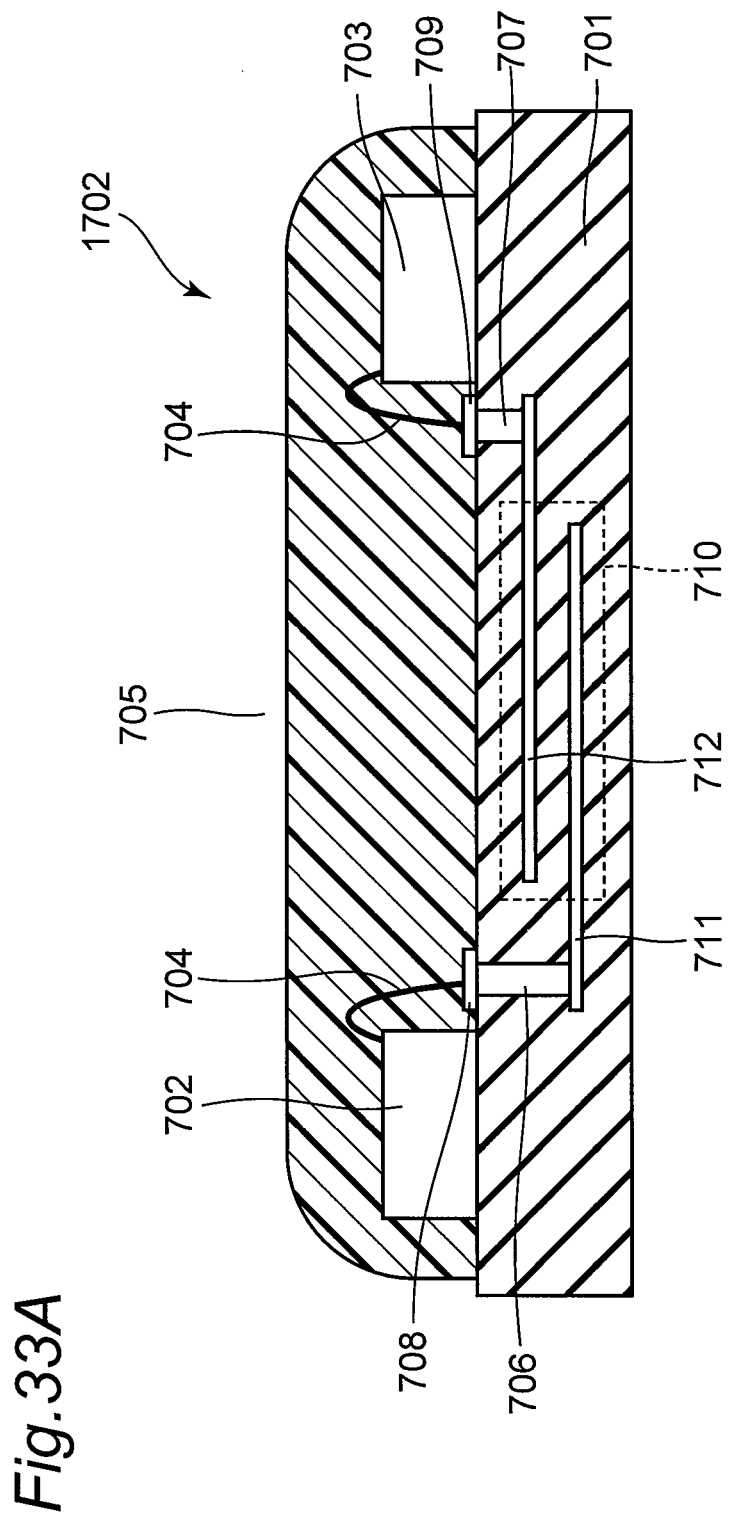
FIG. 33A is a sectional view illustrating an example of a configuration of a high-frequency transmission device according to a sixth embodiment of the present invention.
Figure 33B:
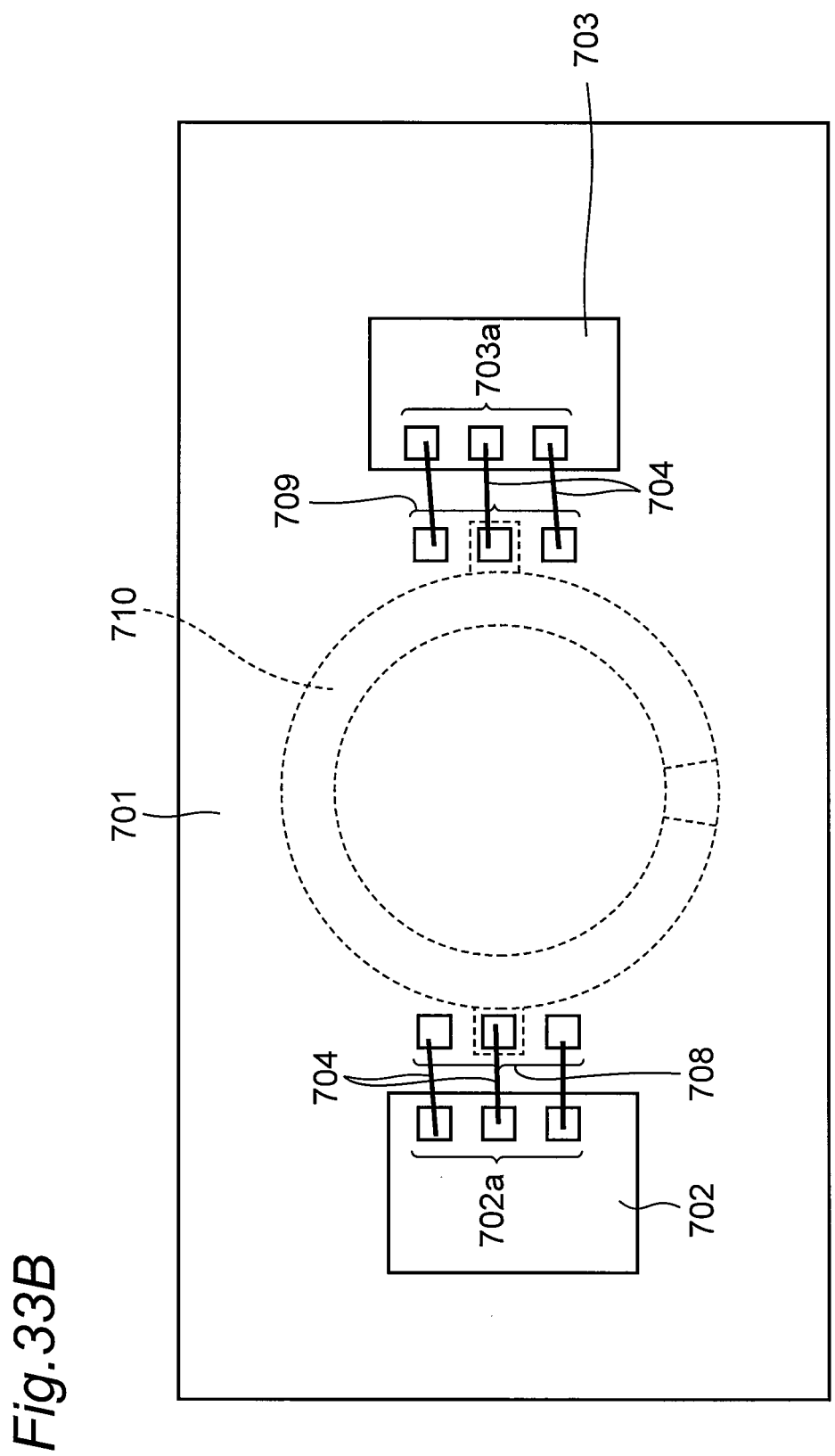
FIG. 33B is a plan view illustrating the example of the configuration of the high-frequency transmission device according to the sixth embodiment of the present invention.

Further, as illustrated in FIG. 33A and FIG. 33B, the transmission circuit 702 and the receiver circuit 703 (or at least the transmission circuit 702) may be arranged at a position other than a region immediately above the electromagnetic resonant coupler 710.

The resonance phenomenon of the electromagnetic resonant coupler 710 realizes high efficient transmission by utilizing not only an electric field but also a magnetic field. Metal shields 713 and 714 like in a fifth embodiment to be described later can reduce electric field noise but cannot reduce magnetic field noise because the magnetic field noise penetrates the metal shields. In the case where the electromagnetic resonant coupler 710 is what is called in a coil shape, for example, magnetic field noise becomes large at an immediately above part. Accordingly, by arranging the transmission circuit 702 and the receiver circuit 703 (or at least the transmission circuit 702) at a position other than a region immediately above the electromagnetic resonant coupler 710, the influence of the magnetic field noise can be suppressed to a minimum. Further, by such arrangement, as in a sixth embodiment, a heat dissipation structure 717 can be provided immediately below a transmission circuit.

Figure 34:
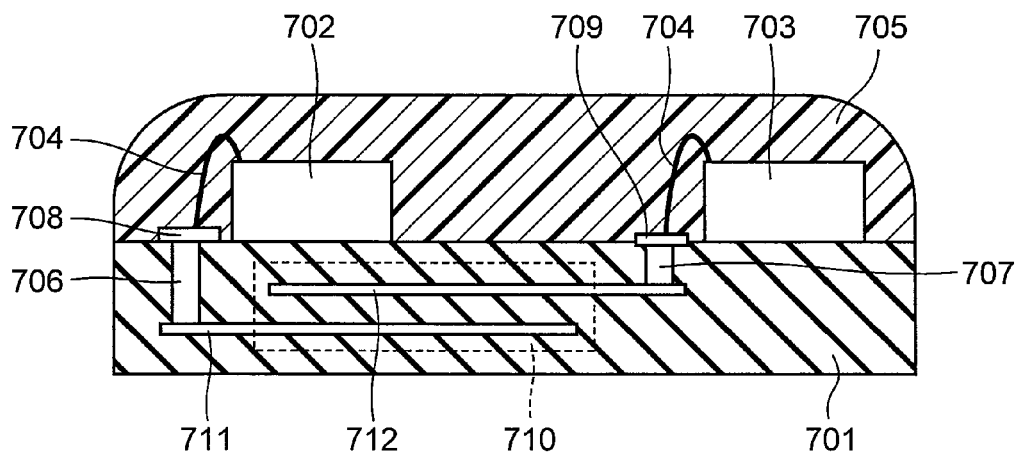
FIG. 34 is a sectional view illustrating an example of the configuration of the high-frequency transmission device according to the sixth embodiment of the present invention.

Further, as illustrated in FIG. 34, by arranging only the receiver circuit 703 at a position other than immediately above region, an effect of magnetic field noise reduction is also obtained.

Figure 35:
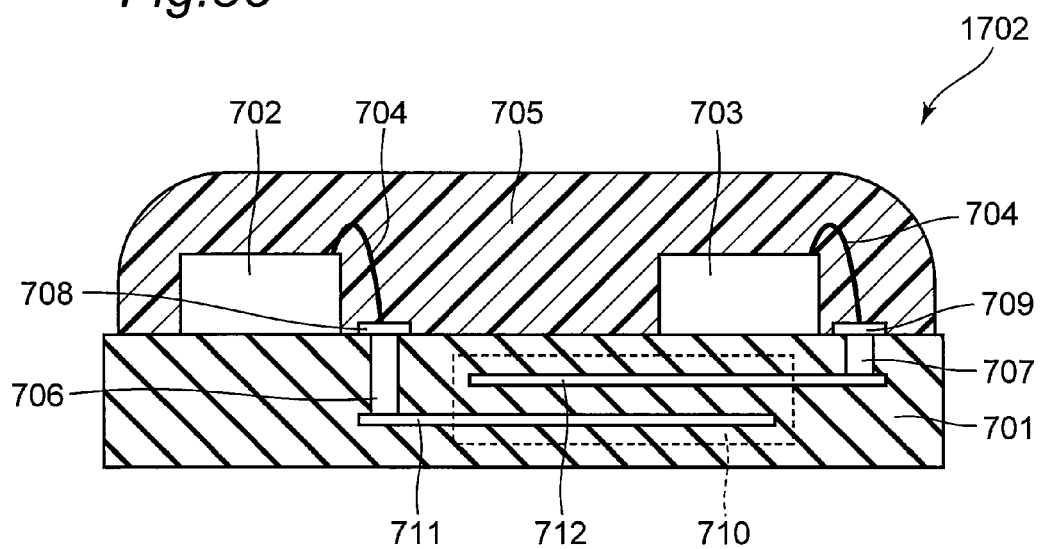
FIG. 35 is a sectional view illustrating an example of the configuration of the high-frequency transmission device according to the sixth embodiment of the present invention.

Further, as illustrated in FIG. 35, by arranging only the transmission circuit 702 at a position other than immediately above region, an effect of magnetic field noise reduction is obtained.

In this case, the transmission circuit 702 includes the high-frequency signal generator 702b and the like. Therefore, when the transmission circuit 702 and the electromagnetic resonant coupler 710 are brought close to each other, there is a possibility that noise from the high-frequency generating unit 702b and the like gives influence on the electromagnetic resonant coupler 710.

Therefore, in order to reduce the influence of noise from the transmission circuit 702, as illustrated in FIG. 32, FIG. 33A, and FIG. 35, it is preferable that the transmission circuit 702 is arranged at a position other than a region immediately above the electromagnetic resonant coupler 710.

Meanwhile, the receiver circuit 703 has a small influence on the electromagnetic resonant coupler 710 as compared with the transmission circuit 702.

Therefore, in order to reduce the space for arranging the receiver circuit 703, it is preferable to arrange the receiver circuit 703 in a region immediately above the electromagnetic resonant coupler 710, as illustrated in FIG. 23A, FIG. 29, and FIG. 35.

According to the arrangement, a length of the metal wire 704 connecting between the receiver circuit 703 and the second input/output terminal 709 can be made shorter. Accordingly, the influence of parasitic inductance that the metal wire 704 itself has can be shortened. Consequently, output reduction at the time of using at a higher frequency can be suppressed, for example. Further, a shield on a lateral side of the substrate 701 can be also made unnecessary.

Further, according to this configuration, installation of an electric field shielding unit can be simplified. For example, the electric field shielding unit may be provided between the receiver circuit 703 and the electromagnetic resonant coupler 710. On the other hand, according to a method of arranging the receiver circuit 703 in FIG. 27 and FIG. 30, in order to reduce the influence of high-frequency noise from a lateral side of the electromagnetic resonant coupler 710, for example, a configuration having the ground walls 330 and 430 as illustrated in the second embodiment becomes necessary in some cases, and the installation of the electric field shielding unit is complicated.

As described above, in the configuration illustrated in FIG. 35, the transmission circuit 702 which gives a large influence on the electromagnetic resonant coupler 710 is not arranged in a region immediately above the electromagnetic resonant coupler 710, and the receiver circuit 703 which gives a small influence on the electromagnetic resonant coupler 710 is arranged in a region immediately above the electromagnetic resonant coupler 710.

Accordingly, while reducing the space for arranging the receiver circuit 703, it becomes possible to reduce the influence of parasitic inductance of the metal wire 704 itself which connects between the receiver circuit 703 and the second input/output terminal 709, simplify the installation of the electric field shielding unit, and further, reduce the influence of noise from the transmission circuit 702.

Further, with the configuration as illustrated in FIG. 35, like in the sixth embodiment to be described later, it becomes also possible to provide on the substrate 701 the heat dissipation structure 717 for the transmission circuit 702 of large heating.

By arranging the metal shields 713 and 714 together like in the fifth embodiment described below, influences of both electric field noise and magnetic field noise can be reduced.

(Fifth Embodiment)

In a high-frequency transmission device 1701 according to the fifth embodiment of the present invention, upper and lower parts of an electromagnetic resonant coupler 710 are covered with metal shields 713 and 714 that is an example of an electric field shielding unit.

Hereinafter, the fifth embodiment of the present invention will be described with reference to drawings.

Figure 36:
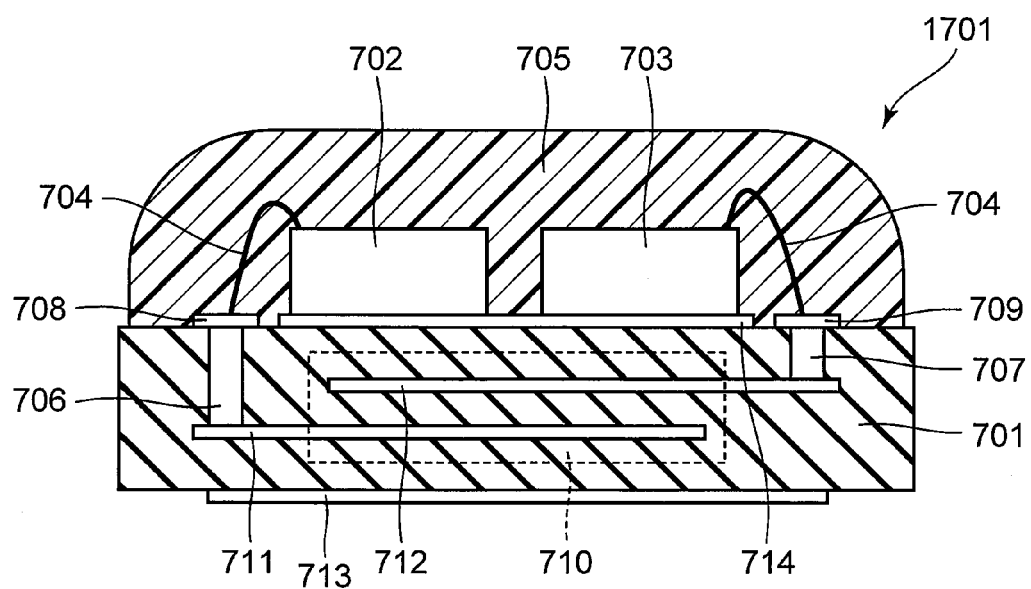
FIG. 36 is a sectional view illustrating an example of a configuration of a high-frequency transmission device according to a fifth embodiment of the present invention.

FIG. 36 illustrates an example of a sectional view of the high-frequency transmission device 1701 according to the fifth embodiment of the present invention.

A basic structure of the high-frequency transmission device 1701 according to the fifth embodiment of the present invention is the same as that of the high-frequency transmission device 1700 according to the fourth embodiment illustrated in FIG. 23A. The same members are attached with identical reference signs and their description will be omitted, and different points will be mainly described.

A first metal shield 713 is arranged on a lower surface of a substrate 701, and is formed to cover the electromagnetic resonant coupler 710 in the substrate 701. Similarly, a second metal shield 714 is arranged on an upper surface of the substrate 701 (a main surface), and is formed to cover the electromagnetic resonant coupler 710 in the substrate 701.

That is, the first metal shield 713 is constructed by a sufficiently large metal layer arranged on a plane different from that of a first resonator 711 and below the first resonator 711.

Further, the second metal shield 714 is constructed by a sufficiently large metal layer arranged on a plane different from that of a second resonator 712 and above the second resonator 712.

Because the first resonator 711 and the second resonator 712 of the electromagnetic resonant coupler 710 transmit high-frequency signals, electric field noise is radiated to outside. Accordingly, as illustrated in the fourth embodiment, a high-frequency wave is transmitted from the electromagnetic resonant coupler 710 to the transmission circuit 702 and the receiver circuit 703 and becomes noise, so that a malfunction is generated.

Therefore, like in the fifth embodiment, by arranging the first and second metal shields 713 and 714, the first and second metallic shields 713 and 714 can prevent electric field noise from being radiated to outside, or can prevent outside electric field noise from entering inside the electromagnetic resonant coupler 710.

Further, the second metal shield 714 also takes effect by itself. By arranging the first metal shield 713 of a lower side, electric field noise from another wire around the high-frequency transmission device can enter inside the electromagnetic resonant coupler 710.

Further, the transmission and receiver circuits 702 and 703 may be mounted on the substrate 701 by bumps 715 or by solder balls as illustrated in FIG. 37 instead of by wire. When the transmission and receiver circuits 702 and 703 are electrically connected by wire to the input/output terminals 708 and 709, there is a possibility that a high-frequency characteristic is changed at a chip time of an integrated circuit and at the time of assembling into a high-frequency transmission device due to an influence of parasitic inductance of the wire itself. In this way, by connecting by the bumps 715, the influence of inductance and wiring resistance due to a wire length can be eliminated, and mismatch of impedance and output reduction when the high-frequency transmission device is used in a higher frequency, for example, a millimeter wave band, can be suppressed.

(Sixth Embodiment)

Hereinafter, the sixth embodiment of the present invention will be described with reference to drawings.

Figure 38:
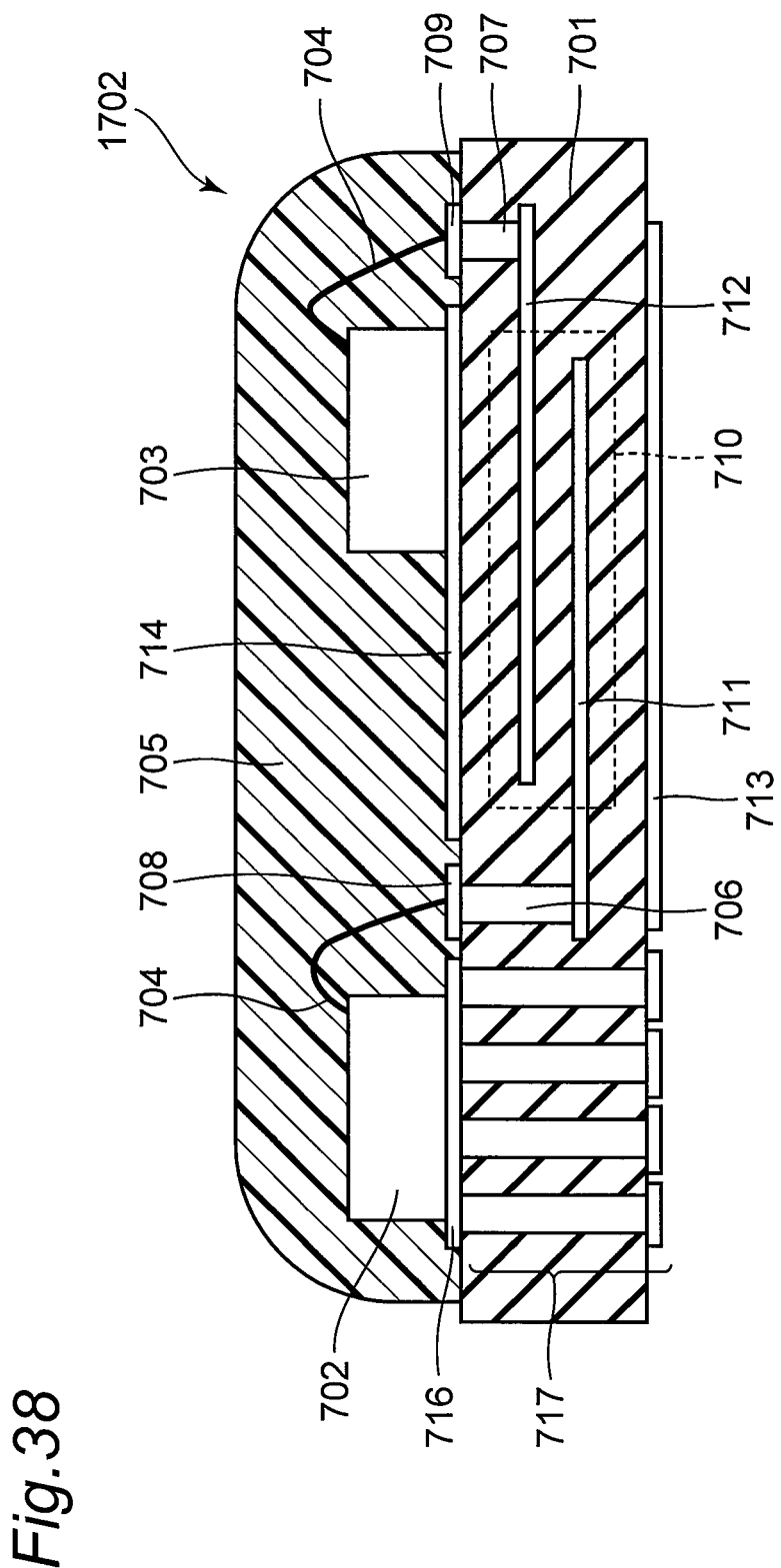
FIG. 38 is a sectional view illustrating an example of the configuration of the high-frequency transmission device according to the sixth embodiment of the present invention.

FIG. 38 is an example of a sectional view of a high-frequency transmission device 1702 according to the fifth embodiment of the present invention.

Because a transmission circuit 702 is an analog circuit in many cases, unlike a general digital circuit, a steady current is relatively large. Further, because a high-frequency is used, power efficiency is low as compared with a low-frequency circuit. Therefore, there is a problem in that heat generated from a transmission circuit 702 becomes large.

Therefore, heat dissipation structures 717 are provided below the transmission circuit 702. That is, as an example, a metal layer 716 is arranged immediately below a transmission circuit 2 as illustrated in FIG. 38, the metal layer 716 and heat dissipation vias 717 are physically connected to each other. Accordingly, heat dissipation can be improved.

The metal layer 716 can be formed on the same plane as that of a second metal shield 714 and first and second input/output terminals 708 and 709. Therefore, steps on a special process are not necessary.

The heat dissipation vias 717 can be also formed in the same process as that of the first vias 706 and the second vias 707.

Further, in order to improve heat dissipation, it is preferable to physically connect lower parts of the heat dissipation vias 717 to other heat sink or the like. Also, eliminating a sealing material 705 or replacing the sealing material 705 with a higher heat dissipation material is also efficient.

(Seventh Embodiment)

Hereinafter, a seventh embodiment of the present invention will be described with reference to drawings.

Figure 39:
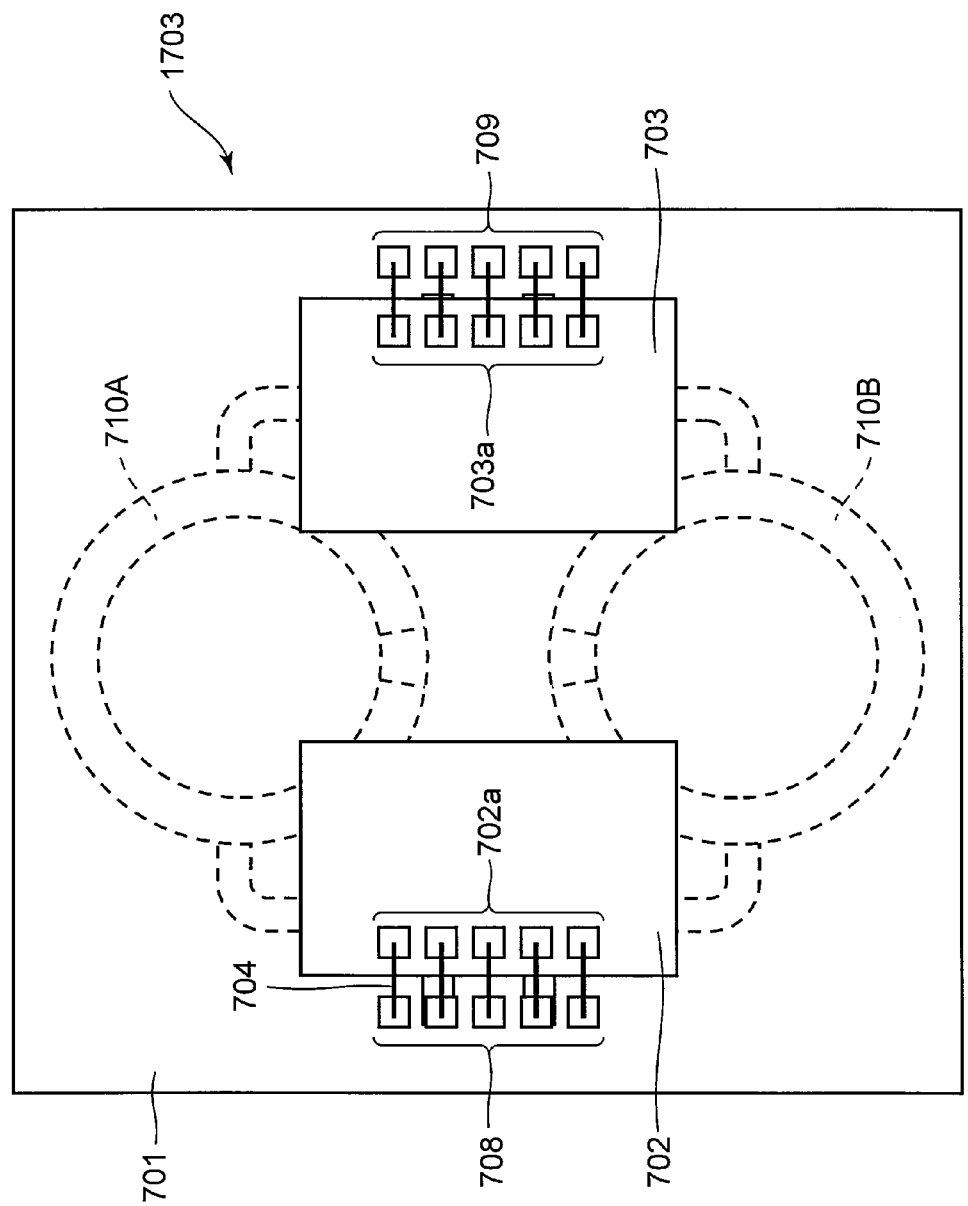
FIG. 39 is a plan view illustrating an example of a configuration of a high-frequency transmission device according to a seventh embodiment of the present invention.

FIG. 39 is an example of a plan view of a high-frequency transmission device 1703 according to the seventh embodiment of the present invention.

In order to perform insulated transmission of two or more systems, a plurality of the same kinds of elements need to be used. Therefore, there are problems in that footprint of an evaluation substrate when a module is mounted becomes large, and that mounting cost becomes high.

Therefore, in the seventh embodiment, there is provided the high-frequency transmission device 1703 in which a plurality of electromagnetic resonant couplers 710A and 710B are provided with respect to a set of a transmission circuit 702 and a receiver circuit 703 and that simultaneously performs insulated signal transmission of two or more systems.

Specifically, as illustrated in FIG. 39, the high-frequency transmission device 1703 in the seventh embodiment of the present invention includes a substrate 701, a first electromagnetic resonant coupler 710A incorporated in the substrate 701, a second electromagnetic resonant coupler 710B incorporated in the substrate 701 and transmitting signals different from signals transmitted to the first electromagnetic resonant coupler 710A, the transmission circuit 702, the receiver circuit 703, and a sealing material 705. The first electromagnetic resonant coupler 710A and the second electromagnetic resonant coupler 710B each incorporated in the substrate 701 include a first input/output terminal 708 and a second input/output terminal 709. The transmission circuit 702 and the receiver circuit 703 are arranged on an upper surface of the substrate 701 (a main surface), and the transmission circuit 702 and the first input/output terminal 708 are electrically connected to each other by metal wires 704. The receiver circuit 703 and the second input/output terminal 709 are electrically connected to each other by the metal wires 704.

With such a configuration, because the plurality of electromagnetic resonant couplers 710A and 710B are provided with respect to the set of the transmission circuit 702 and the receiver circuit 703, it is possible to simultaneously perform insulated signal transmission of two or more systems, reduce footprint of the evaluation substrate when mounting the module, and reduce the mounting cost.

Figure 40:
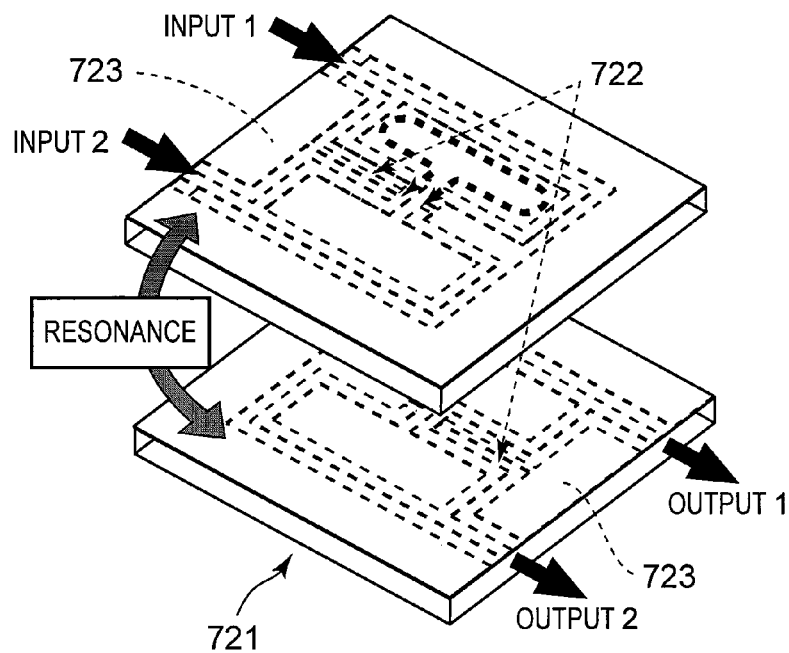
FIG. 40 is a perspective view illustrating an example of a configuration of a known transmission device.

Further, as illustrated in FIG. 40, an electromagnetic resonant coupler 721 capable of performing insulated transmission of a plurality of systems by one element has been proposed in WO2013/065238 (Patent Literature 3). A conventional electromagnetic resonant coupler 721 disclosed in Patent Literature 3 is obtained by setting two electromagnetic resonant couplers into one electromagnetic resonant coupler 721.

The conventional electromagnetic resonant coupler 721 performs electromagnetic resonance by resonating a current and voltage in the length of ½ of a desired wavelength. A resonator length is determined from this relationship. A center portion of the resonator length, that is, a center part of the ½ wavelength is a point at which a current of a signal is maximum and a voltage is minimum. That is, this arrangement can be regarded as the same phenomenon as that this portion is grounded.

Therefore, there is proposed an electromagnetic resonant coupler 721 that has a ground 723 connected to a ground of a rear surface or the like with terminal separation shunts 722 or vias for installation, at a center of a line of a length of ½ of a wavelength, and that has two terminals provided at symmetrical positions from the connection position, as described in Patent Literature 3. By providing the terminal separation shunts 722 and the vias or the like, resonation can be performed in a ¼ wavelength which is a half of a conventional wavelength.

Figure 41:
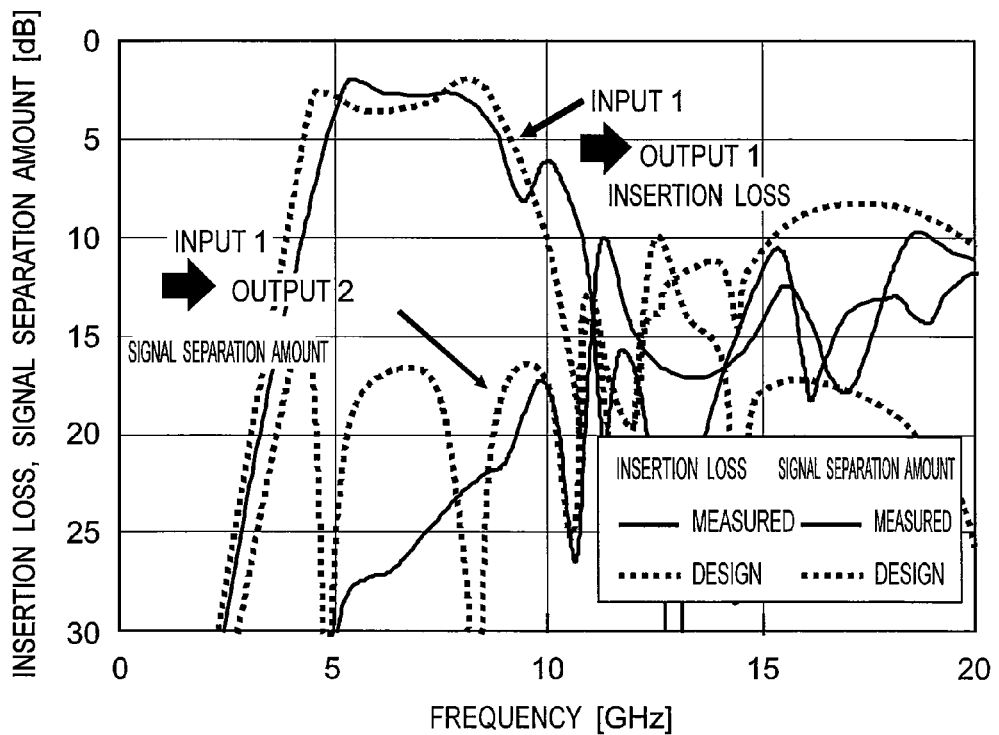
FIG. 41 is a graph illustrating a characteristic of an electromagnetic resonant coupler in Patent Literature 3.

Further, because there are short-circuit points between the two terminals by the terminal separation shunts 722 or the vias, a high frequency is reflected and two input signals can be separated. That is, a signal that enters from an input 1 is output to only an output 1, and a signal that enters from an input 2 is output to only an output 2. FIG. 41 illustrates a characteristic of the electromagnetic resonant coupler 721 of Patent Literature 3 described above. For example, it can be confirmed that at 5.8 GHz, a signal is transmitted from the input 1 to the output 1 with low loss of 1.5 dB, but a signal is not transmitted from the input 1 to the output 2 due to attenuation of 25 dB or more. Because the electromagnetic resonant coupler 721 is a passive element, high-frequency characteristics from the input 2 to the output 2 and from the input 2 to the output 1 become substantially equal to the above characteristic.

Figure 42:
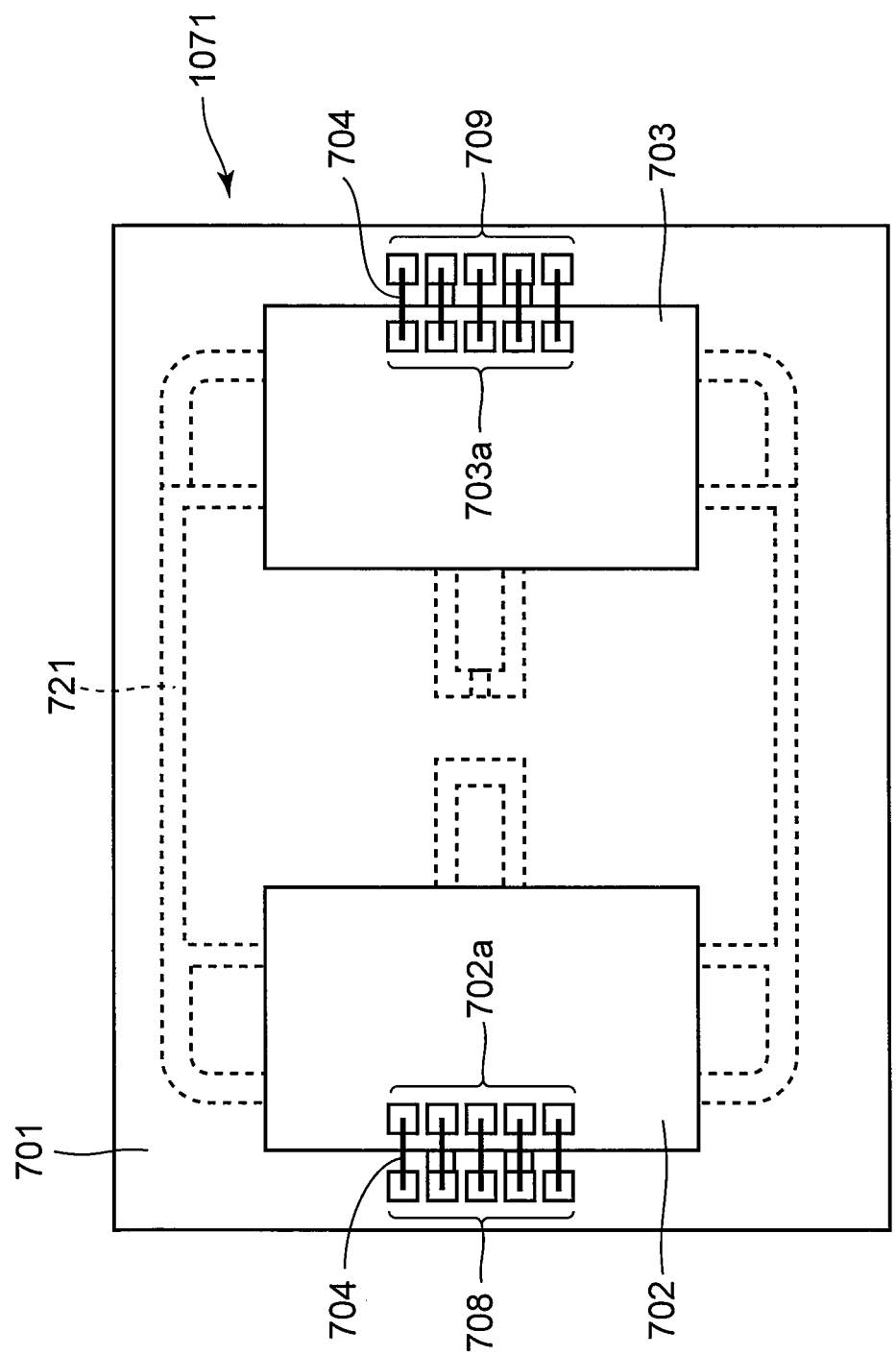
FIG. 42 is a plan view illustrating an example of a configuration of a high-frequency transmission device according to a modification of a seventh embodiment of the present invention.
Figure 43A:
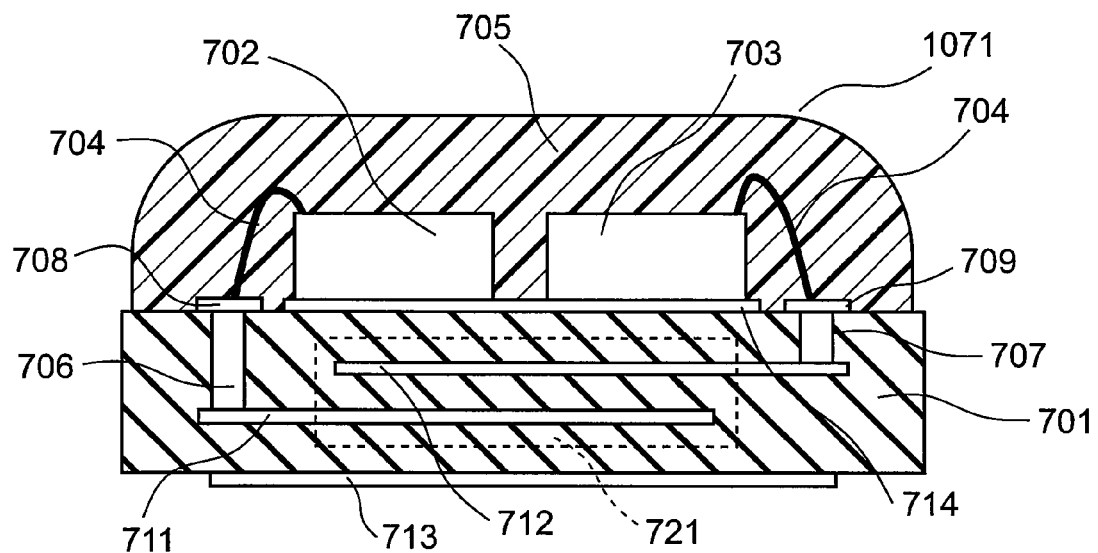
FIG. 43A is a sectional view illustrating an example of a configuration of a high-frequency transmission device in FIG. 42.
Figure 43B:
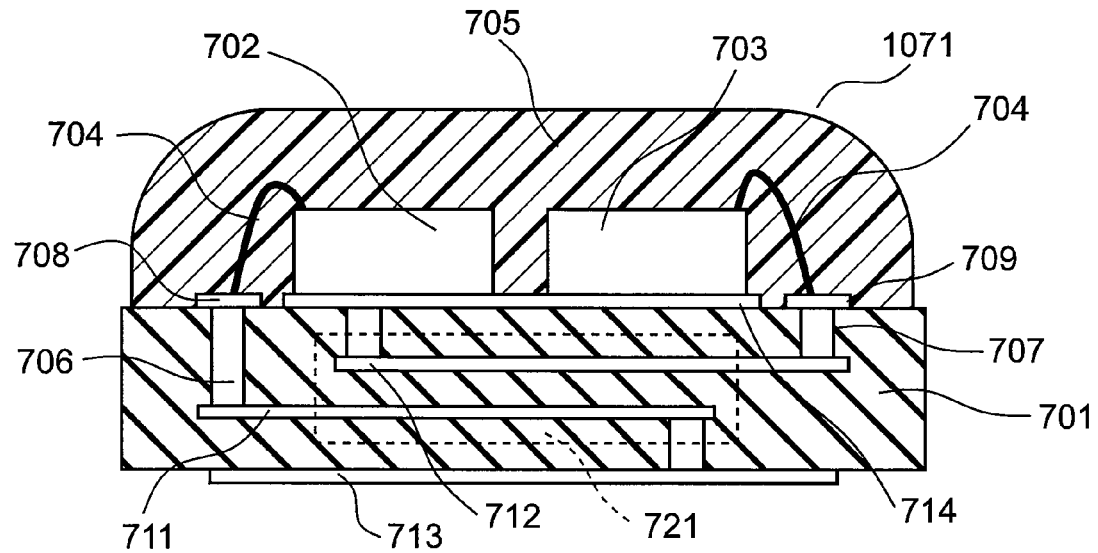
FIG. 43B is a sectional view illustrating another example of the configuration of the high-frequency transmission device in FIG. 42.

As illustrated in FIG. 39, in order to perform insulated transmission of two systems, two electromagnetic resonant couplers 710 are necessary. On the other hand, as a modification of the seventh embodiment of the present invention, as FIG. 42, FIG. 43A, and FIG. 43B illustrate the high-frequency transmission device 1071, by incorporating two electromagnetic resonant couplers 721 illustrated FIG. 40 into the substrate 701, insulated transmission of two systems can be realized by one electromagnetic resonant coupler element using the two electromagnetic resonant couplers 721. FIG. 43A is a sectional view illustrating an example of a configuration of the high-frequency transmission device 1071 illustrated in FIG. 42. FIG. 43B is a sectional view illustrating another example of a configuration of the high-frequency transmission device 1071 illustrated in FIG. 42.

Accordingly, by using the electromagnetic resonant coupler 721 as illustrated in FIG. 42, an overall module size can be reduced and further miniaturization can be performed.

Although the present invention has been described based on the first to seventh embodiments and modifications, naturally, the present invention is not limited to the first to seventh embodiments and the modifications. For example, in any of the high-frequency transmission device in the fourth embodiment to the seventh embodiment, there may be included metal walls around the electromagnetic resonant coupler, that is, the first metal wall 330 and the second metal wall 430 of the second embodiment.

Figure 44:
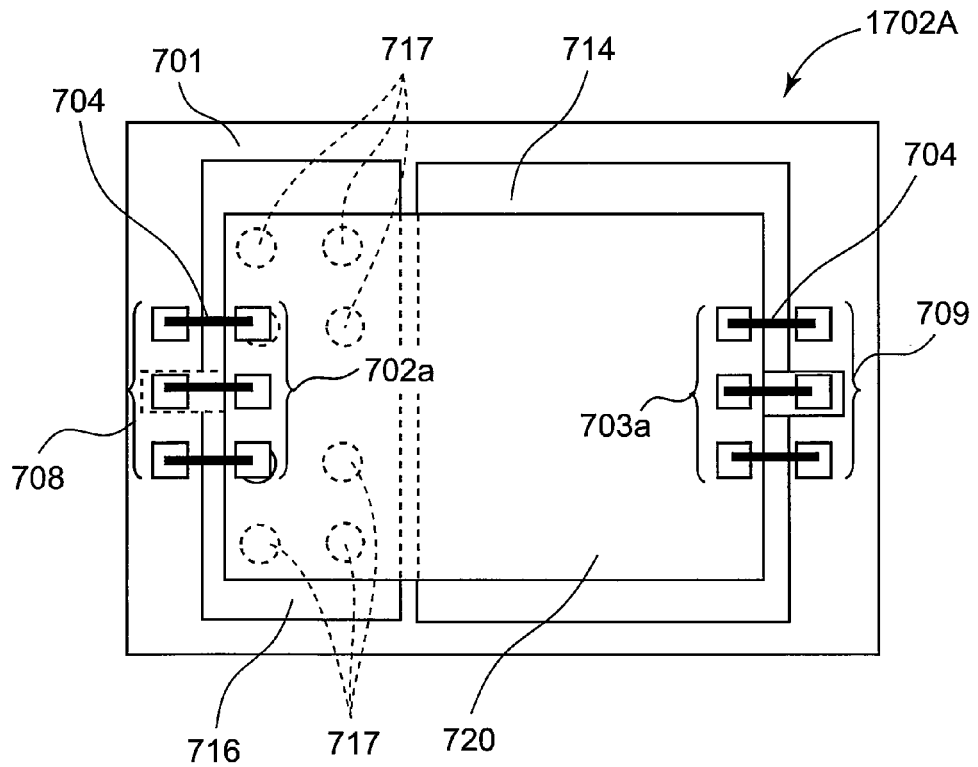
FIG. 44 is a plan view illustrating an example of a configuration of a high-frequency transmission device provided by combining a plurality of embodiments.
Figure 45:
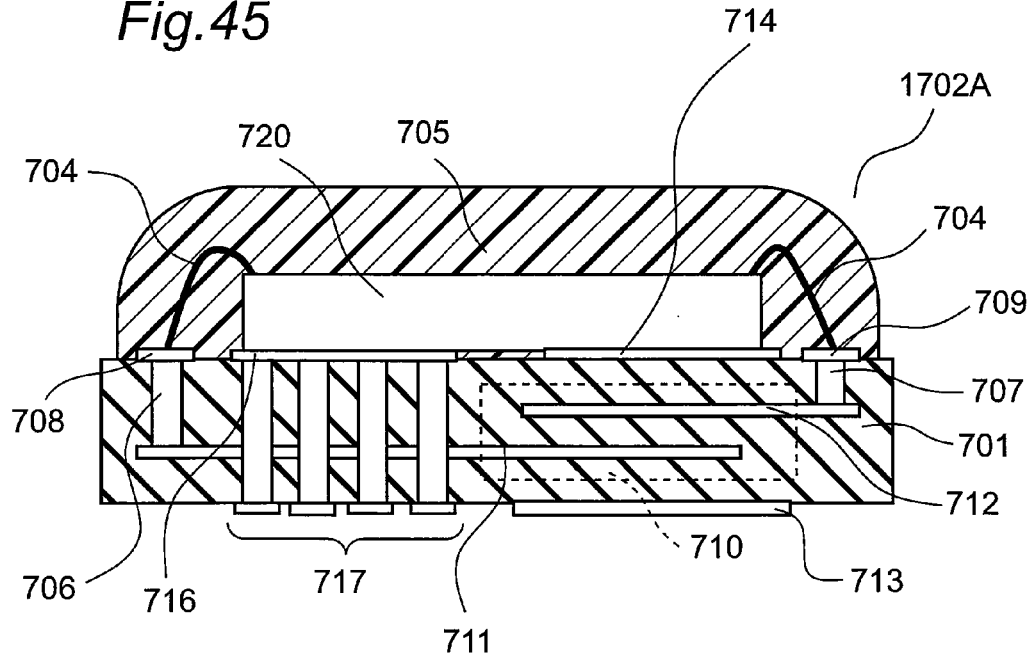
FIG. 45 is a sectional view illustrating an example of a configuration of a high-frequency transmission device in FIG. 44.

Further, as an example, as illustrated in FIG. 44 and FIG. 45, by combining a plurality of embodiments (the sixth embodiment and the fourth embodiment, for example), there may be provided a high-frequency transmission device 1702A in which a transmission/receiver circuit is the transmission/receiver circuit configured by one chip, and to which heat dissipation structures 717 and metal shields 713 and 714 are attached. In this case, respective effects of the combined embodiments can be exhibited.

By properly combining the arbitrary embodiment(s) or modification(s) of the aforementioned various embodiments and modifications, the effects possessed by the embodiment(s) or modification(s) can be produced.

INDUSTRIAL APPLICABILITY

The electromagnetic resonant coupler according to the present invention can provide an electromagnetic resonant coupler that suppresses radiation of high-frequency noise, by arranging high-frequency shields in not only a thickness direction but also a lateral direction perpendicular to the thickness direction of a substrate. Further, by integrating the electromagnetic resonant coupler with a functional circuit chip, it is possible to use the electromagnetic resonant coupler as a high-frequency transmission device such as a compact isolator or an insulation-type power transmission device. Further, the high-frequency transmission device according to the present invention can be used as a compact module, by forming an electromagnetic resonant coupler on a substrate in a resonator and by integrating with a transmission/receiver circuit. Such a high-frequency transmission device can be utilized as an isolator used for input and output of an interface, or as an insulation-type power transmission device.

Although the present invention has been fully described in connection with the embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A high-frequency transmission device comprising a substrate, an electromagnetic resonant coupler, a transmission circuit, and a receiver circuit, wherein the electromagnetic resonant coupler includes a first resonant wire arranged on the substrate and electrically connected to the transmission circuit, and a second resonant wire electrically connected to the receiver circuit and arranged on the substrate to oppose the first resonant wire, the transmission circuit includes a high-frequency signal generation unit that is arranged on the substrate and that generates a high-frequency signal, the transmission circuit is arranged on the substrate, generates a high-frequency transmission signal by modulating an input signal by the high-frequency signal generated by the high-frequency signal generating unit, and sends the generated high-frequency transmission signal to the first resonant wire, the first resonant wire transmits the high-frequency transmission signal sent from the transmission circuit, to the second resonant wire, the receiver circuit rectifies the high-frequency transmission signal transmitted to the second resonant wire, generates an output signal corresponding to the input signal, the receiver circuit is arranged on a main surface of the substrate, and the receiver circuit is arranged in a region on the main surface of the substrate immediately above a region where the electromagnetic resonant coupler is arranged.

2. The high-frequency transmission device according to claim 1, wherein the transmission circuit is arranged in a region on the main surface of the substrate at a position other than a region immediately above a region where the electromagnetic resonant coupler is arranged.

3. The high-frequency transmission device according to claim 2, wherein
the transmission circuit is arranged on the main surface of the substrate, and
a heat dissipation structure is arranged below the transmission circuit.

4. The high-frequency transmission device according to claim 2, wherein the transmission circuit and the receiver circuit are integrated in one semiconductor chip, and is arranged on the main surface of the substrate.

5. The high-frequency transmission device according to claim 1, wherein an electric field shielding unit is arranged between the electromagnetic resonant coupler and the receiver circuit.

6. The high-frequency transmission device according to claim 1, wherein a metal wall is arranged around the electromagnetic resonant coupler.

* * * * *